(12) United States Patent
Kim et al.

(10) Patent No.: US 11,127,323 B2
(45) Date of Patent: Sep. 21, 2021

(54) DISPLAY DEVICE

(71) Applicant: LG ELECTRONICS INC., Seoul (KR)

(72) Inventors: Hoyoung Kim, Seoul (KR); Haesuk Choi, Seoul (KR); Kyeongdong Kim, Seoul (KR); Dongkyoon Han, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/848,758

(22) Filed: Apr. 14, 2020

(65) Prior Publication Data

US 2020/0394942 A1    Dec. 17, 2020

(30) Foreign Application Priority Data

Jun. 11, 2019    (KR) .......................... 10-2019-0068739

(51) Int. Cl.
*G09F 9/30* (2006.01)
*G09F 11/10* (2006.01)
(Continued)

(52) U.S. Cl.
CPC ............ *G09F 9/301* (2013.01); *G06F 1/1616* (2013.01); *G06F 1/1641* (2013.01);
(Continued)

(58) Field of Classification Search
CPC combination set(s) only.
See application file for complete search history.

(56) References Cited

U.S. PATENT DOCUMENTS 9,756,757 B2 * 9/2017 Park ..................... H05K 5/0017
9,844,152 B2 * 12/2017 Heo .................... H01L 51/0097
(Continued)

FOREIGN PATENT DOCUMENTS

JP    2010078684    4/2010
KR    1020160140036    12/2016
KR    1020170006012    1/2017

OTHER PUBLICATIONS

PCT International Application No. PCT/KR2020/004757, International Search Report dated Jul. 27, 2020, 3 pages.

*Primary Examiner* — Lisa Lea-Edmonds
(74) *Attorney, Agent, or Firm* — Lee, Hong, Degerman, Kang & Waimey

(57) ABSTRACT

The present disclosure provides a display device according to one embodiment including: a housing, a roller disposed in the housing, a flexible display configured to be rolled around the roller, an upper assembly coupled to an upper region of the flexible display, a lift assembly comprising a plurality of arms coupled to the upper assembly and configured to extend the flexible display from the housing, at least one arm comprising a portion pivotably connecting to a slider through a rod, a motor configured to drive a driving rod to move the slider along the driving rod in a first horizontal direction to lift the lift assembly to extend the flexible display in a vertical direction, a plurality of springs positioned along the driving rod, wherein the plurality of springs are aligned end-to-end to provide a pushing force to the slider in the first horizontal direction and one or more spacers positioned between each of the plurality of springs.

24 Claims, 83 Drawing Sheets

(51) Int. Cl.
*H05K 5/00* (2006.01)
*H05K 5/02* (2006.01)
*G06F 1/16* (2006.01)

(52) U.S. Cl.
CPC ............ *G06F 1/1652* (2013.01); *G09F 11/10* (2013.01); *H05K 5/0017* (2013.01); *H05K 5/0217* (2013.01)

(56) References Cited

U.S. PATENT DOCUMENTS

| | | | | |
|---|---|---|---|---|
| 9,864,412 | B2* | 1/2018 | Park | G06F 1/1652 |
| 10,098,246 | B1* | 10/2018 | Cope | G09F 21/04 |
| 10,201,103 | B2* | 2/2019 | Kim | H05K 5/0217 |
| 10,390,443 | B2* | 8/2019 | Kim | G09F 9/301 |
| 10,410,549 | B1* | 9/2019 | Kim | G06F 1/1601 |
| 10,506,726 | B2* | 12/2019 | Kang | B21B 39/008 |
| 10,531,582 | B2* | 1/2020 | Park | H05K 5/0217 |
| 10,534,402 | B1* | 1/2020 | Kim | H05K 5/0217 |
| 10,564,676 | B2* | 2/2020 | Kwon | G06F 1/1652 |
| 10,582,628 | B2* | 3/2020 | Kim | G09F 9/301 |
| 10,642,315 | B2* | 5/2020 | Kim | G09F 9/301 |
| 10,687,428 | B2* | 6/2020 | Kim | H05K 5/0217 |
| 10,694,627 | B2* | 6/2020 | Park | H05K 5/0217 |
| 10,748,456 | B2* | 8/2020 | Pyo | F16M 11/38 |
| 10,769,971 | B2* | 9/2020 | Kim | G06F 1/1601 |
| 10,777,102 | B2* | 9/2020 | Cho | H05K 5/0017 |
| 10,782,740 | B2* | 9/2020 | Kim | H04R 7/045 |
| 10,783,809 | B2* | 9/2020 | Kim | G06F 1/1652 |
| 10,789,863 | B2* | 9/2020 | Song | H05K 1/189 |
| 10,845,696 | B2* | 11/2020 | Song | H04N 9/3173 |
| 10,877,525 | B2* | 12/2020 | Kang | G06F 1/1679 |
| 10,890,947 | B2* | 1/2021 | Choi | H05K 5/0017 |
| 10,905,019 | B2* | 1/2021 | Kim | G09F 9/301 |
| 10,973,136 | B2* | 4/2021 | Park | G09F 9/301 |
| 10,976,778 | B2* | 4/2021 | Pyo | G09F 9/301 |
| 10,985,333 | B2* | 4/2021 | Kim | H01L 33/58 |
| 10,993,337 | B2* | 4/2021 | Shin | H05K 1/147 |
| 2013/0271940 | A1* | 10/2013 | Cope | H05K 5/0017 361/809 |
| 2017/0156219 | A1 | 6/2017 | Heo et al. | |
| 2018/0114471 | A1* | 4/2018 | Park | G09F 9/301 |
| 2018/0160554 | A1 | 6/2018 | Kang et al. | |
| 2020/0058272 | A1* | 2/2020 | Oh | G09G 5/006 |
| 2020/0068728 | A1* | 2/2020 | Kang | H05K 5/0017 |
| 2020/0077194 | A1* | 3/2020 | Kim | H04R 7/04 |
| 2020/0160760 | A1* | 5/2020 | Park | H04R 9/066 |
| 2020/0168131 | A1* | 5/2020 | Park | G06F 1/1652 |
| 2020/0314552 | A1* | 10/2020 | Kim | G06F 1/1656 |
| 2020/0379517 | A1* | 12/2020 | Kim | H05K 5/0017 |
| 2020/0396850 | A1* | 12/2020 | Kim | G02F 1/133305 |
| 2021/0012688 | A1* | 1/2021 | Lee | G09G 3/00 |

* cited by examiner

DISPLAY DEVICE

CROSS-REFERENCE TO RELATED APPLICATION

Pursuant to 35 U.S.C. § 119 (a), this application claims the benefit of earlier filing date and right of priority to Korean Patent Application No. 10-2019-0068739, filed on Jun. 11, 2019, the contents of which are all hereby incorporated by reference herein in its entirety.

BACKGROUND OF THE INVENTION

Field of the Invention

The present disclosure relates to a display device.

Description of the Related Art

With the development of the information society, various demands for display devices are increasing. Various display devices such as liquid crystal displays (LCDs), plasma display panels (PDPs), electroluminescent displays (ELDs), and vacuum fluorescent displays (VFDs) have been recently studied and used in response to various demands for the display devices.

Among these, display devices using an organic light emitting diode (OLED) have the advantage that they can be implemented as ultra-thin devices because they have higher luminance and view angle characteristics and do not require backlight units as compared to liquid crystal display devices.

Furthermore, a flexible display can be curved or wound around a roller. A display device wound around or unwound from a roller as necessary can be realized using a flexible display.

Recently, organized research on such flexible displays has been actively conducted.

SUMMARY OF THE INVENTION

An object of the present disclosure is to address the above-described and other problems.

Another object of the present disclosure is to provide a display device capable of reducing a noise that may occur when driving.

Another object of the present disclosure is to provide a display device capable of reducing a vibration that may occur when driving.

A display device according to an embodiment of the present invention includes a housing, a roller disposed in the housing, a flexible display configured to be rolled around the roller, an upper assembly coupled to an upper region of the flexible display, a lift assembly comprising a plurality of arms coupled to the upper assembly and configured to extend the flexible display from the housing, at least one arm comprising a portion pivotably connecting to a slider through a rod, a motor configured to drive a driving rod to move the slider along the driving rod in a first horizontal direction to lift the lift assembly to extend the flexible display in a vertical direction, a plurality of springs positioned along the driving rod, wherein the plurality of springs are aligned end-to-end to provide a pushing force to the slider in the first horizontal direction and one or more spacers positioned between each of the plurality of springs.

One or more spacers can be further positioned at each end of the plurality of springs.

Each of the one or more spacers can be circular and comprises a center opening accommodating the driving rod therethrough.

Each of the one or more spacers can comprise a supporting rib protruding along the center opening at a first side of the spacer.

An end of a corresponding spring of the plurality of springs can be configured to abut the first side of the spacer and surround the supporting rib.

Each of the one or more spacers further comprises a first frictional rib protruding from a second side of the spacer along the center opening and a second frictional rib protruding from the second side of the spacer along an outer edge of the spacer.

The first frictional rib can include a first frictional surface along a top of the first frictional rib and the second frictional rib comprises a second frictional surface along a top of the second frictional rib.

A first spacer and a second spacer of the one or more spacers can be positioned between two corresponding springs of the plurality of springs, and each second side of the first spacer and the second spacer are positioned to abut each other.

Corresponding first frictional ribs of the first spacer and corresponding second frictional ribs of the second spacer can abut each other.

A space can be defined between the corresponding first frictional ribs and the corresponding second frictional ribs of the first and second spacers, and wherein a lubricant is disposed inside the defined space.

The one or more spacers can be positioned along the driving rod such that they are freely rotatable around the driving rod.

The driving rod can be a threaded lead screw and the slider is correspondingly threaded to the driving rod to be moved in response to rotation of the lead screw by operation of the motor.

The one or more spacers can be positioned along the driving rod such that they are freely rotatable around the driving rod.

A display device according to another embodiment of the present invention includes a housing, a roller disposed in the housing, a flexible display configured to be rolled around the roller, an upper assembly coupled to an upper region of the flexible display, a lift assembly comprising a plurality of arms coupled to the upper assembly and configured to extend the flexible display from the housing, a motor configured to provide a force for lifting the lift assembly, a lead screw configured to be rotated by the motor, a slider engaged with the lead screw and configured to travel along the lead screw in response to rotation of the lead screw, wherein a rod is coupled to the slider and is configured to apply force to one of the plurality of arms in response to movement of the slider along the lead screw in a first direction, a plurality of springs positioned along the lead screw, wherein the plurality of springs are aligned end-to-end to provide a pushing force to the slider in the first direction, and one or more spacers positioned between each of the plurality of springs.

One or more spacers can be further positioned at each end of the plurality of springs.

Each of the one or more spacers can be circular and comprises a center opening accommodating the lead screw therethrough.

Each of the one or more spacers can comprise a supporting rib protruding along the center opening at a first side of the spacer.

An end of a corresponding spring of the plurality of springs can be configured to abut the first side of the spacer and surround the supporting rib.

Each of the one or more spacers further comprises a first frictional rib protruding from a second side of the spacer along the center opening and a second frictional rib protruding from the second side of the spacer along an outer edge of the spacer.

The first frictional rib can comprise a first frictional surface along a top of the first frictional rib and the second frictional rib comprises a second frictional surface along a top of the second frictional rib.

A first spacer and a second spacer of the one or more spacers can be positioned between two corresponding springs of the plurality of springs, and each second side of the first spacer and the second spacer are positioned to abut each other.

Corresponding first frictional ribs of the first spacer and corresponding second frictional ribs of the second spacer can abut each other.

A space can be defined between the corresponding first frictional ribs and the corresponding second frictional ribs of the first and second spacers, and wherein a lubricant is disposed inside the defined space.

The one or more spacers can be positioned along the lead screw such that they are freely rotatable around the lead screw.

Effects of a display device according to the present disclosure are described as follows.

According to at least one aspect of the present disclosure, the present disclosure can reduce a noise that may occur when the display device drives.

According to at least one aspect of the present disclosure, the present disclosure can reduce a vibration that may occur when the display device drives.

Further scope of applicability of the present disclosure will become apparent from the detailed description given blow. However, it should be understood that the detailed description and specific examples, while indicating preferred embodiments of the disclosure, are given by illustration only, since various changes and modifications within the spirit and scope of the disclosure will become apparent to those skilled in the art from this detailed description.

DESCRIPTION OF EXEMPLARY EMBODIMENTS

Reference will now be made in detail to embodiments of the disclosure, examples of which are illustrated in the accompanying drawings. Wherever possible, the same reference numbers will be used throughout the drawings to refer to the same or like parts. In general, a suffix such as "module" and "unit" may be used to refer to elements or components. Use of such a suffix herein is merely intended to facilitate description of the specification, and the suffix itself is not intended to give any special meaning or function. It will be noted that a detailed description of known arts will be omitted if it is determined that the detailed description of the known arts can obscure the embodiments of the disclosure. The accompanying drawings are used to help easily understand various technical features, and it should be understood that the embodiments presented herein are not limited by the accompanying drawings. As such, the present disclosure should be construed to extend to any alterations, equivalents and substitutes in addition to those which are particularly set out in the accompanying drawings.

Although an organic light emitting display (OLED) will be exemplified as a display panel hereinafter, a display panel applicable to the present disclosure is not limited thereto and liquid crystal display (LCD) devices, plasma display panels (PDPs), and field emission displays (FEDs) are also applicable to the present disclosure.

FIGS. 1 to 17 illustrate configuration of a display device related to the present disclosure.

Figure 1:
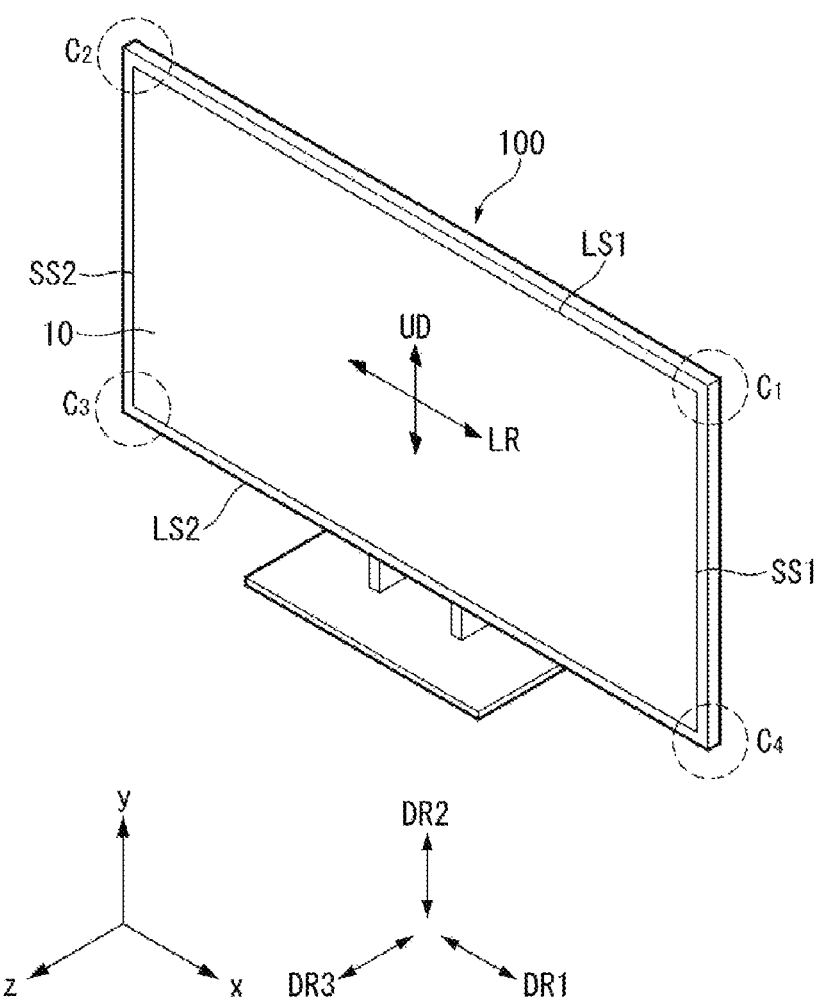
FIGS. 1 to 17k are diagrams showing a configuration of a display device related to the present disclosure.

As illustrated in FIG. 1, in embodiments disclosed herein, a display panel 10 may include a first long side LS1, a second long side LS2 opposite the first long side LS1, a first short side SS1 adjacent to the first long side LS1 and the second long side LS2, and a second short side SS2 opposite the first short side SS1.

Herein, the first short side SS1 may be referred to as a first side area; the second short side SS2 may be referred to as a second side area opposite the first side area; the first long side LS1 may be referred to as a third side area which is adjacent to the first side area and the second side area and is positioned between the first side area and the second side area; and the second long side LS2 may be referred to as a fourth side area which is adjacent to the first side area and the second side area, is positioned between the first side area and the second side area, and is opposite to the third side area.

Embodiments of the disclosure describe that lengths of the first and second long sides LS1 and LS2 are longer than lengths of the first and second short sides SS1 and SS2 for convenience of explanation. However, the lengths of the first and second long sides LS1 and LS2 may be almost equal to the lengths of the first and second short sides SS1 and SS2.

In the following description, a first direction DR1 may be a direction parallel to the long sides LS1 and LS2 of a display panel 10, and a second direction DR2 may be a direction parallel to the short sides SS1 and SS2 of the display panel 10.

Further, a third direction DR3 may be a direction vertical to the first direction DR1 and/or the second direction DR2.

The first direction DR1 and the second direction DR2 may be commonly referred to as a horizontal direction. Further, the third direction DR3 may be referred to as a vertical direction.

From a different viewpoint, a side on which a display device 100 displays images may be referred to as a front or a front side. A side on which images cannot viewed when the display device 100 displays the images may be referred to as a rear or a rear side. When the display device 100 is viewed from the front or front side, the first long side LS1 may be referred to as an upper side. Likewise, the second long side LS2 may be referred to as a lower side. Likewise, the first short side SS1 may be referred to as a left side and the second short side SS2 may be referred to as a right side.

In addition, the first long side LS1, the second long side LS2, the first short side SS1 and the second short side SS2 may be referred to as edges of the display device 100.

Further, points at which the first long side LS1, the second long side LS2, the first short side SS1 and the second short side SS2 meet may be referred to as corners. For example, a point at which the first long side LS1 and the first short side SS1 meet may be referred to as a first corner C1, a point at which the first long side LS1 and the second short side SS2 meet may be referred to as a second corner C2, a point at which the second short side SS2 and the second long side LS2 meet may be referred to as a third corner C4, and a point at which the second long side LS2 and the first short side SS1 meet may be referred to as a fourth corner C4.

Here, a direction in which the first short side SS1 faces the second short side SS1 or the second short side SS2 faces the first short side SS1 may be referred to as a left-right direction LR. A direction in which the first long side LS1 faces the second long side LS2 or the second long side LS2 faces the first long side LS1 may be referred to as an upper-lower direction UD.

A +x-axis direction may be referred to as a right-side direction or a right direction. A −x-axis direction may be referred to as a left-side direction or a left direction. A +y-axis direction may be referred to as an upper direction. A −y-axis direction may be referred to as a lower direction. A +z-axis direction may be referred to as a front direction. A −z-axis direction may be referred to as a rear direction.

An x-axis direction may be parallel to the first direction. A y-axis direction may be parallel to the second direction. A z-axis direction may be parallel to the third direction.

Figure 2:
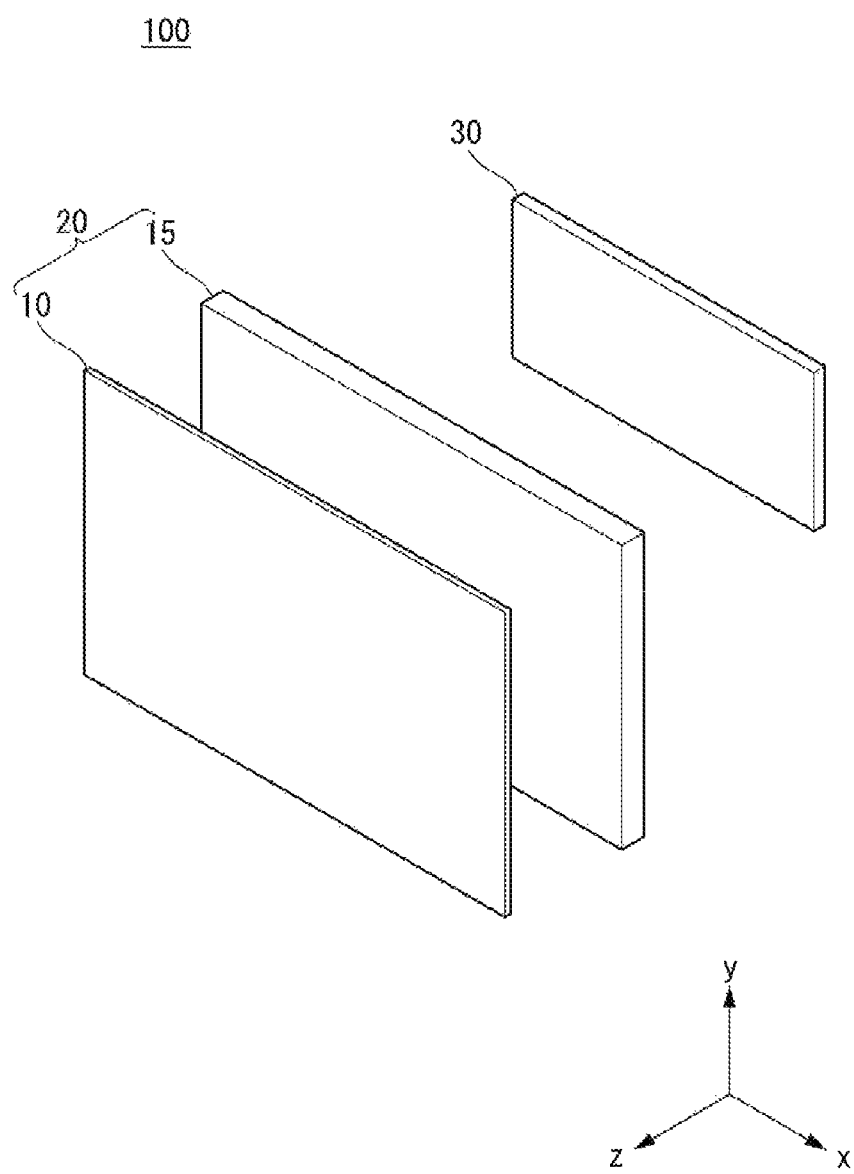

Referring to FIG. 2, the display device 100 according to the present disclosure may include a display 20 and a housing 30.

The display 20 may include the display panel 10 and a module cover 15. The display panel 10 may be provided on the front side of the display device 100 and displays images. The display panel 10 may divided an image into a plurality of pixels, control the pixels such that each pixel emits light in accordance with a color, a value and a chroma thereof and output the image. The display panel 10 may be divided into an active area in which images are displayed and a non-active area in which no image is displayed.

When the display panel 10 is flexible, this may be referred to as a flexible display panel 10.

The display panel 10 may have a rectangular shape. However, the display panel 10 is not limited thereto and may have a shape with corners having a predetermined curvature. The display panel 10 may be an organic light emitting diode (OLED) panel. However, the display panel 10 is not limited thereto and may be a liquid crystal display panel.

The module cover 15 may be provided on the rear side of the display panel 10. The module cover 15 may be directly attached to the display panel 10. The module cover 15 may be equal to or greater than the display panel 10 in size.

The module cover 15 can support the rear side of the display panel 10. Accordingly, the module cover 15 may include a material which is light and has high strength. For example, the module cover 15 may include aluminum or a stainless material.

The housing 30 may be provided on the rear side of the display 20. That is, the housing 30 may be provided on the rear side of the module cover 15. The housing 30 may shield at least one PCB. That is, the housing 30 may be attached to the rear side of the module cover 15 to cover at least one PCB. A coupling structure and a coupling method of at least one PCB will be described in detail later.

The housing 30 can transmit electromagnetic waves emitted from at least one PCB. Accordingly, the housing 30 may be composed of an inner housing formed of a conductive material and an outer housing covering the inner housing which are not shown. However, the housing 30 is not limited thereto and may be composed of a single conductive member.

Figure 3:
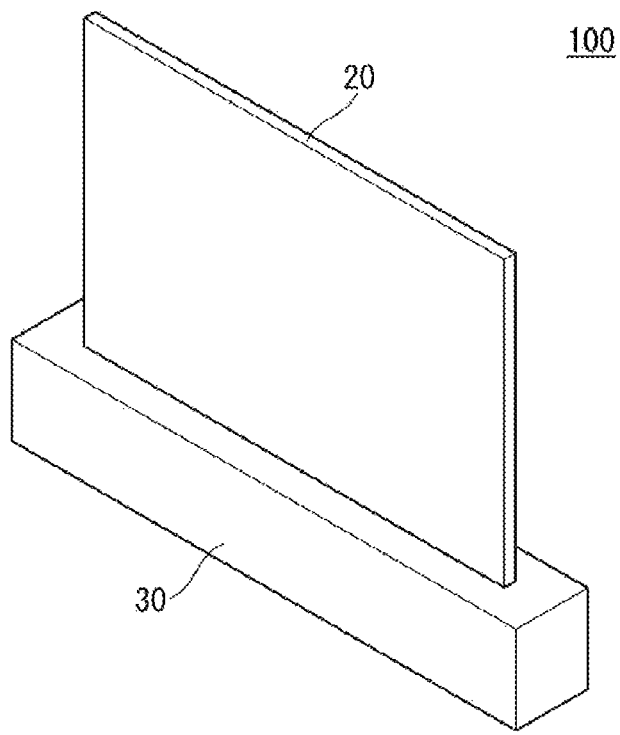
Figure 3:
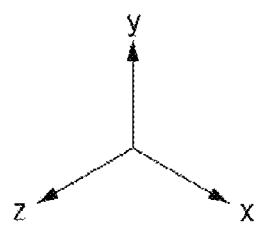

Referring to FIG. 3, in the display device 100 according to the present disclosure, the housing 30 may be positioned under the display 20. Specifically, the housing 30 may have a shape enveloping the lower part of the display 20. The housing 30 may prevent various driving devices or driving circuits disposed therein from being exposed to the outside.

The width of the housing 30 may be greater than the width of the display 20 in the first and third directions in order to protect the internal part of the display 20. The width of the housing 30 may be less than the width of the display 20 in the second direction.

In the display device 200 according to the present disclosure, the housing 30 may not be positioned in the active area of the display 20.

Figure 4:
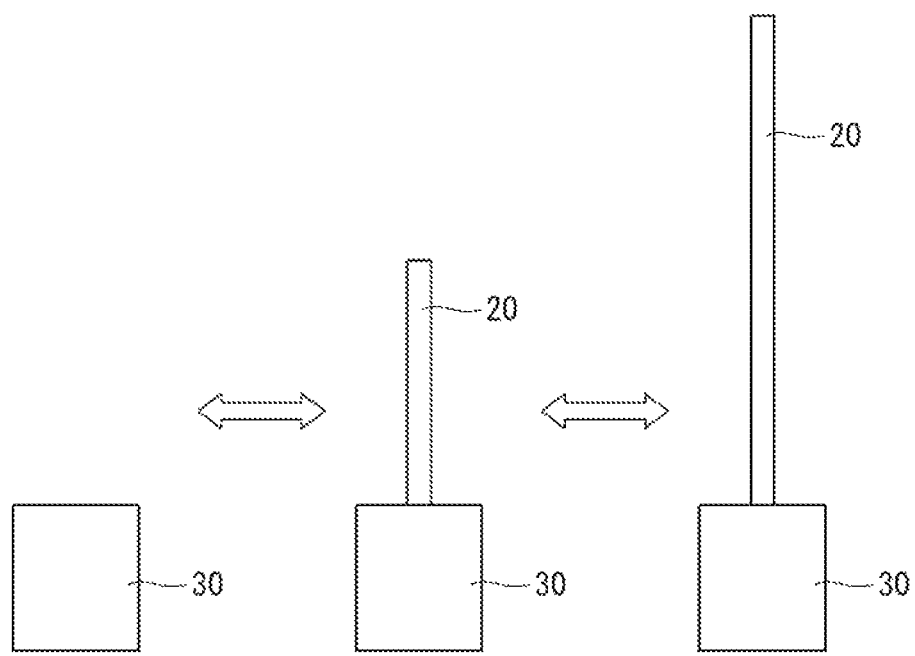

Referring to FIG. 4, the display device 100 according to the present invention may be in a first state in which the active area of the display 20 is located inside the housing 30 and a second state in which the active area of the display 20 is exposed to the outside.

The active area of the display 20 may be positioned inside the housing 30 when the display device 100 is in the first state. That is, the display 20 can be shielded by the housing 30.

The active area of the display 20 may be exposed to the outside of the housing 30 when the display device 100 is in the second state. That is, at least a part of the display 20 can protrude from the upper part of the housing 30 in the second state.

Although not shown, the display 20 can be switched from the first state to the second state according to a roller positioned in the housing 30. Specifically, the first state in which the display 20 is wound around the roller can be switched to the second state in which the roller is released such that the display 20 is exposed to the outside. On the other hand, the display 20 can be switched from the second state to the first state when the released roller is rolled. Structures and operating methods of the roller and the display 20 will be described in detail later.

In the display device 100 according to the present disclosure, the display 20 may be in any of the first state and the second state. Accordingly, it is possible to expose the display 20 to the outside of the housing 30 only when the display device 100 is used to save the space.

Figure 5:
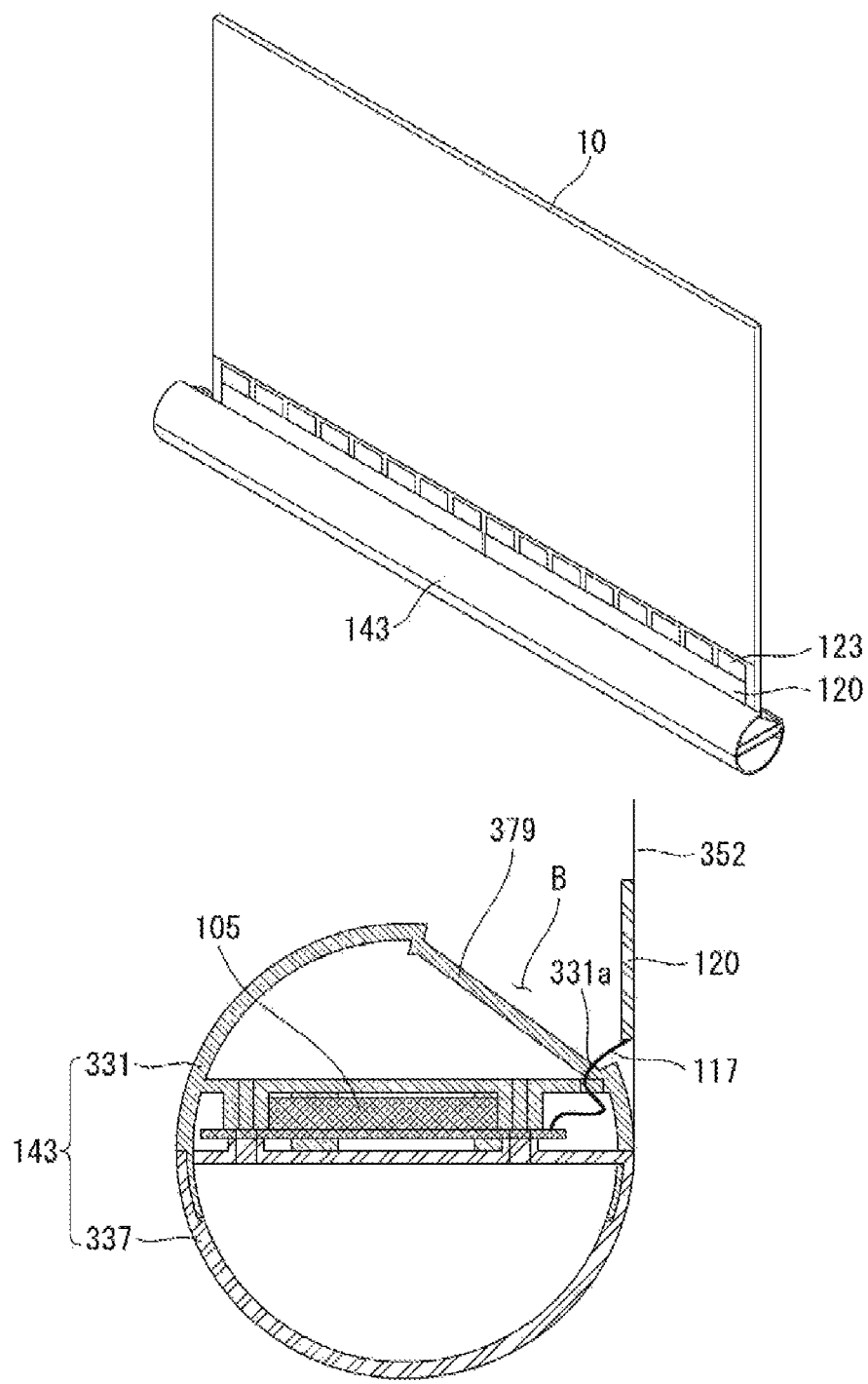

Referring to FIG. 5, in the display device according to the present disclosure, a panel roller 143 may be connected to one edge of the display panel 10. The panel roller 143 can wind or unwind the display panel 10 such that the display panel 10 can be in any one of the first state and the second state. The panel roller 143 may also be referred to as a roller 143.

In the display device according to the present disclosure, at least one source PCB 120 may be positioned at at least a part of the front side of the display panel 10. Respective source PCBs 120 may be separately positioned.

Signal lines for transmitting digital video data and timing control signals transmitted from a timing controller board 105 may be disposed on the at least one source PCB 120. Each source PCB 120 may be connected to the display panel 10 through a source chip on film (COF) 123. The source COF 123 connected to one side of each source PCB 120 may be extended to the active area of the display panel 10 and connected to the display panel 10.

A mounting part 379 may be disposed on the circumference of the panel roller 143. The mounting part 379 may be formed in such a manner that a part of the outer circumference of the panel roller 143 is flattened to form an accommodation space B. The mounting part 379 may be positioned at a portion at which the source PCBs 120 contact the panel roller 143 as the panel roller 143 is rolled. The mounting part 379 may have a shape in which at least a part of the outer circumference of the panel roller 143 is recessed.

When the panel roller 143 is rolled, the source PCBs 120 can be accommodated in the accommodation space B formed by the mounting part 379. Accordingly, the source PCBs 120 may not be damaged even when the panel roller 143 is rolled.

The timing controller board 105 may be mounted inside the panel roller 143. An FFC cable 117 can electrically connect the timing controller board 105 to the source PCBs 120.

The panel roller 143 may include an upper panel roller 331 and a lower panel roller 337. The upper panel roller 331 and the lower panel roller 337 may be combined with each other through screws. The timing controller board 105 may be mounted between the upper panel roller 331 and the lower panel roller 337. The screws can combine the upper panel roller 331, the lower panel roller 337 and the timing controller board 105. The FFC cable 117 can be connected to the timing controller board 105 and the source PCBs 120 through a hole 331a positioned at the panel roller 331.

In the display device according to the present disclosure, the FFC cable 117 may not be twisted because the timing controller board 105 rotates along with the panel roller 143. Furthermore, space can be saved because the timing controller board 105 is mounted inside the panel roller 143.

Figure 6:
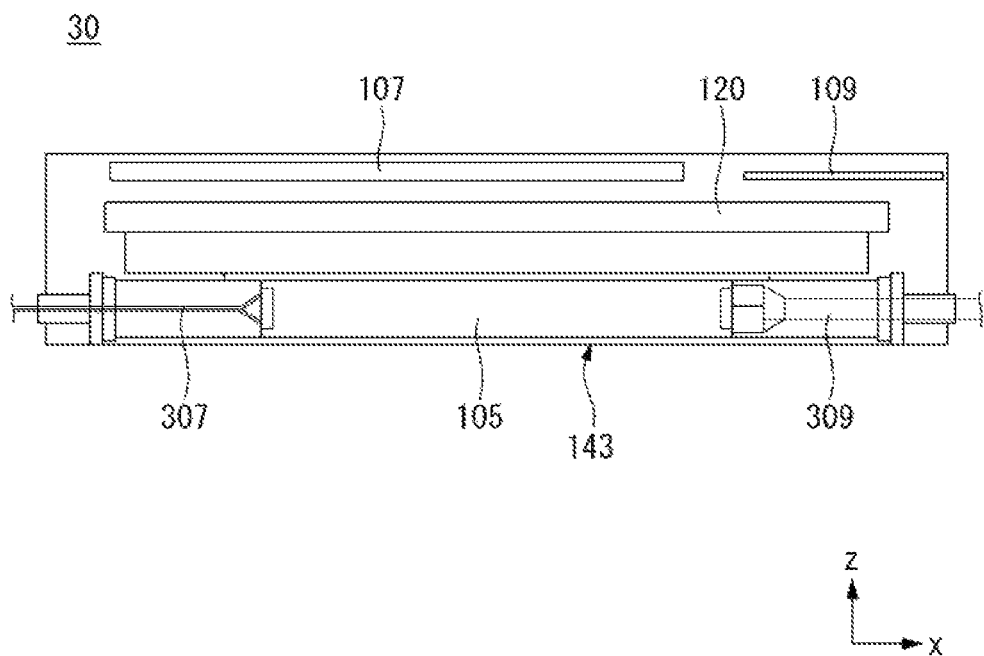

Referring to FIG. 6, in the display device according to the present disclosure, the timing controller board 105 may be mounted in the panel roller 143 on one side of the housing 30 from/into which the display panel protrude/is wound and a main board 109 and a power supply 107 may be positioned on the other side on the basis of the center of the housing 30.

The timing controller board 105 can be connected to the main board 109 and the power supply 107. The timing controller board 105 may be connected to the main board 109 and the power supply 107 through wiring electrodes. The wiring electrodes may include a first wiring electrode for connecting the timing controller board 105 to the power supply 107 and a second wiring electrode 309 for connecting the timing controller board 105 to the main board 109.

For example, there may be a plurality of first wiring electrodes 307. In addition, the first wiring electrode 307 may have a circular shape. The first wiring electrode 307 can connect the timing controller board 105 to the power supply 107 through an opening of the center of the rotating shaft of the panel roller 143.

The second wiring electrode 309 can use the FFC cable to which the timing controller board 105 and the source PCBs 120 are connected. The second wiring electrode 309 can connect the timing controller board 105 to the main board 109 through an opening of the center of the rotating shaft of the panel roller 143.

The first wiring electrode 307 and the second wiring electrode 309 may be positioned on opposite sides on the basis of the timing controller board 105. The opening through which the first wiring electrode 307 passes and the opening through which the second wiring electrode 309 passes may be positioned on opposite sides.

In the display device according to the present disclosure, the timing controller board 105 can be mounted in the panel roller 143 and the power supply 107 and the main board 109 can be positioned on opposite sides on the basis of the display panel. Accordingly, the internal space of the housing 30 can be saved.

Figure 7:
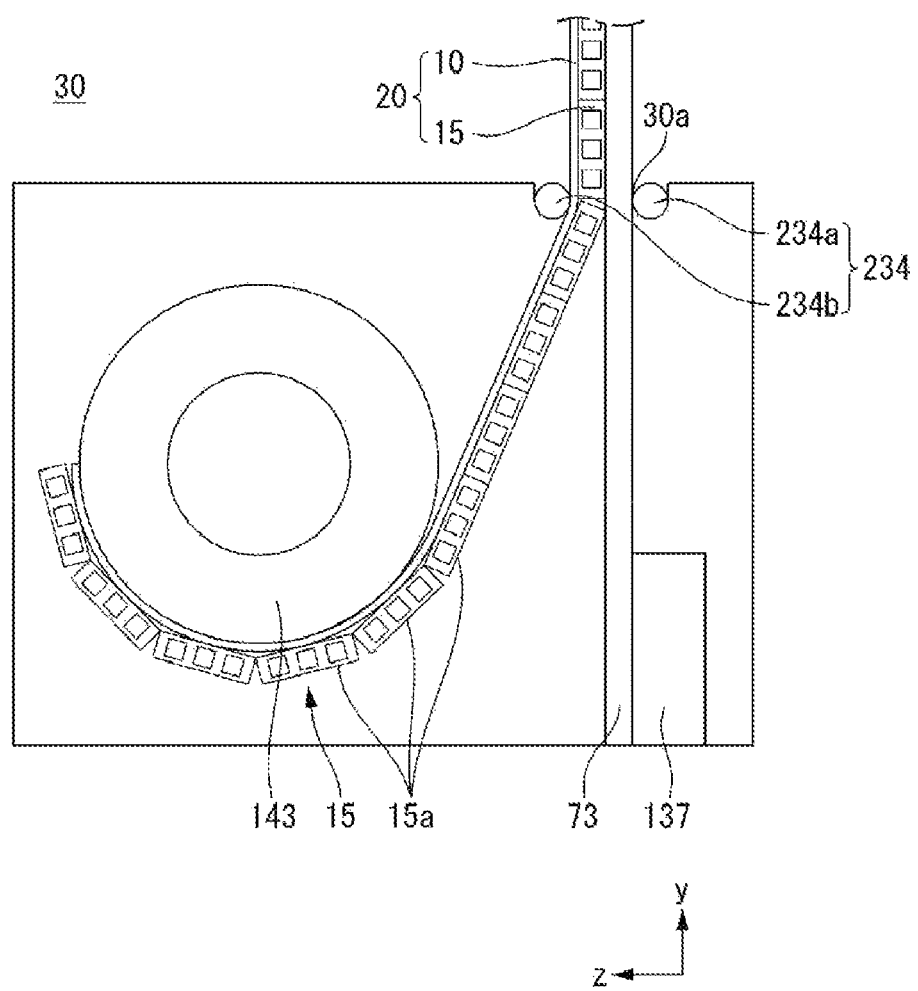

Referring to FIG. 7, the display device according to the present disclosure may include the panel roller 143, a motor assembly 137 and a link 73 in the housing 30.

The link 73 may also be referred to as a support 73.

The module cover 15 may include a plurality of segments 15a. The segments 15a may also be referred to as aprons.

The panel roller 143 may be positioned in front of the part of the housing 30 at which the display 20 is unwound or wound. The panel roller 143 can simultaneously wind the display panel 10 and the module cover 15.

The link 73 can be installed in the housing 30. The link 73 can serve to support the display panel 10 and the module cover 15 such that they can be unwound or wound. The link 73 can move an upper bar 75 (refer to FIG. 9A) combined with to the upper parts of the module cover 15 and the display panel 10 upward or downward.

The upper end of the display 20 can be connected to the upper bard and the lower end thereof can be connected to the panel roller 143. The portion of the display 20 between the upper end and the lower end thereof can be easily curved. The link 73 can support the module cover 15 on the back of the module cover 15 such that the module cover 15 is not curved.

The motor assembly 137 may be positioned at a portion at which the link 73 is connected. The motor assembly 137 can drive the link 73 such that the link 73 moves upward or downward. The motor assembly 137 can receive an electrical signal and convert the electrical signal into a physical force. The motor assembly 137 can transmit rotational energy to the link 73 such that the first state can switch to the second state. The structure and driving principle of the motor assembly 137 will be described in detail later.

A guide bar 234 may be disposed at an entrance 30a of the housing 30 through which the link 73 moves upward and downward. The guide bar 234 may include first and second guide bars 234a and 234b. The entrance 30a of the housing 30 may be formed between the first and second guide bars 234a and 234b. The first and second guide bars 234a and 234b may face each other having the link 73 positioned therebetween. For example, the first guide bar 234a may be positioned behind the link 73 and the second guide bar 234b may be positioned in front of the link 73.

The display device according to the present disclosure can simultaneously wind the display panel 10 and the module cover 15 using one roller. Accordingly, the thickness of the housing 30 can be reduced.

Figure 8:
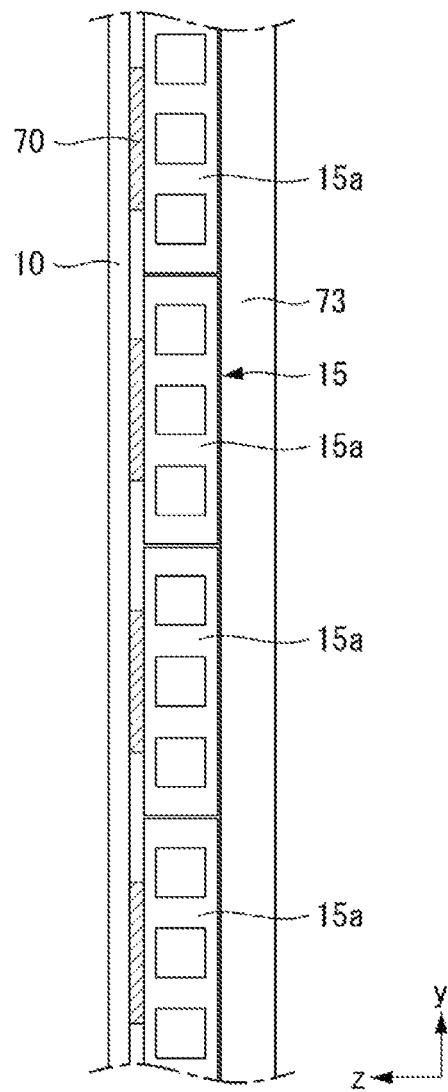

Referring to FIG. 8, the segments 15a may have a rectangular shape. The respective segments 15a may be separately disposed in the y-axis direction and attached to the rear side of the display panel 10. The module cover 15 can be composed of the plurality of segments 15a and wound or unwound by the roller. The module cover 15 may be formed of a plastic or aluminum material. Accordingly, the module cover 15 can protect the display panel 10 from external impacts.

The display panel 10 and the module cover 15 can be connected to each other through adhesive layers 70. The adhesive layer 70s may be double-sided tapes. The module cover 15 can be wound along with the display panel 10 through the adhesive layers 70. The adhesive layers 70 may be positioned on the respective segments 15a to be attached to the display panel 10. The adhesive layers 70 may be separately disposed. Accordingly, the module cover 15 may be easily deformed when wound or unwound by the roller. The adhesive layers 70 can cause the display panel 10 to be smoothly unwound from the panel roller 143 (refer to FIG. 7) or wound therearound without being wrinkled when the thickness of the adhesive layers 70 in the second direction decreases.

Furthermore, the segments 15a can stably support the display panel 10 when the width thereof in the second direction increases because the strength thereof is improved.

When the width of the adhesive layer 70 in the second direction is equal to or less than 30% of the thickness of the segments 15a in the second direction, less external force is applied to the display panel and thus wrinkles of a display screen can be reduced.

Further, when the width of the adhesive layer 70 in the second direction is equal to or greater than 15% of the thickness of the segments 15a in the second direction, the strength of the display panel 10 is improved and thus wrinkles of the display panel 10 can be considerably reduced.

Moreover, deformation of the display panel 10 due to external force may decrease as the width of the adhesive layers 70 in the third direction increases. Specifically, the flexibility of the adhesive layers 70 is improved as the width of the adhesive layers 70 in the third direction increases and thus the module cover 15 can be stably attached to the display panel 10.

In addition, the segments 15a can decrease wrinkles of the display panel 10 when the thickness thereof in the third direction decreases. Specifically, the strength of the segments 15a is improved as the width thereof in the third direction decreases and thus wrinkles of the display panel 10 can be reduced.

Accordingly, when the width of the adhesive layers 70 in the third direction is equal to or greater than 3% of the width of the segments 15a in the third direction, the strength of the display panel 10 10 is improved and thus wrinkles of the display panel 10 can be considerably reduced.

Furthermore, when the width of the adhesive layers 70 in the third direction is equal to or less than 6% of the width of the segments 15a in the third direction, the strength of the display panel 10 10 is improved and thus wrinkles of the display panel 10 can be considerably reduced.

In the display device according to the present disclosure, the module cover 15 can include the plurality of segments 15a and the adhesive layers 70 can be positioned on the respective segments 15a.

Figure 9A:
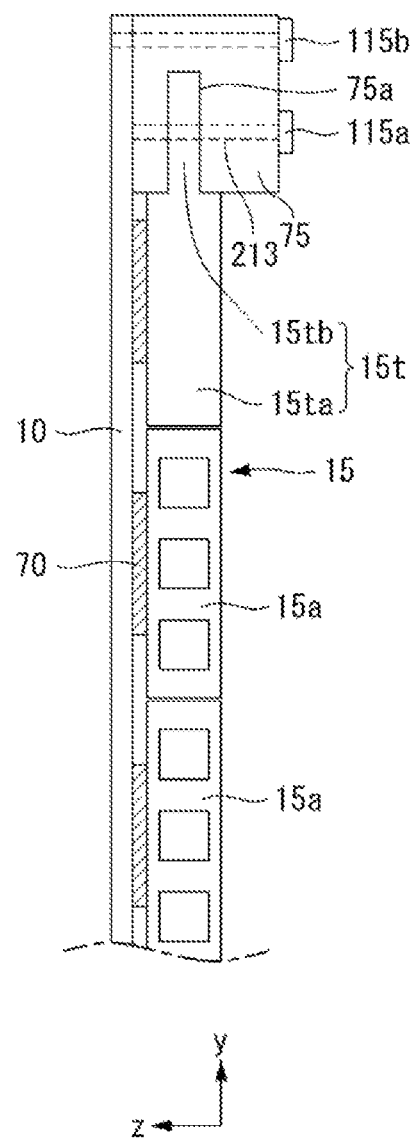
Figure 9B:
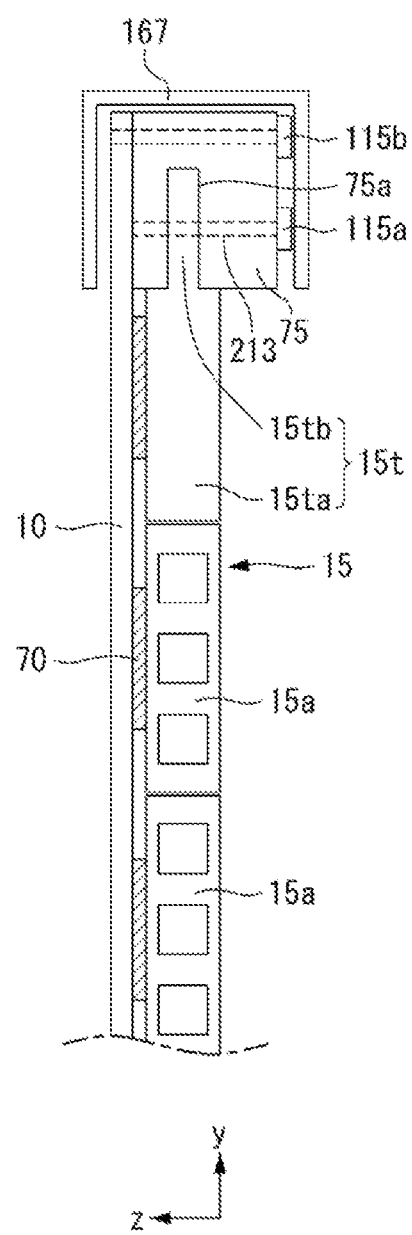

Referring to FIGS. 9A and 9B, in the display device according to the present disclosure, the module cover 15 and the display panel 10 can be combined with the upper bar 75. The module cover 15, the display panel 10 and the upper bar 75 may be combined through screws 115a and 115b.

The screws 115a and 115b can allow the upper bar 75, the module cover 15 and the display panel 10 to move upward or downward together. The screw 115a can combine the upper bar 75 and the module cover 15 with each other. The screw 115b can combine the upper bar 75 and the display panel 10 with each other. However, the screws 115a and 115 are not limited thereto and at least one of the screws 115a and 115b may combine the module cover 15, the upper bar 75 and the display panel 10.

The upper part of the module cover 15 may have a shape for combination with the upper bar 75. An upper segment 15t may be a segment positioned at the uppermost part of the module cover 15. The upper segment 15t may have a different shape from other segments 15a. The upper segment 15t may also be referred to as an upper module cover 15t.

The upper segment 15t may include a first body 15ta connected to another segment 15a and a second body 15tb combined with the upper bar 75. The lower end of the first body 15ta can be connected to another segment 15a and the second body 15tb can be formed on the first body 15ta.

The upper bar 75 may include a recess 75a formed in the +y-axis direction. The second body 15tb can be inserted into the recess 75a. The screw 115a can penetrate the second body 15tb in the z-axis direction.

The thickness of the first body 15ta in the z-axis direction may be greater than the thickness of the second body 15tb in the z-axis direction.

Referring to FIG. 9B, a top case 167 can cover the upper bar 75, the module cover 15 and the display panel 10. The upper bar 75, the module cover 15 and the display panel 10 may not be exposed to the outside using the top case 167. Accordingly, the exterior of the display device becomes neat.

The top case 167 can be combined with the upper bar 75, the module cover 15 or the display panel 10 through a screw.

Figure 10A:
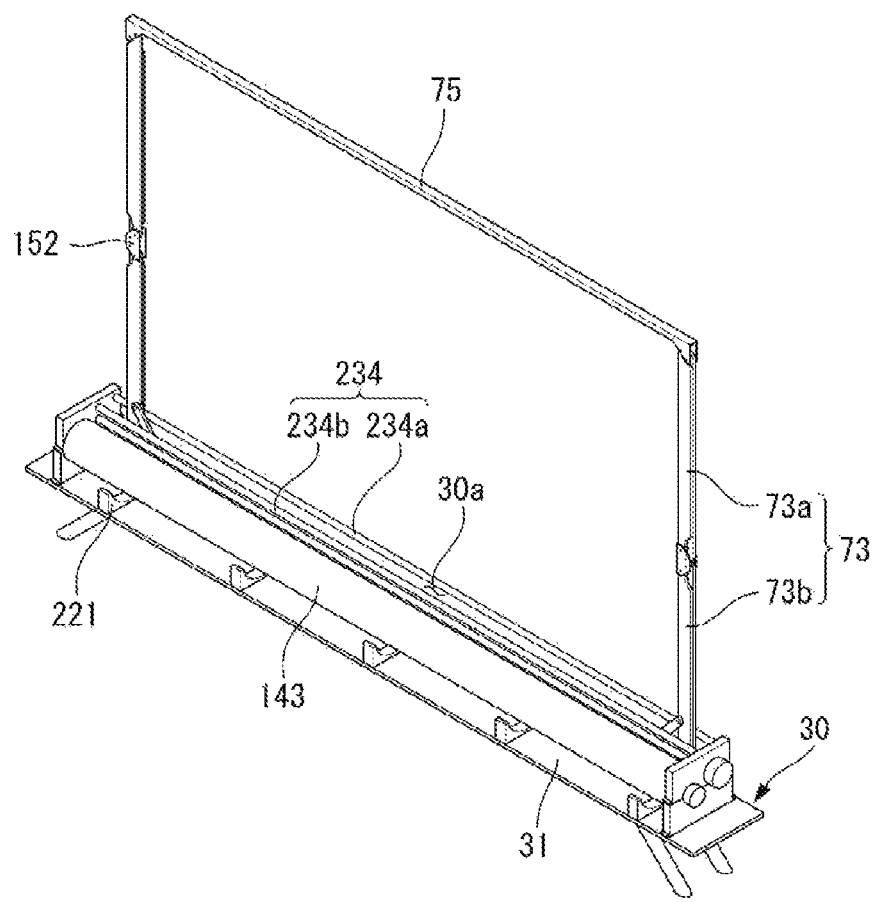

Referring to FIG. 10A, the display device according to the present disclosure may be configured such that both sides of the upper bar 75 are supported by the links 73. The upper bar 75 may be moved upward or downward by the links 73. Each link 73 may include a first arm 73a and a second arm 73b.

The first arm 73a may also be referred to as an upper link 73a. The second arm 73b may also be referred to as a lower arm 73b.

The first arm 73a and the second arm 73b may be connected to each other by an arm joint 152. The arm joint 152 may also be referred to as a hinge 152 or a joint 152.

The upper end of the first arm 73a can be combined with the upper bar 75 and the other end of the first arm 73a can be combined with the arm joint 152. The upper end of the second arm 73b can be combined with the motor assembly and the lower end of the second arm 73b can be combined with the arm joint 152.

The guide bar 234 may be positioned at the entrance 30a of the housing 30 through which the link 73 moves upward or downward. The guide bar 234 may include the first and second guide bars 234a and 234b. The entrance 30a of the housing 30 may be formed between the first and second guide bars 234a and 234b. The first and second guide bars 234a and 234b may face each other having the link 73 positioned therebetween. For example, the first guide bar 234a may be positioned behind the link 73 and the second guide bar 234b may be positioned in front of the link 73.

The panel roller 143 may be positioned in front of the link 73. A base 31 of the housing 30 may include a plurality of brackets 221. The base 31 may also be referred to as a bottom surface 31.

The plurality of brackets 221 may be formed under the panel roller 143. The plurality of brackets 221 may be separately disposed in the longitudinal direction of the panel roller 143. Further, the plurality of brackets 221 may be separately disposed in the longitudinal direction of the base 31. Each bracket 221 can be fixed to the base 31 by a screw.

Figure 10B:
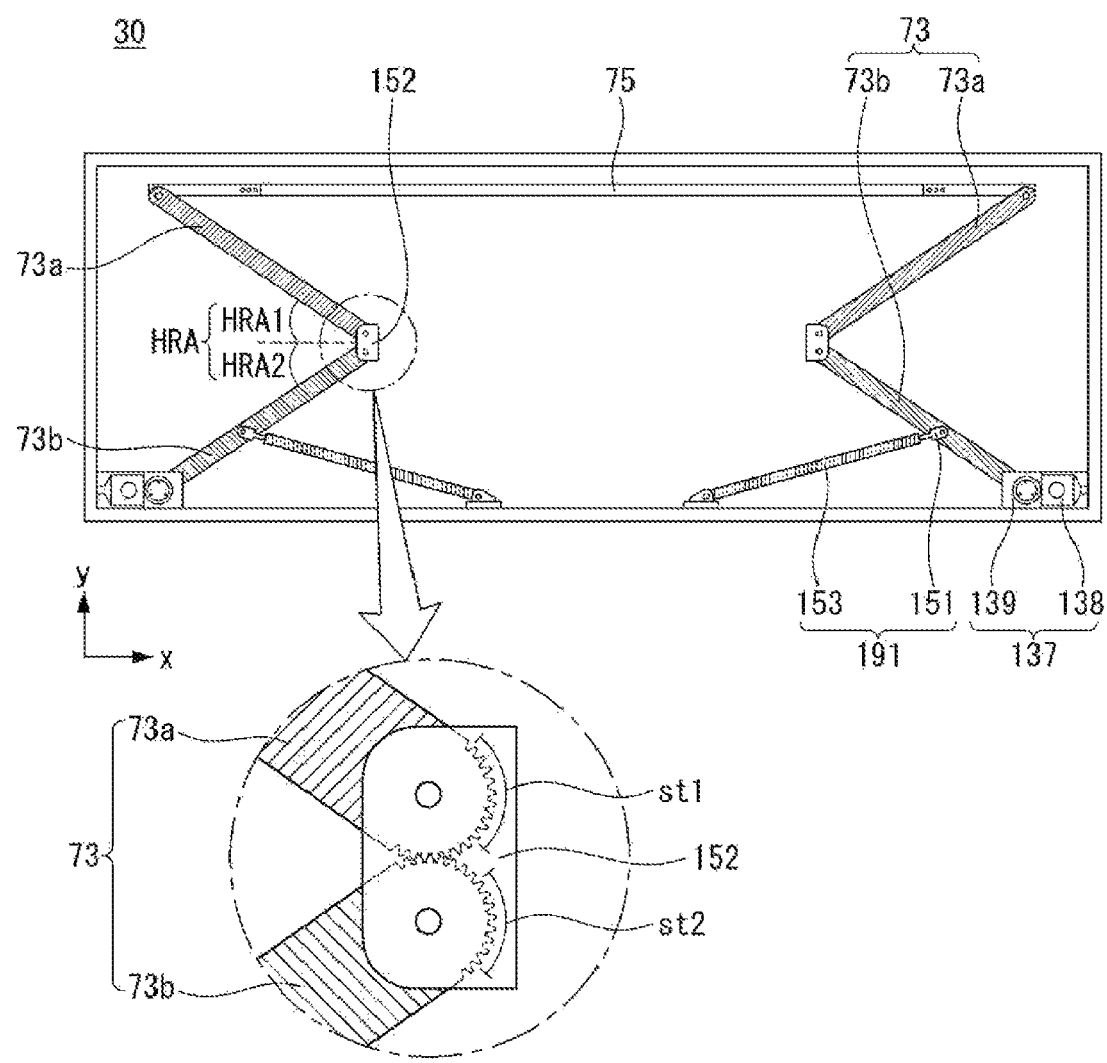

Referring to FIG. 10B, in the display device according to the present disclosure, the arm joint 152 may have a gear shape in which the other side of the first arm 73a and one side of the second arm 73b positioned in inside the arm joint 152 engage with each other. The arm joint 152 may also be referred to as a connector 152. The first arm 73a may also be referred to as an upper supporting link 73a. The second arm 73b may also be referred to as a lower supporting link 73b.

The first arm 73a may be rotatably connected to the upper part of the arm joint 152. The second arm 73b may be rotatably connected to the lower part of the arm joint 152.

A gear st1 may be formed at the lower part of the first arm 73a. A gear st2 may be formed at the upper part of the second arm 73b. The gear st1 of the first arm 73a and the gear st2 of the second arm 73b may engage with each other.

An angle HRA1 between the ground and the first arm 73a and an angle HRA2 between the ground the second arm 73b may be identical because the first arm 73a and the second arm 73b engage each other in a gear shape. Further, angles between the first arms 73a and the second arms 73b on both sides may be identical because the first arm 73a and the second arm 73b engage each other in a gear shape. Accordingly, both sides of the upper bar 75 can move upward or downward while being leveled without being tilted. That is, angles between the first arms 73a and the second arms 73b of the respective links 73 can be identical irrespective of the height of the upper bar 75 from the ground.

Figure 11:
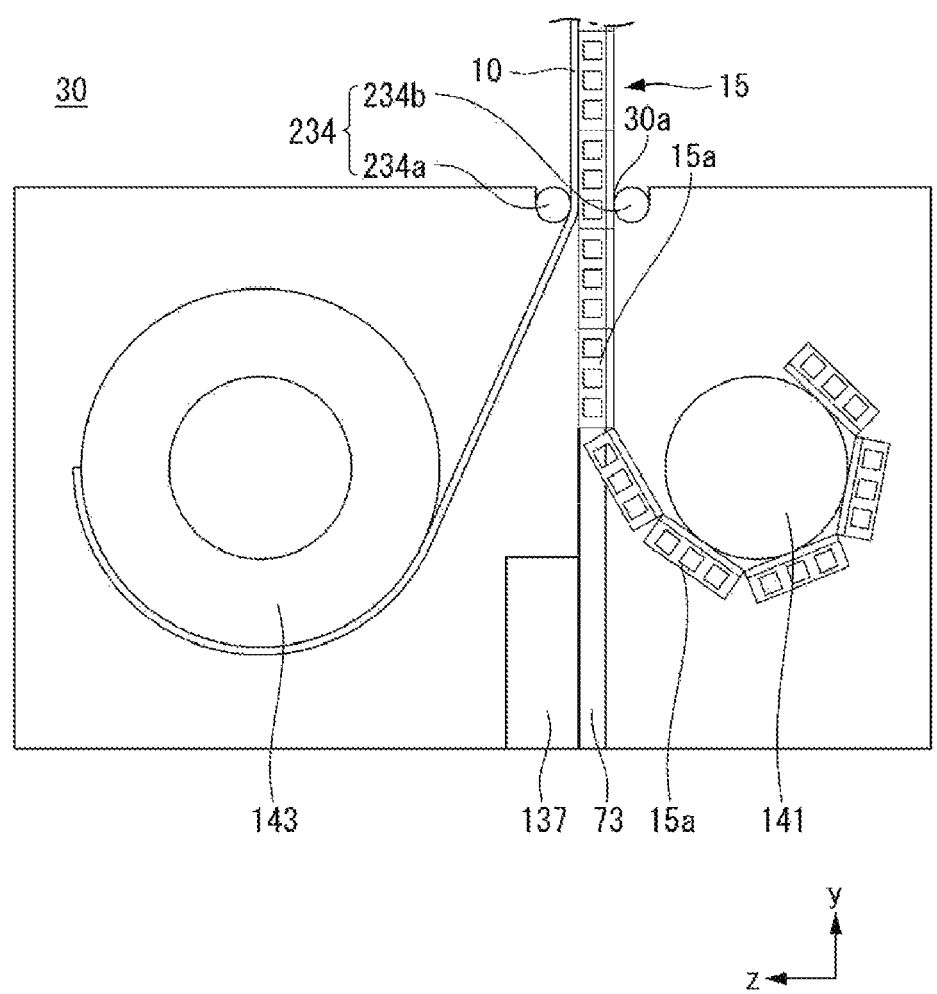

Referring to FIG. 11, the display device according to the present invention may further include a module cover roller 141 as well as the panel roller 143 in the housing 30. The module cover roller 141 may also be referred to as an apron roller 141.

The panel roller 143 may be positioned in front of the link 73 and the module cover roller 141 may be positioned behind the link 73. That is, the panel roller 143 and the module cover roller 141 may face each other having the link 73 positioned therebetween.

The panel roller 143 can wind the display panel 10 and the module cover roller 141 can wind the module cover 15.

The module cover 15 may be thicker than the display panel 10. The module cover roller 141 around which the module cover 15 is wound may occupy a larger space in the housing 30 than the panel roller 143 around which the display panel 10 is wound. Accordingly, the motor assembly 137 may be positioned in front of the link 73 where there is a relatively large space. However, the position of the motor assembly 137 is not limited thereto and the motor assembly 137 may be positioned behind the link 73.

Since the display panel 10 and the module cover 15 are separately wound in the housing 30, the force of the panel roller 143 winding the display panel 10 may be greater than the adhesive force between the display panel 10 and the module cover 15. Further, the force of the module cover roller 141 winding the module cover 15 may be greater than the adhesive force between the display panel 10 and the module cover 15.

In the present disclosure, the display panel 10 and the module cover 15 can be respectively wound by two rollers. Accordingly, a less weight may be applied to each roller as compared to a case in which both the display panel 10 and the module cover 14 are wound around one roller. Accordingly, the display panel 10 wound around the panel roller 143 can be prevented from loosening. Further, the module cover 15 wound around the module cover roller 141 can be prevented from loosening.

Figure 12:
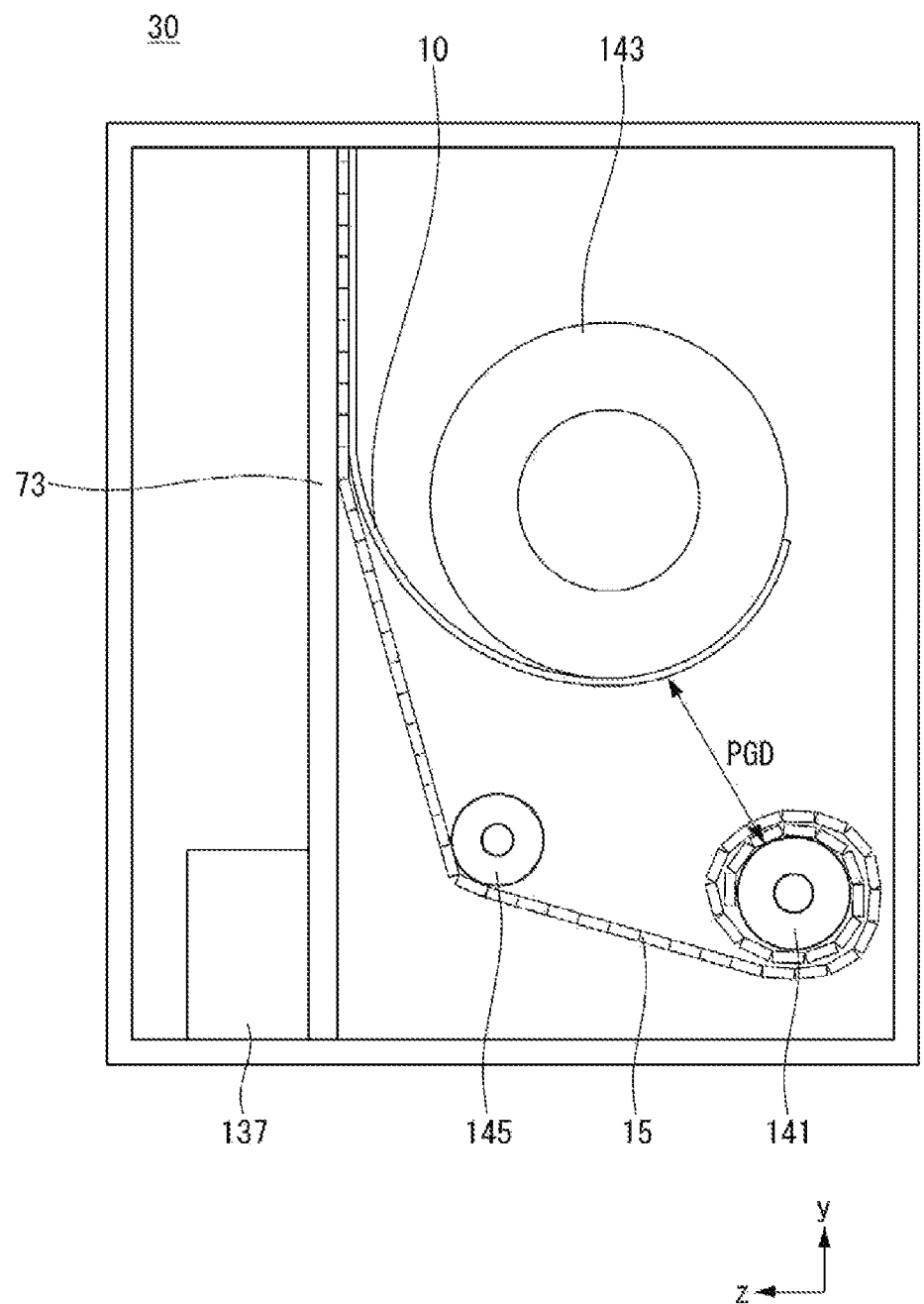

Referring to FIG. 12, the panel roller 143 and the module cover roller 141 may be positioned on the same side on the basis of the link 73. For example, the panel roller 143 and the module cover roller 142 may be positioned behind the link 73. However, the positions of the panel roller 143 and the module cover roller 141 are not limited thereto and the panel roller 143 and the module cover roller 141 may be positioned in front of the link 73.

The module cover roller 141 may be positioned under the panel roller 143. Interference may occur between the module cover roller 141 around which the module cover 15 is wound and the panel roller 143 around which the display panel 10 is wound. Accordingly, the module cover roller 141 may be separated from the panel roller 143 by a first distance PGD or more to prevent the interference therebetween.

The first distance PGD may be a distance in which interference between the module cover roller 141 around which the module cover 15 is wound and the panel roller 143 around which the display panel 10 is wound is prevented.

The guide roller 145 may be positioned under the panel roller 143. The guide roller 145 can guide the position of the module cover 15 such that the module cover 15 does not interfere with the panel roller 143.

Figure 13:
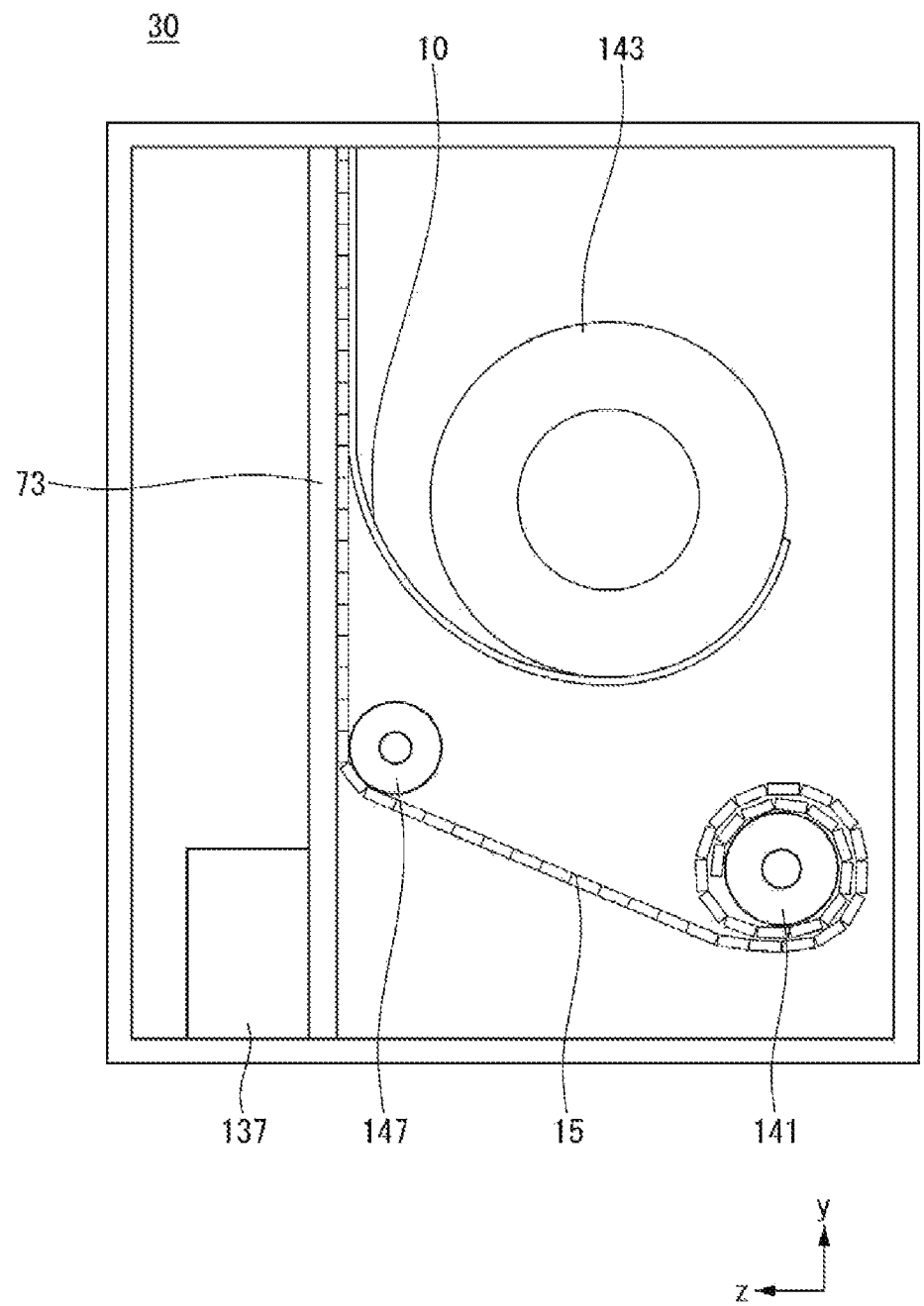

Referring to FIG. 13, a pressure roller 147 may be positioned under the panel roller 143. The pressure roller 147 can press the module cover 15 such that the module cover 15 comes into contact with the link 73. Accordingly, loosening or bending of the module cover 15 can be prevented. The pressure roller 147 may be positioned in proximity to the link 73. The pressure roller 147 may guide the module cover 15 such that the module cover 15 and the display panel 10 do not interfere with each other.

Figure 14:
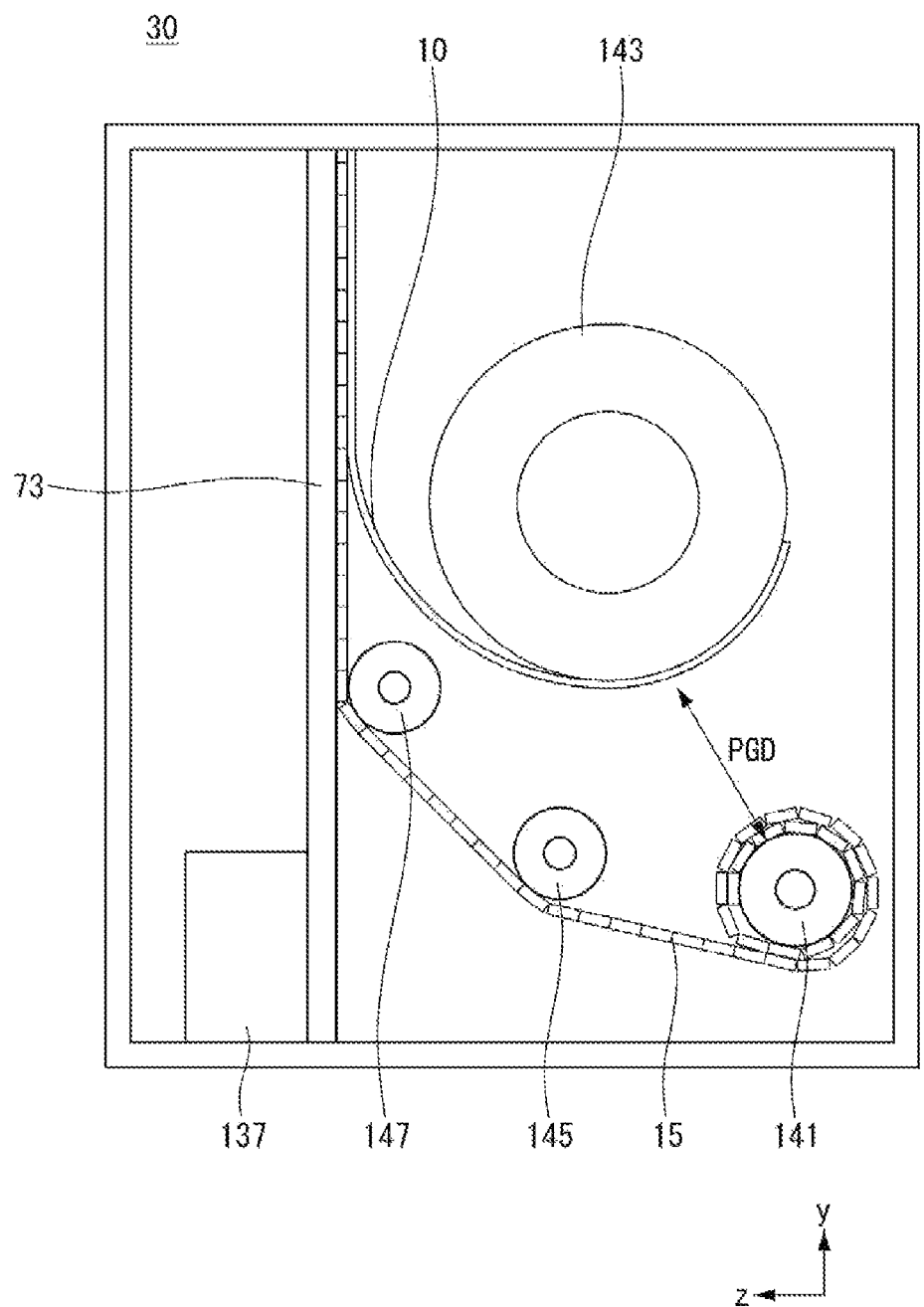

Referring to FIG. 14, the guide roller 145 and the pressure roller 147 may be positioned under the panel roller 143. The guide roller 145 can guide the position of the module cover 15 such that the module cover 15 does not interfere with the panel roller 143. The pressure roller 147 can press the module cover 15 such that the module cover 15 comes into contact with the link 73.

Accordingly, malfunction of the display device due to loosening or bending of the module cover 15 can be prevented. Furthermore, malfunction of the display device due to mutual interference between the module cover 15 and the display panel 10 can be prevented.

Figure 15:
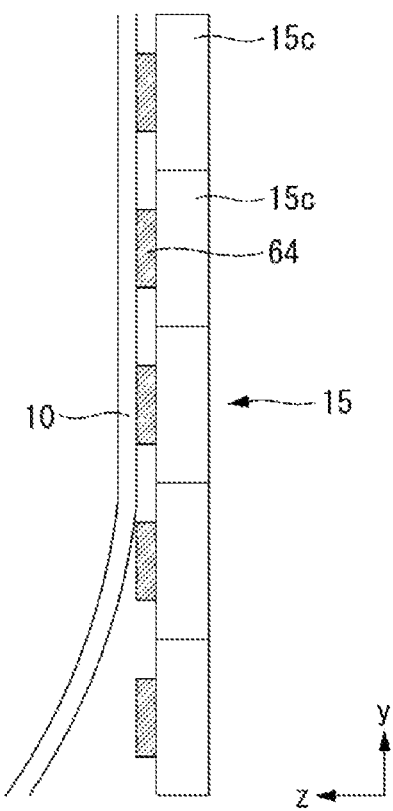

Referring to FIG. 15, in the display device according to the present disclosure, segments 15c positioned on both sides of the module cover can be attached to the display panel 10. The segments 15C may also be referred to as third module covers 15c.

Magnets 64 may be attached to the front sides of the segments 15c. The magnets 64 may be attached to the segments 15c through a double-sided tape. The magnets 64 may be provided for the respective segments 15c.

The display panel 10 may include a metal material. Accordingly, the display panel 10 and the magnets 64 can be attached to each other by magnetic force. Furthermore, the display panel 10 and the segments 15c can be attached to each other through the magnets 64.

The display panel 10 may contain a Fe—Ni invar alloy on the rear side thereof. Accordingly, the display panel 10 can be strongly attached to the magnets 64.

Since the display panel 10 and the module cover 15 are attached to each other using the magnets 64 positioned only on both sides of the module cover 15, many magnets 64 are not required and thus manufacturing costs can be reduced.

Figure 16:
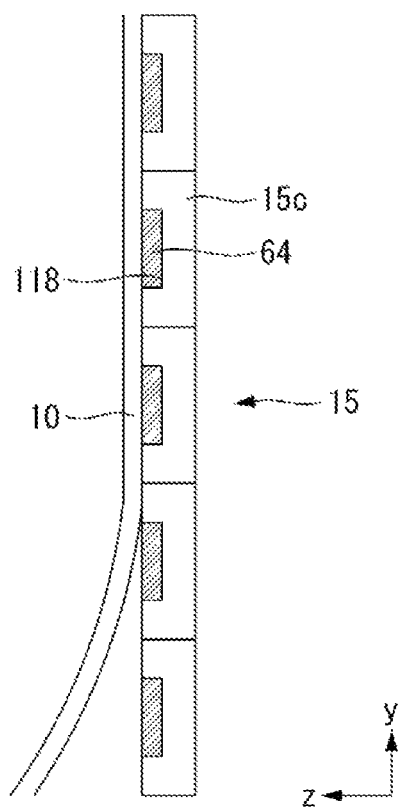

Referring to FIG. 16, in the display device according to the present disclosure, the magnets 64 may be positioned in recesses 118 of the segments 15c.

The recesses 118 may be positioned on the surfaces of the segments 15c facing the display panel 10. The recesses 118 may be positioned on the front sides of the segments 15c. The magnets 64 are accommodated in the recesses 118 and thus may not be exposed to the outside of the segments 15c. Accordingly, the display panel 10 may be flattened without being wrinkled even when it comes into contact with the segments 15c.

The magnets 64 are accommodated in the recesses 118 and thus the thickness of the segments 15c can be reduced. Furthermore, the thickness of the display device can be reduced.

Figure 17A:
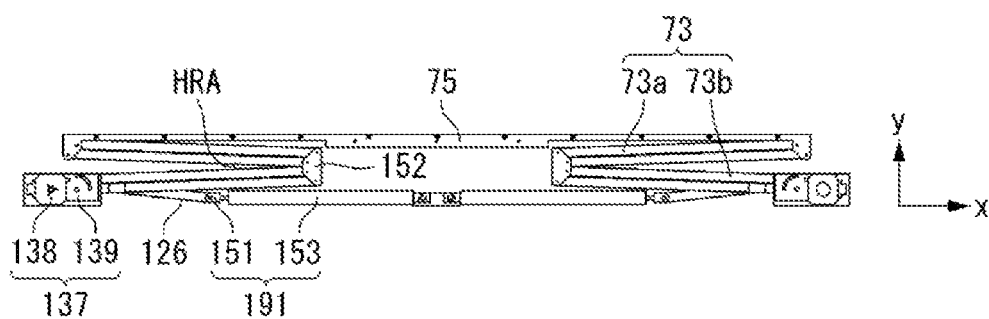
Figure 17B:
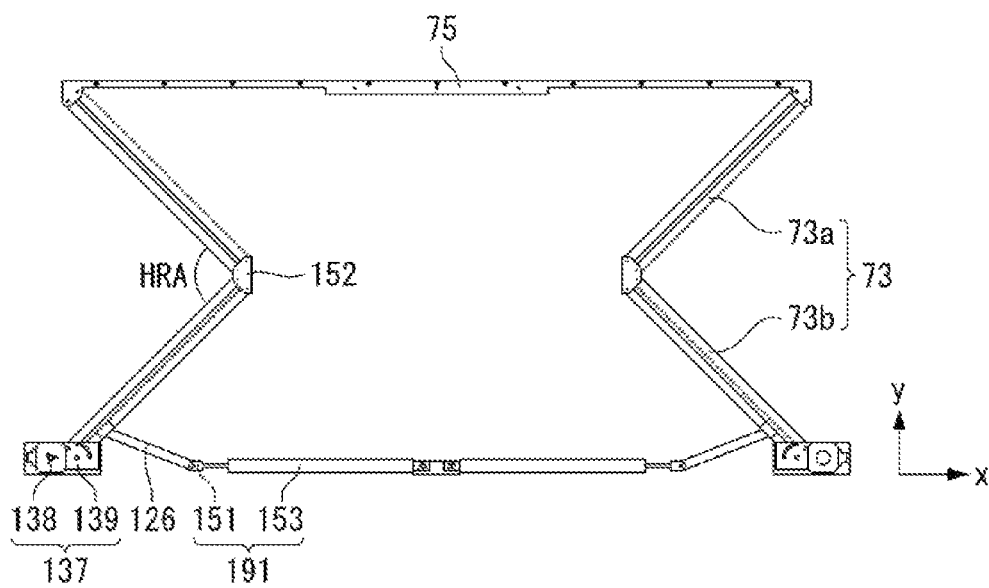
Figure 17C:
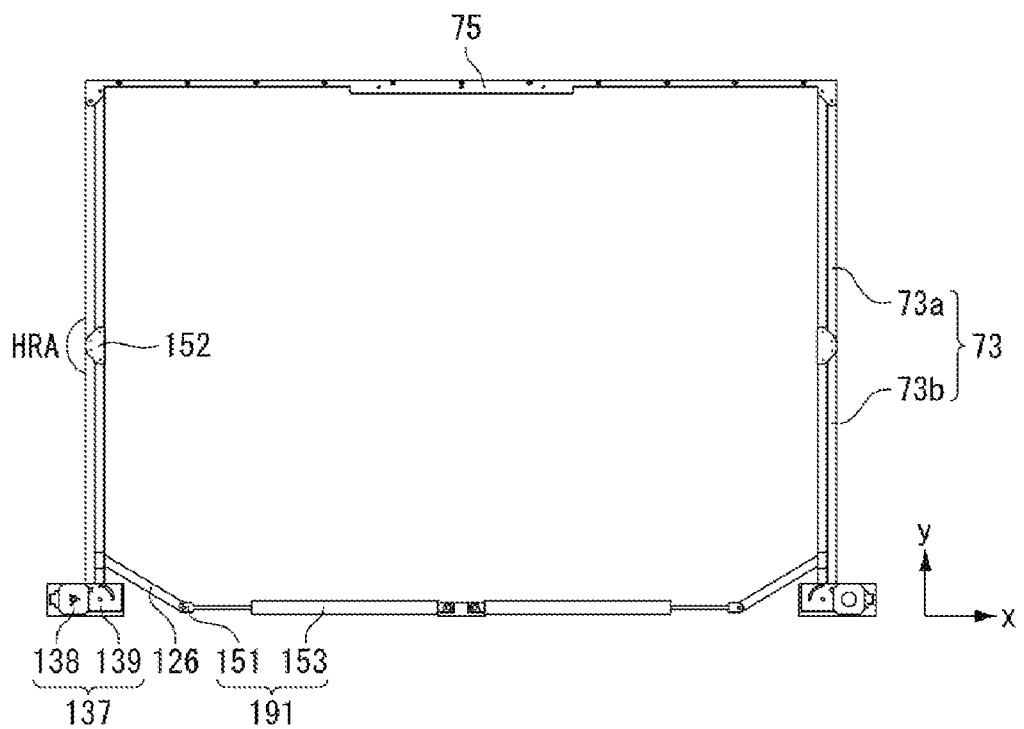

Referring to FIGS. 17A to 17C, the upper bar 75 can move upward as the display device according to the present disclosure switches from the first state to the second state. The upper bar 75 can move upward or downward by the link 74 connected to both ends thereof.

As shown in FIG. 17A, an angle HRA between the first arm 73a and the second arm 73b may be very small in the first state. Accordingly, the upper bar 74 may not move upward. Furthermore, the display panel and the module cover may be wound around the panel roller.

As shown in FIG. 17B, the angle HRA between the first arm 73a and the second arm 73b can increase as the motor assembly 137 rotates. As the angle HRA between the first arm 73a and the second arm 73b increases, the upper bar 75 can move upward. Accordingly, the display panel and the module cover wound around the panel roller can be gradually released.

As shown in FIG. 17C, the first arm 73a and the second arm 73b can be positioned on a straight line in the second state. That is, the angle HRA between the first arm 73a and the second arm 73b can become 180 degrees. Accordingly, the upper bar 75 can move upward to a maximum height. Furthermore, the display panel and the module cover can be released from the panel roller.

Figure 17D:
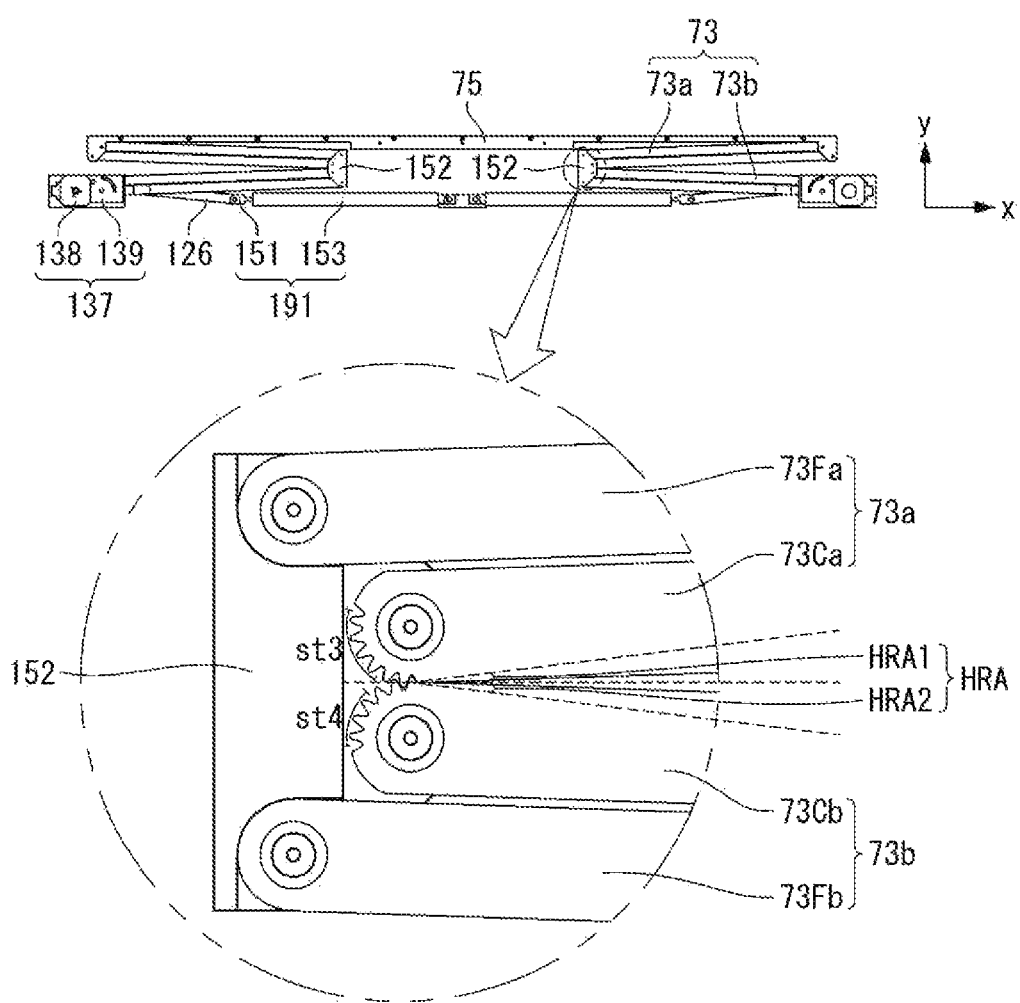

Referring to FIG. 17D, the display device according to the present disclosure may include a plurality of first arms 73a and second arms 73b.

Specifically, the first arm 73 may include a first upper arm 73Ca and a second upper arm 73Fa. The second arm 73b may include a first lower arm 73Cb and a second lower arm 73Fb.

The first upper arm 73Ca may also be referred to as a first upper link 73Ca. The second upper arm 73Fa may also be referred to as a second upper link 73Fa. The first lower arm 73Cb may also be referred to as a first lower link 73Cb. The second lower arm 73Fb may also be referred to as a second lower link 73Fb.

The first arm 73a may be rotatably connected to the upper part of the arm joint 152. The second arm 73b may be rotatably connected to the lower part of the arm joint 152.

Specifically, the second upper arm 73Fa may be connected higher than the first upper arm 73Ca. The second lower arm 73Fb may be connected lower than the first lower arm 73Cb.

A gear st3 can be formed at the lower part of the first upper arm 73Ca. A gear st4 can be formed at the upper part of the first lower arm 73Cb. The gear st3 of the first upper arm 73Ca and the gear st4 of the first lower arm 73Cb can engage with each other.

An angle HRA1 between the ground and the first upper arm 73Ca and an angle HRA2 between the ground the first lower arm 73Cb may be identical because the first upper arm 73Ca and the first lower arm 73Cb engage each other. Further, angles between the first upper arms 73Ca and the first lower arms 73Cb on both sides may be identical because the first upper arm 73Ca and the first lower arm 73Cb engage each other. Accordingly, the upper bar 75 can move upward or downward while being leveled without being tilted. That is, angles between the first upper arms 73Ca and the first lower arms 73Cb can be identical irrespective of the height of the upper bar 75 from the ground.

The second upper and lower arms 73Fa and 73Fb may not have gears formed thereat. The angle between the second upper arm 73Fa and the second lower arm 73Fb may be identical to the angle between the first upper arm 73Ca and the first lower arm 73Cb.

Figure 17E:
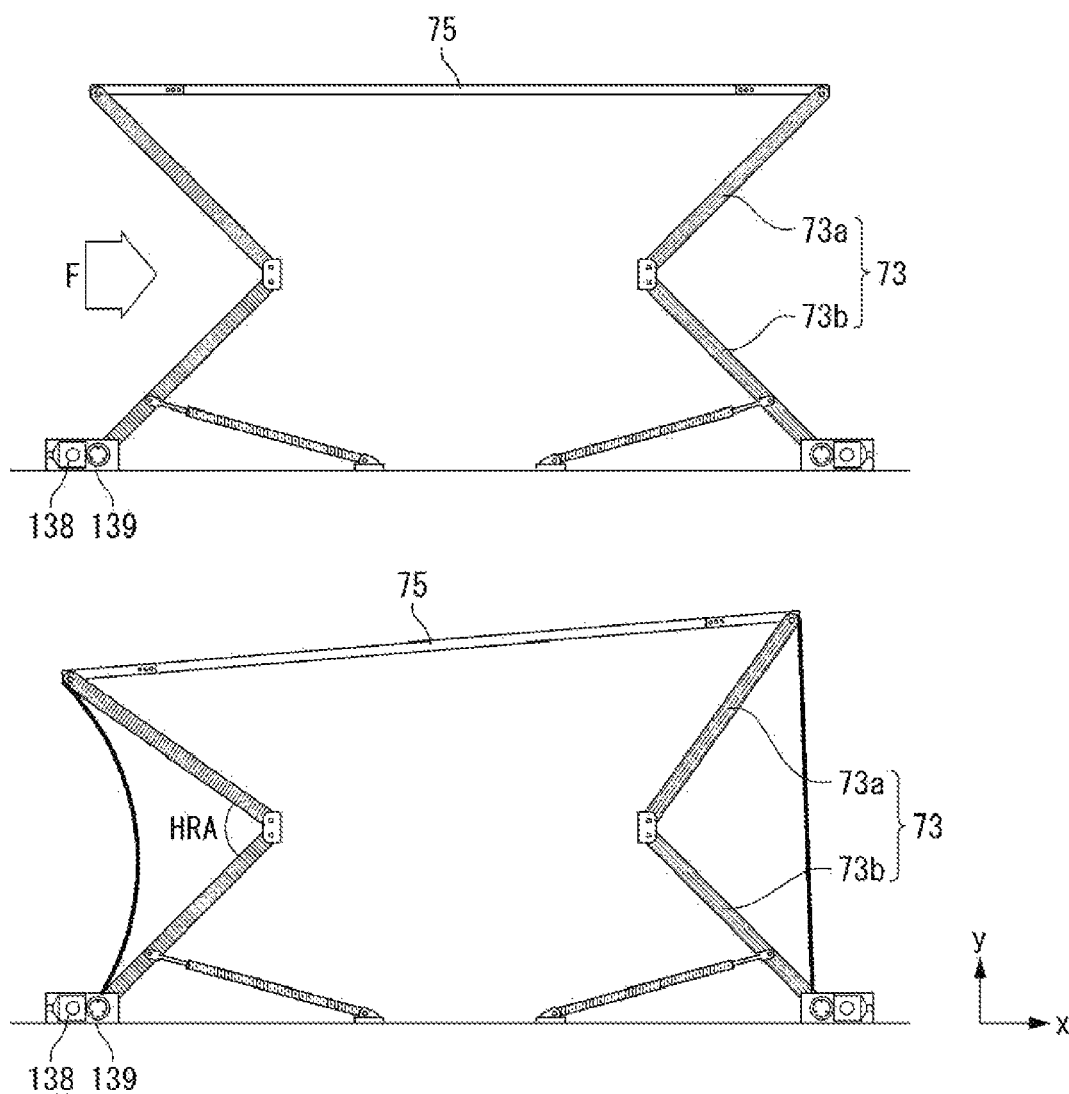

As shown in FIG. 17E, in a conventional display device, each of upper and lower arms 73a and 73b may be configured as a single arm. Accordingly, when external force F is applied to one side of the display device, angles between upper arms 83a and lower arms 73b on both sides may differ from each other. In this case, the display panel may be deflected to one side.

Figure 17F:
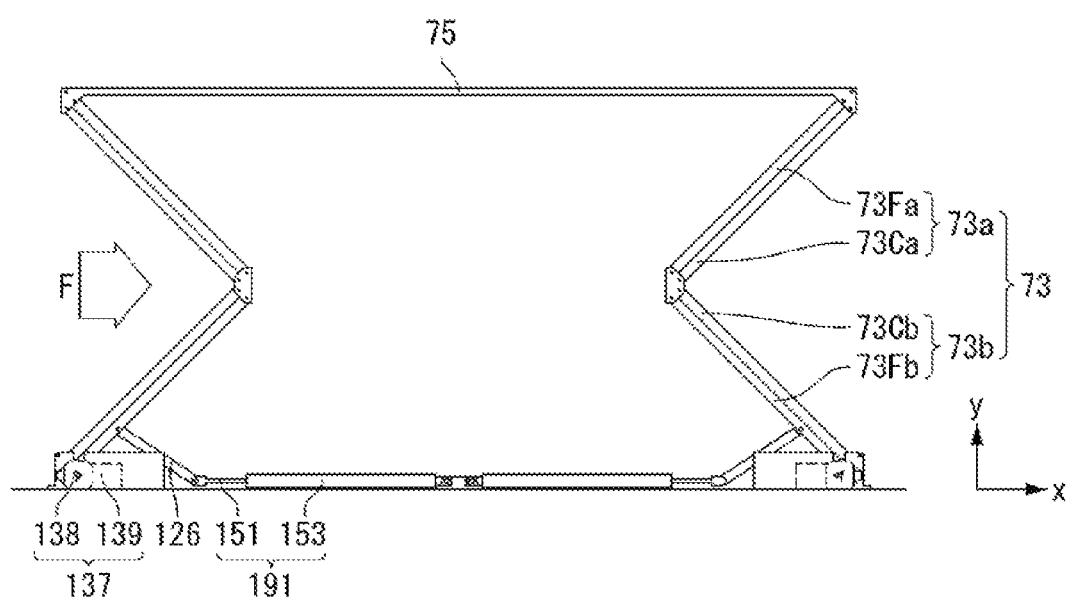

On the other hand, when the gear st3 of the first upper arm 73Ca and the gear st4 of the first lower arm 73Cb engage with each other, as shown in FIG. 17F, the angle HLA between the upper and lower arms 73a and 73b may not change even when external force F is applied to one side of the display device. Accordingly, the display panel can be prevented from being damaged due to deflection.

Figure 17G:
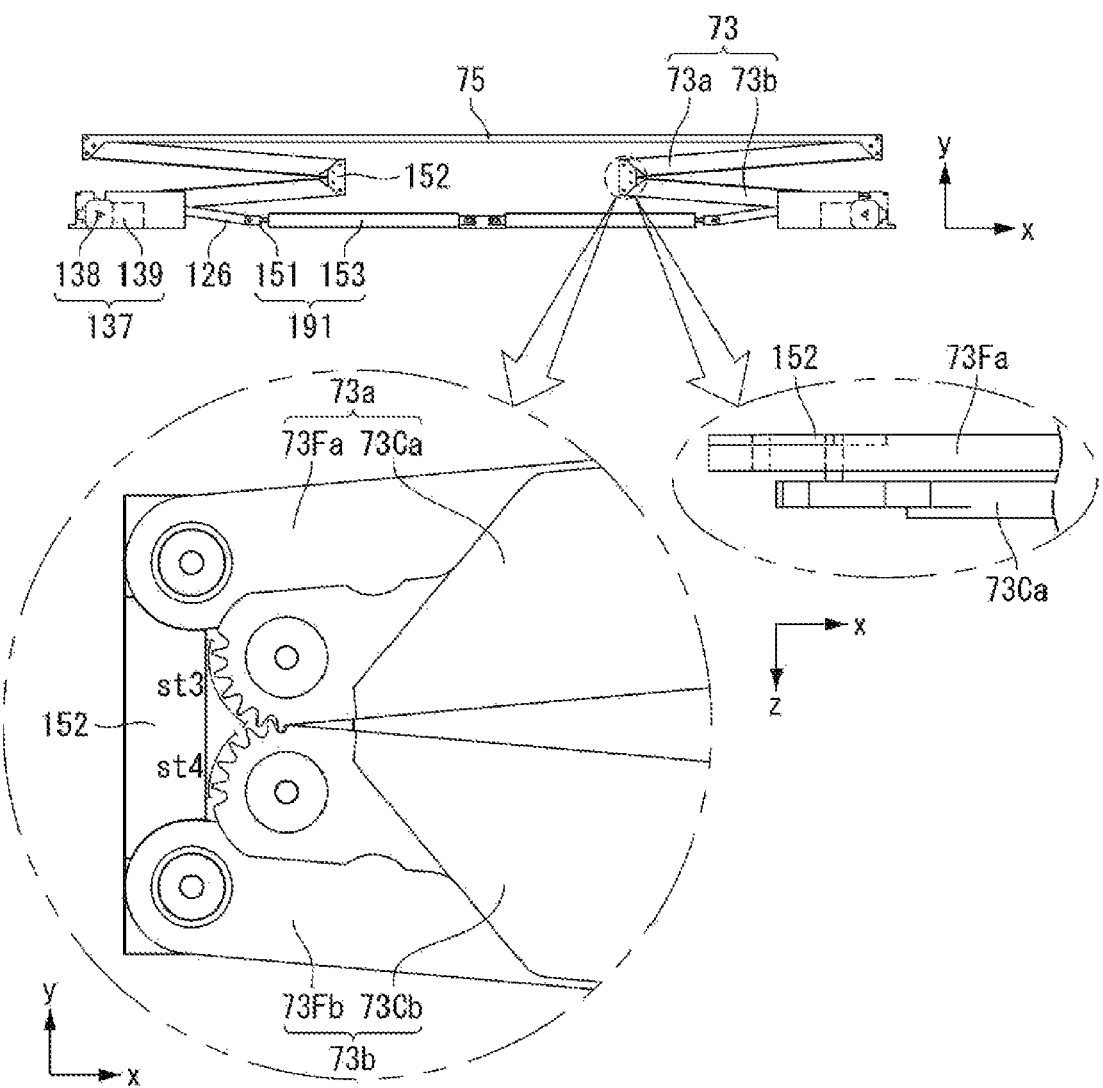

Referring to FIG. 17G, one side of the first upper arm 73Ca and one side of the first lower arm 73Cb may extend to the second upper and lower arms 73Fa and 73Fb. That is, the widths of the first upper and lower arms 73Ca and 73Cb may further increase. Accordingly, when the link 73 is viewed from the front of the display device, the first upper and lower arms 73Ca and 73Cb can shield the second upper and lower arms 73Fa and 73Fb at the front thereof. Further, the first upper arm 73Ca may be superposed on the second upper arm 73Fa. Further, the first lower arm 73Fb may be superposed on the second lower arm 73Fb.

Rotation axes of the first upper arm 73Ca, the second upper arm 73Fa, the first lower arm 73Cb and the second lower arm 73Fb can be separated from each other.

A vertical height of the portion of the arm joint 152 which is connected to the first upper and lower arms 73Ca and 73Cb may differ from a vertical height of a portion of the arm joint 152 which is connected to the second upper and lower arms 73Fa and 73Fb.

Although not shown, one side of the second upper arm 73Fa and one side of the second lower arm 73Fb may also extend to the first upper and lower arms 73Ca and 73Cb. That is, the widths of the second upper and lower arms 73Fa and 73Fb may further include when viewed from the rear side. Accordingly, the second upper and lower arms 73Fa and 73Fb can shield the first upper and lower arms 73Ca and 73Cb at the front thereof.

Figure 17H:
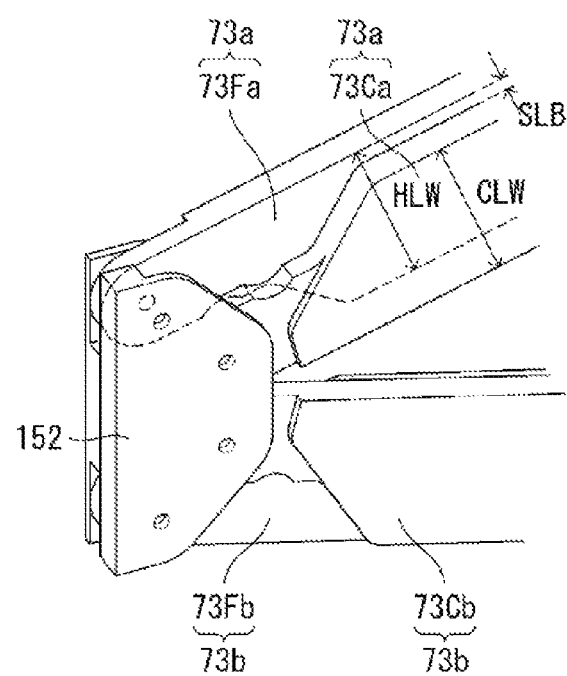

As shown in FIG. 17H, at least parts of the first upper and lower arms 73Ca and 73Cb may be superposed on the second upper and lower arms 73Fa and 73Fb in the first state. For example, the first upper and lower arms 73Ca and 73Cb may be separated from the second upper and lower arms 73Fa and 73Fb by a predetermined distance SLD and superposed on the second upper and lower arms 73Fa and 73Fb. Accordingly, the width HLW of the first arm 73a may be greater than the width of the second upper arm 73Fa or the width CLW of the first upper arm 73Ca.

Figure 17I:
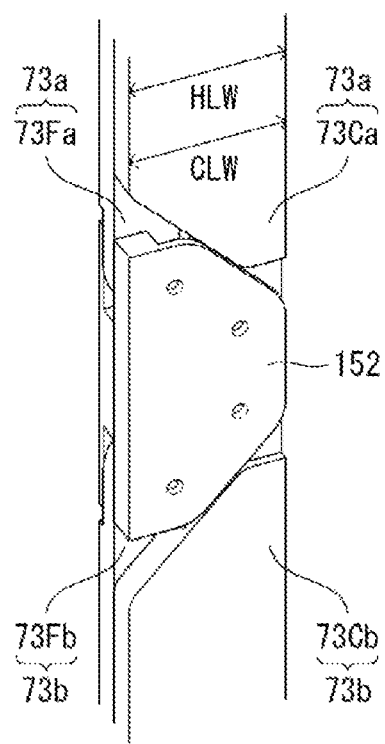

On the other hand, the entire first upper and lower arms 73Ca and 73Cb may be superposed on the second upper and lower arms 73Fa and 73Fb in the second state, as shown in FIG. 17I. Accordingly, the width HLW of the first arm 73a can be the same as the width of the second upper arm 73Fa or the width CLW of the first upper arm 73Ca.

Figure 17J:
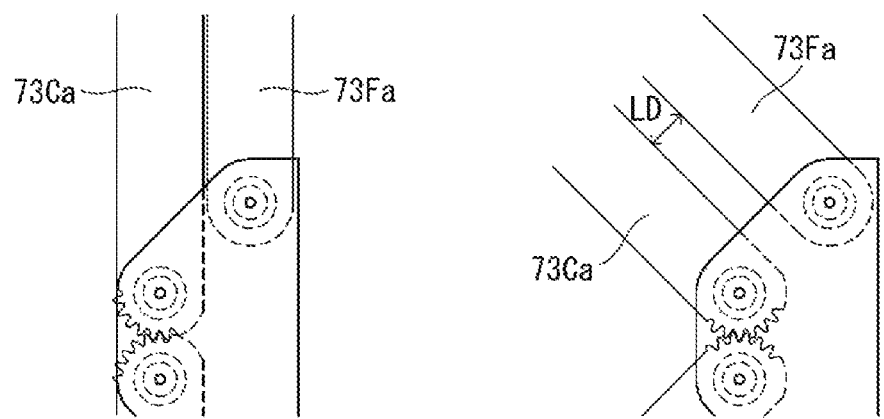

As shown in FIG. 17J, when one side of the first upper arm 73Ca does not extend, the first upper arm 73Ca can be separated from the second upper arm 73Fa by a predetermined distance LD as the second state switches to the first state. As the second state switches to the first state, the distance LD between the first upper arm 73Ca and the second upper arm 73Fa can further increase.

In this case, a user's hand may be caught between the first upper arm 73Ca and the second upper arm 73Fa and thus injured when the first state switches to the second state.

Figure 17K:
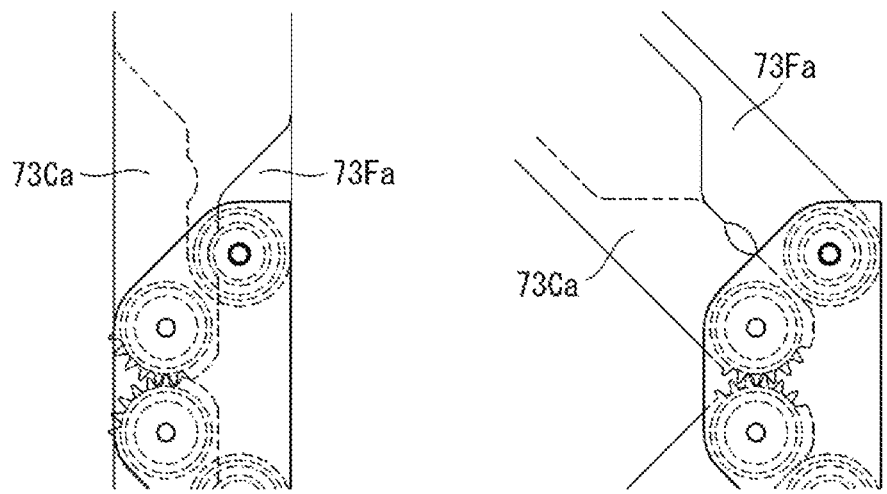

However, when one side of the first upper arm 73Ca extends to be superposed on the second upper arm 73Fa, as shown in FIG. 17K, the gap between the first upper arm 73Ca and the second upper arm 73Fa may not be exposed even when the second state switches to the first state. Accordingly, a user's hand can be prevented from being caught between the first upper arm 73Ca and the second upper arm 73Fa during switching from the first state to the second state.

Figure 18:
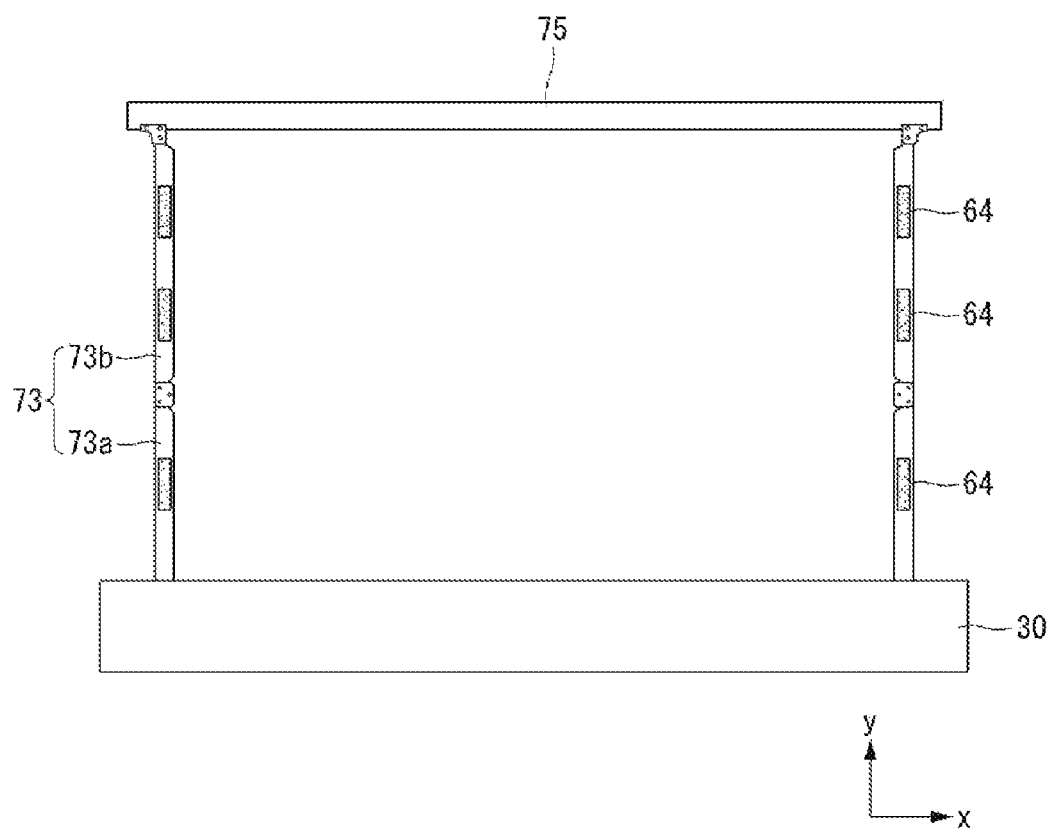
FIGS. 18 to 29 are diagrams showing a display device according to an embodiment of the present disclosure.

Referring to FIG. 18, a plurality of magnets 64 may be positioned on the link 73. For example, at least one magnet 64 may be positioned on the first arm 73$a$ and at least one magnet 64 may be positioned on the second arm 73$b$. The plurality of magnets 64 may be separately positioned.

The display may include a metal material. The display can be attached to the link 73 using the magnets 64. Even if the magnetic force of any one of the plurality of magnets 64 weakens, attachment of the display panel and the module cover to the link 73 can be maintained due to the magnetic force of the remaining magnets 64.

Figure 19:
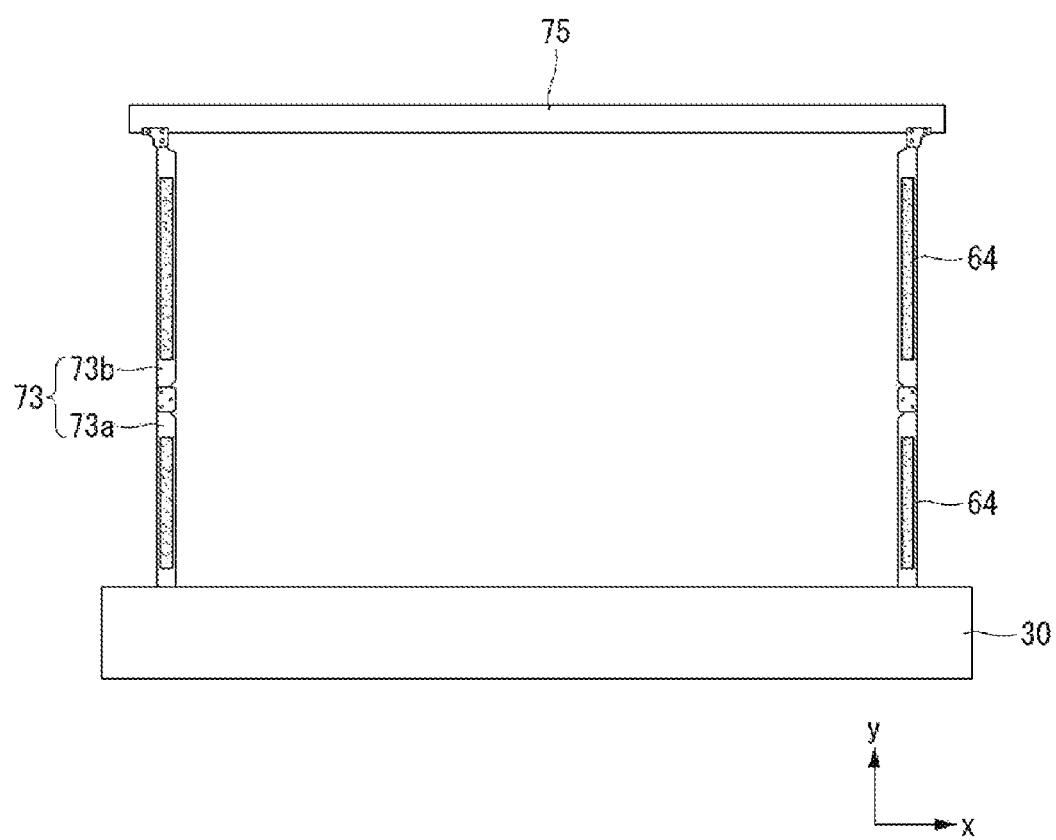

Referring to FIG. 19, one magnet 64 may be positioned on each of the first arm 73$a$ and the second arm 73$b$. In this case, the magnets 64 may have a shape extending in the long side direction of the first arm 73$a$ and the second arm 73$b$.

Since the magnets 64 have a shape extending in the long side direction of the first arm 73$a$ and the second arm 73$b$, the area in which the link 73 is attached to the display panel and the module cover can increase. Accordingly, adhesion of the link 73 and the display panel and the module cover can be improved.

Figure 20:
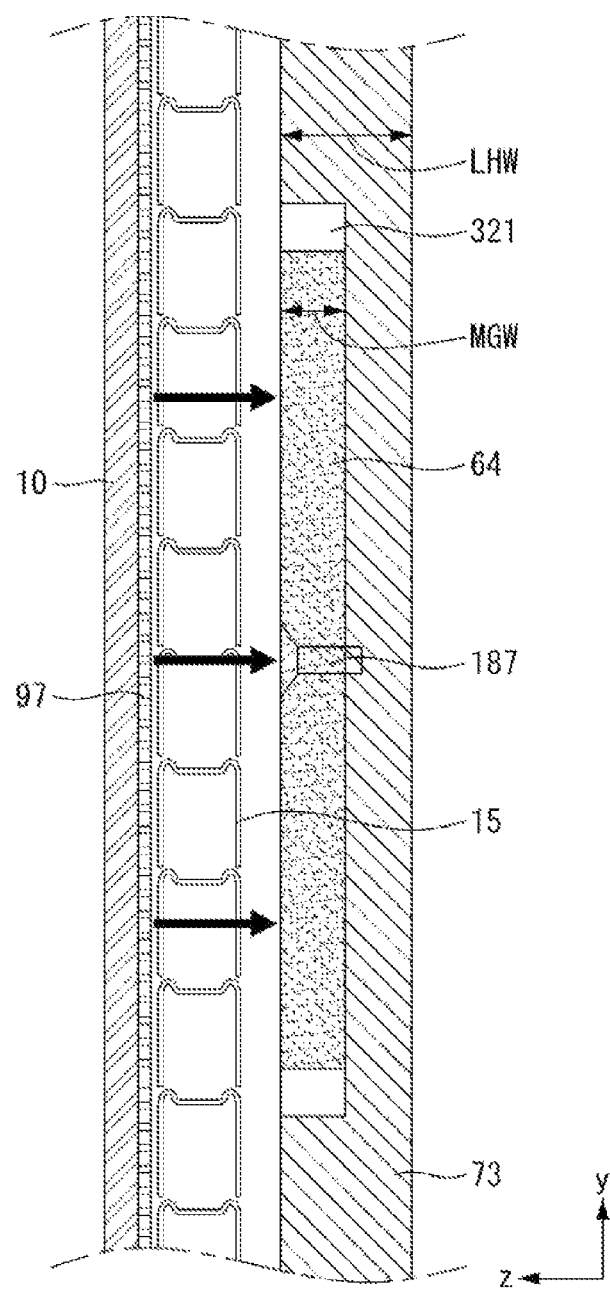

Referring to FIG. 20, each magnet 64 may be positioned in a recess 321 formed in the link 73. The recess 321 may have a shape recessed into the link 73. Each magnet 64 may be combined with the link 73 through at least one screw 187.

A width LHW of recession of the recess 321 into the link 73 may be equal to or greater than the thickness MGW of the magnet 64. If the thickness MGW of the magnet 64 is greater than the width LHW of the recess 321, the display panel 10 and the module cover 15 may not be attached to the link 73. In this case, the display panel 10 may be wrinkled or may not be flat.

A panel protector 97 may be disposed on the rear side of the display panel 10. The panel protector 97 can prevent impact applied to the display panel 10 due to friction between the display panel 10 and the module cover 15. The panel protector 97 may include a metal material. The panel protector 97 may be very thin. For example, the panel protector 97 may have a thickness of about 0.1 mm.

Since the panel protector 97 includes a metal material, mutual attraction acts between the panel protector 97 and the magnet 64. The module cover 15 positioned between the panel protector 97 and the link 73 can be attached to the magnet 64 even if the module cover 15 does not include a metal material.

Figure 21:
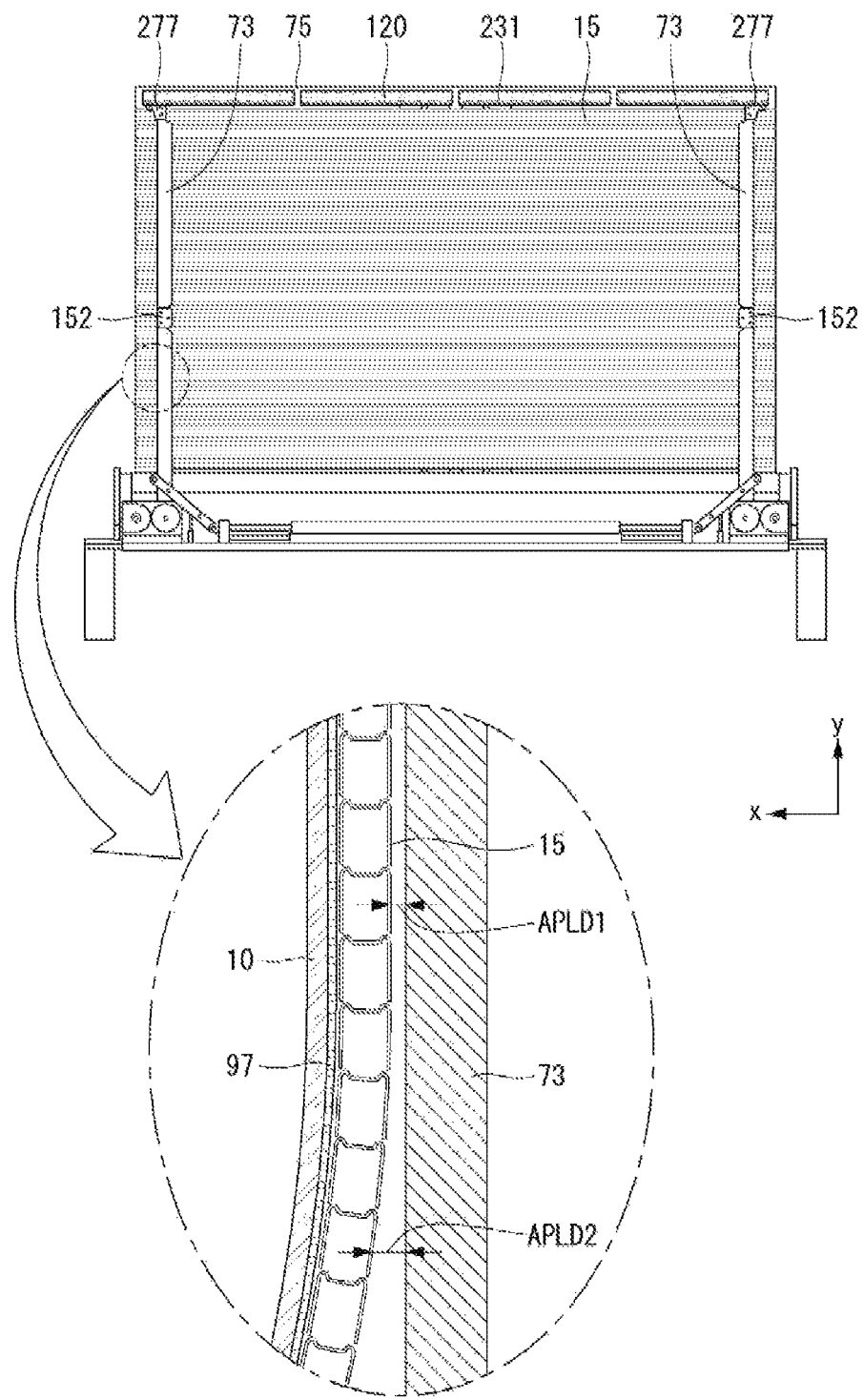

Referring to FIG. 21, when the magnets are not provided on the link 73, the module cover 15 can closely contact the link 73 through the upper bar 75 disposed thereon and the guide bar (234 in FIG. 10) disposed thereunder. A portion of the link 73 between the upper bar 75 and the guide bar may not closely contact the module cover 15. Further, the center of the link 73 may not closely contact the module cover 15. The center of the link 73 may be the vicinity of the arm joint 152. In this case, the distance APRD1 and APRD2 between the module cover 15 and the link 73 may not be uniform. In this case, the display panel 10 may be curved or bent.

Figure 22:
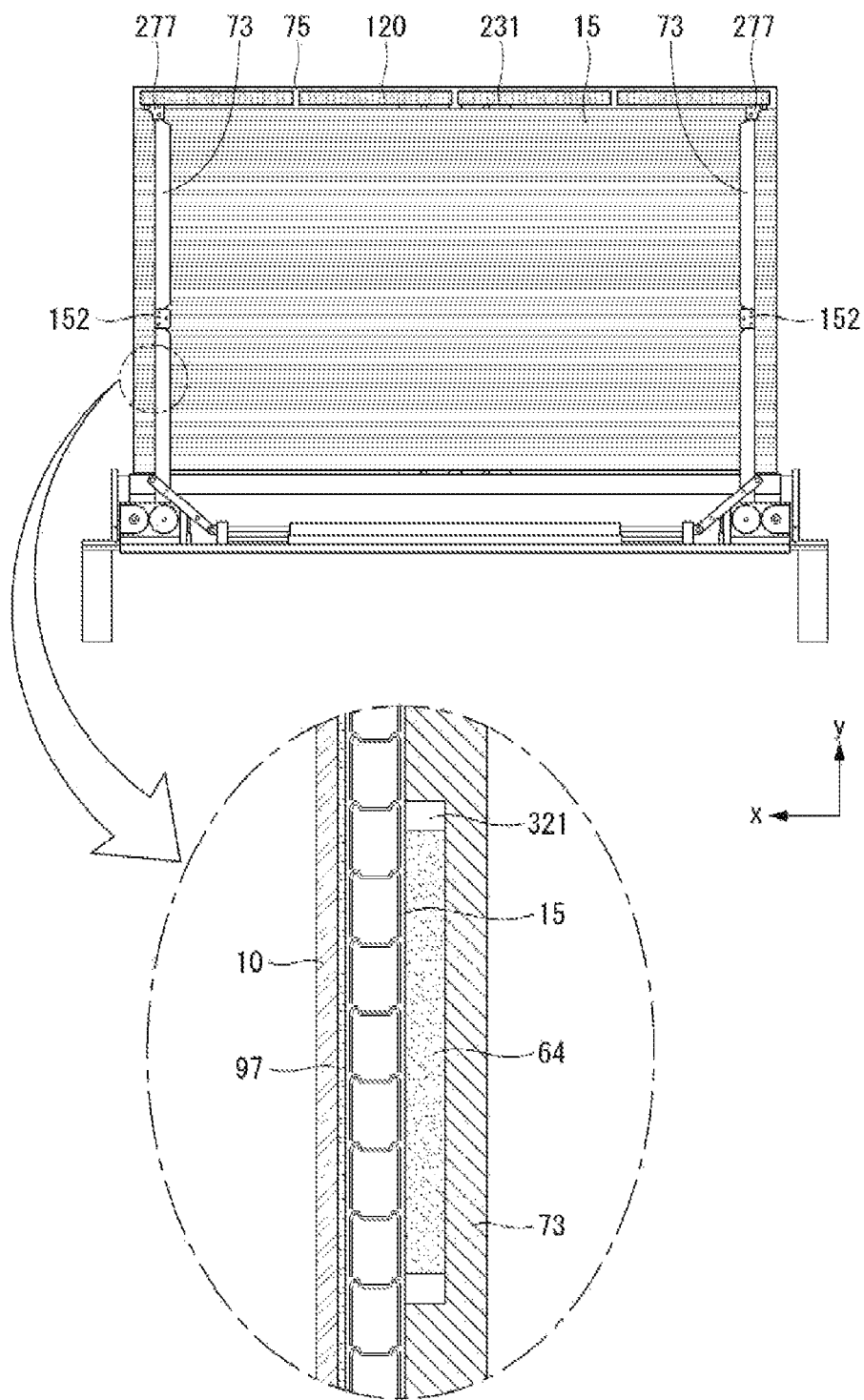

Referring to FIG. 22, when the magnet 64 is positioned on the recess 321 of the link 73, the magnet 64 attracts the panel protector 97 and thus the module cover 15 can be simultaneously attached to the magnet 64. That is, the center of the link 73 can closely contact the module cover 15.

Figure 23A:
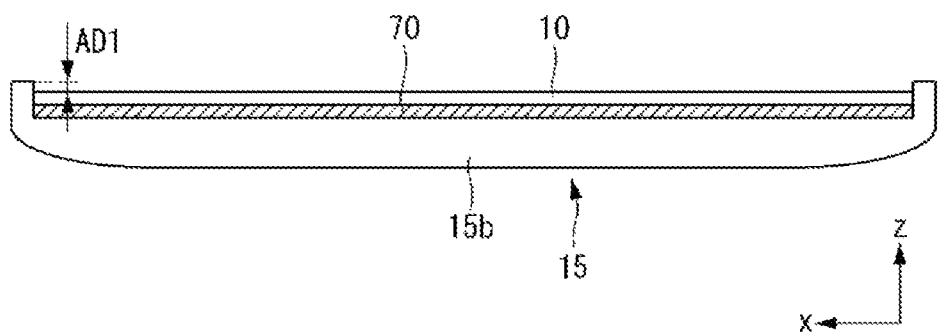
Figure 23B:
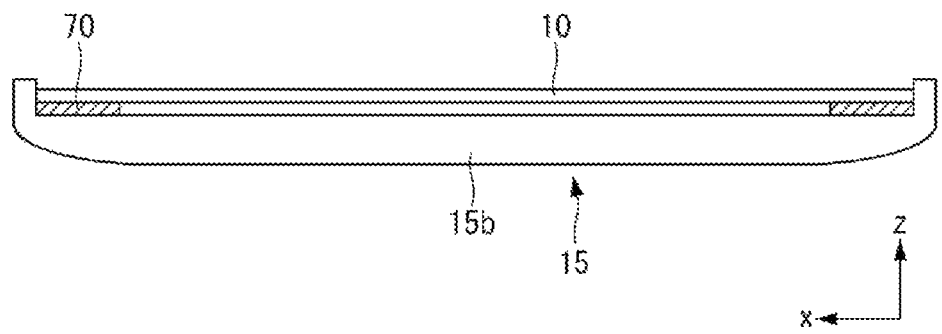

Referring to FIGS. 23A to 23C, both ends of the module cover 15 may be bent in the +z-axis direction. The display panel 10 can be attached to the unbent portion of the module cover 15. The length of the portion bent in the +z-axis direction may be greater than the sum of the thickness of the display panel 10 and the adhesive layer 70. That is, the bent portions of the module cover 15 can protrude from the display panel 10 by a predetermined distance AD1 in the +z-axis direction. Accordingly, the display panel 10 can be shielded when the module cover 15 is viewed in the x-axis direction.

Referring to FIG. 23A, the adhesive layer 70 may be disposed between the display panel 10 and the module cover 15. The adhesive layer 70 may be disposed long in the x-axis direction. The entire display panel 10 can be attached to the module cover 15. In this case, the module cover 15 and the display panel 10 may not be separated from each other because the adhesive force therebetween is very strong.

Referring to FIG. 23B, the adhesive layer 70 may be disposed between the display panel 10 and the module cover 15. The adhesive layer 70 may be disposed at a part between the display panel 10 and the module cover 15. For example, the adhesive layer 70 may be disposed on one side and the other side of the display panel 10. Accordingly, a smaller amount of adhesive layer 70 can be used as compared to a case in which the adhesive layer 70 is disposed long in the x-axis direction. Therefore, display device manufacturing costs can be reduced.

Meanwhile, the present disclosure is not limited to attachment of the display panel 10 to the module cover 15 through the adhesive layer 70, the display panel 10 and the module cover 15 may be attached to each other through magnets.

Figure 24:
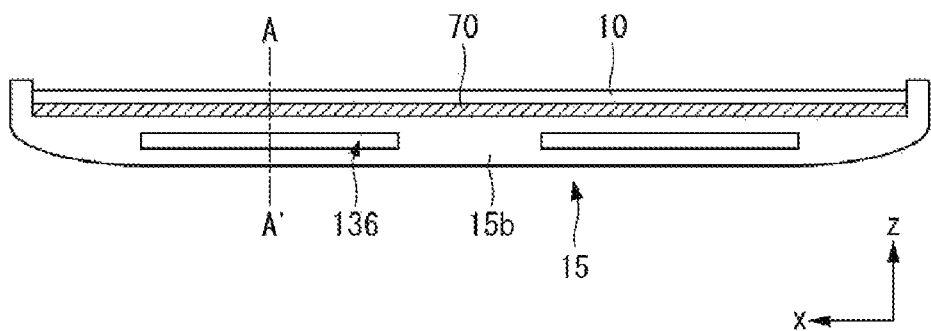
Figure 24:
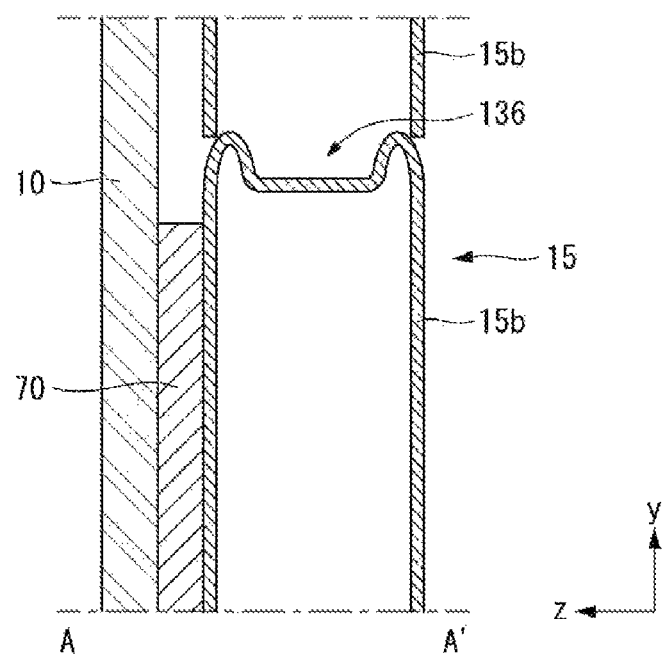

Referring to FIG. 24, a bead 136 may be formed on a segment 15$b$. The bead 136 may have a shape recessed into the segment 15$b$. The bead 136 may be recessed in the −y-axis direction. A plurality of beads 136 may be formed on the segments 15$b$. The plurality of beads 136 may be separately disposed. The beads 136 can improve the rigidity of the segment 15$b$. For example, the beads 136 can prevent the shape of the segment 15$b$ from being changed due to external impact.

Figure 25:
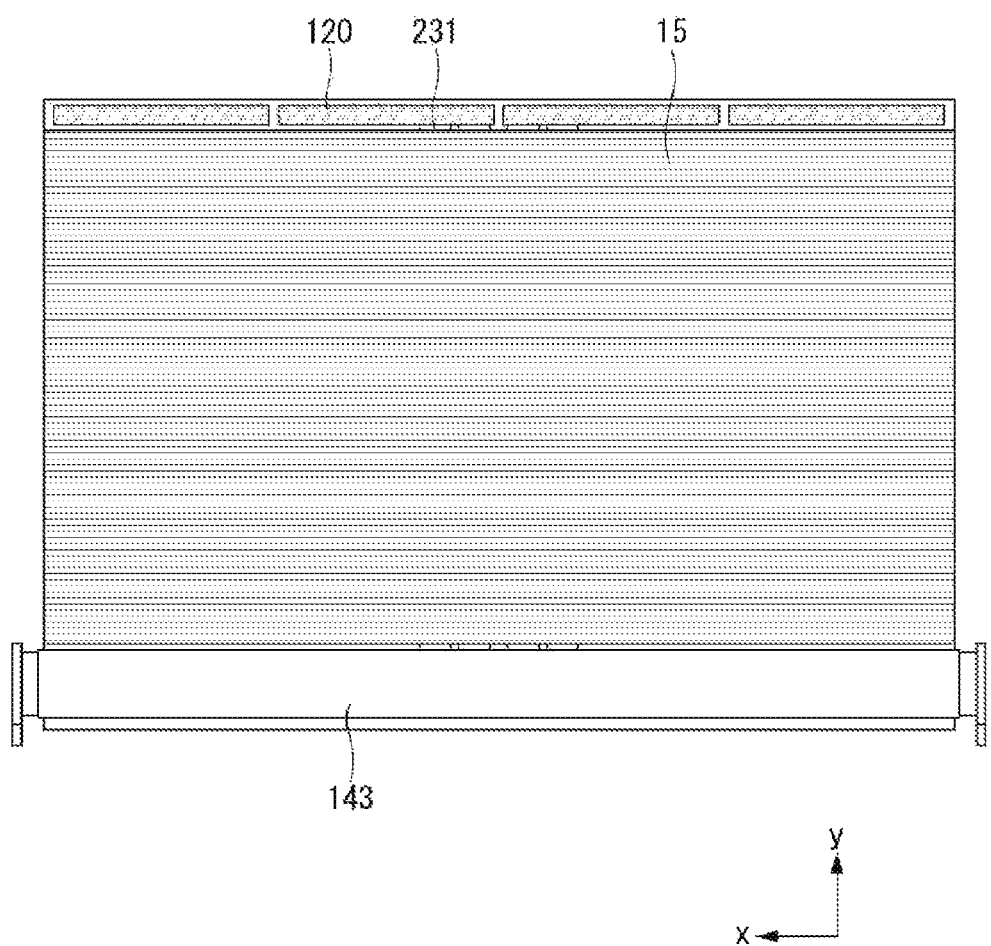

Referring to FIG. 25, the source PCBs 120 may be positioned on the module cover 15. The positions of the source PCBs 120 may change along with movement of the module cover 15 when the first state switches to the second state.

The FFC cable 231 may be positioned at the center of the module cover 15 in the first direction. However, the position of the FFC cable 231 is not limited thereto and the FFC cable 231 may be positioned at both ends of the module cover 15 in the first direction.

Figure 26:
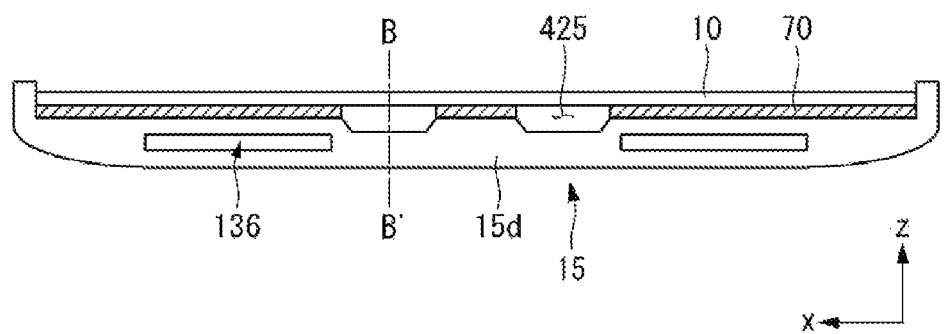
Figure 26:
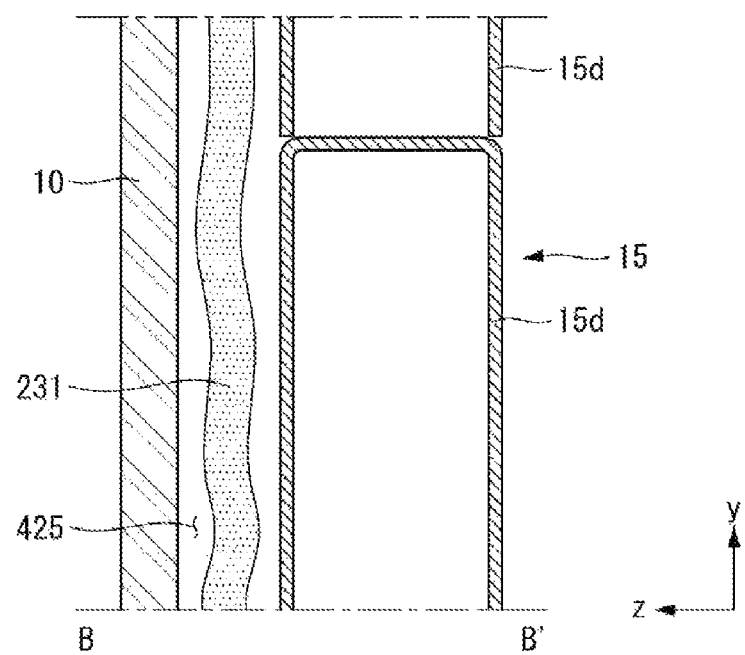

Referring to FIG. 26, a segment 15$d$ may include recesses 425 formed in the
   z-axis direction. The recesses 425 can form a space between the display panel 10 and the module cover 15. The FFC cable 231 can be accommodated in the space formed by the recesses 425. Furthermore, the recesses 425 can improve the rigidity of the segment 15$d$.

The beads 136 may be positioned on portions of the segment 15$d$ other than portions corresponding to the recesses 425. Since the thickness of the portions of the segment 15*d* corresponding to the recesses 425 in the third direction decreases, the beads 136 may not be positioned on the portions. However, the present disclosure is not limited thereto and the beads 136 may be positioned on the portions corresponding to the recesses 425.

Figure 27:
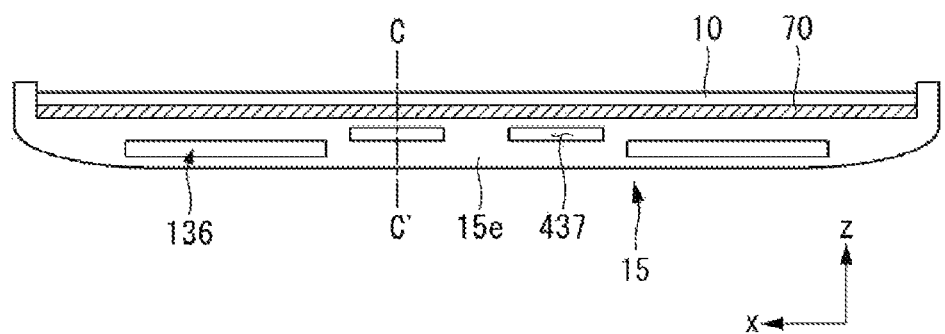
Figure 27:
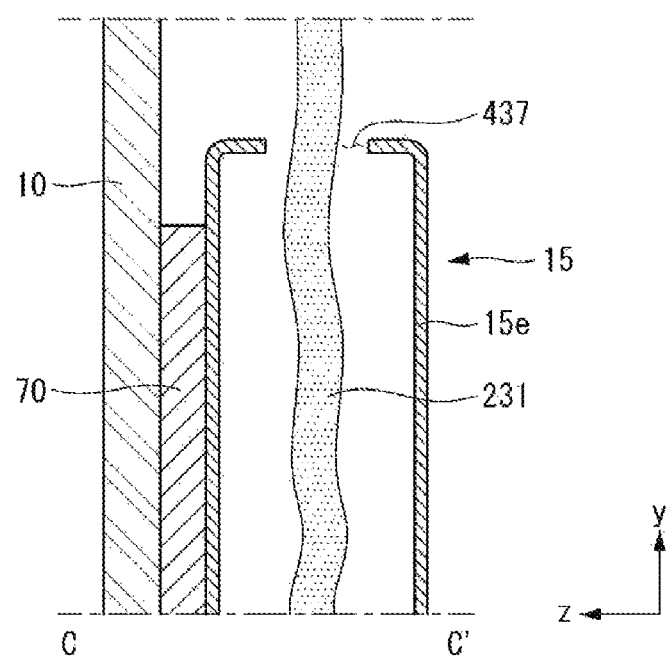

Referring to FIG. 27, a penetration 437 may be positioned at the center of a segment 15*e* in the first direction. The penetration 437 can penetrate the center of the segment 15*e* in the second direction. That is, the penetration 437 may be a hole positioned inside the segment 15*e*. The penetration 437 may be a portion at which the FFC cable 231 is positioned. Since the penetration 437 is formed in the segment 15*e*, the thickness of the segment 15*e* can be reduced as compared to a case in which the FFC cable 231 is positioned in the recess 425.

Beads 136 may be positioned on the portion of the segment 15*e* other than the portion corresponding to the penetration 437. Since the thickness of the portion of the segment 15*e* corresponding to the penetration 437 in the third direction decreases, the beads 136 may not be positioned on the portion. However, the present disclosure is not limited thereto and the beads 136 may also be positioned on the portion corresponding to the penetration 437.

Figure 28:
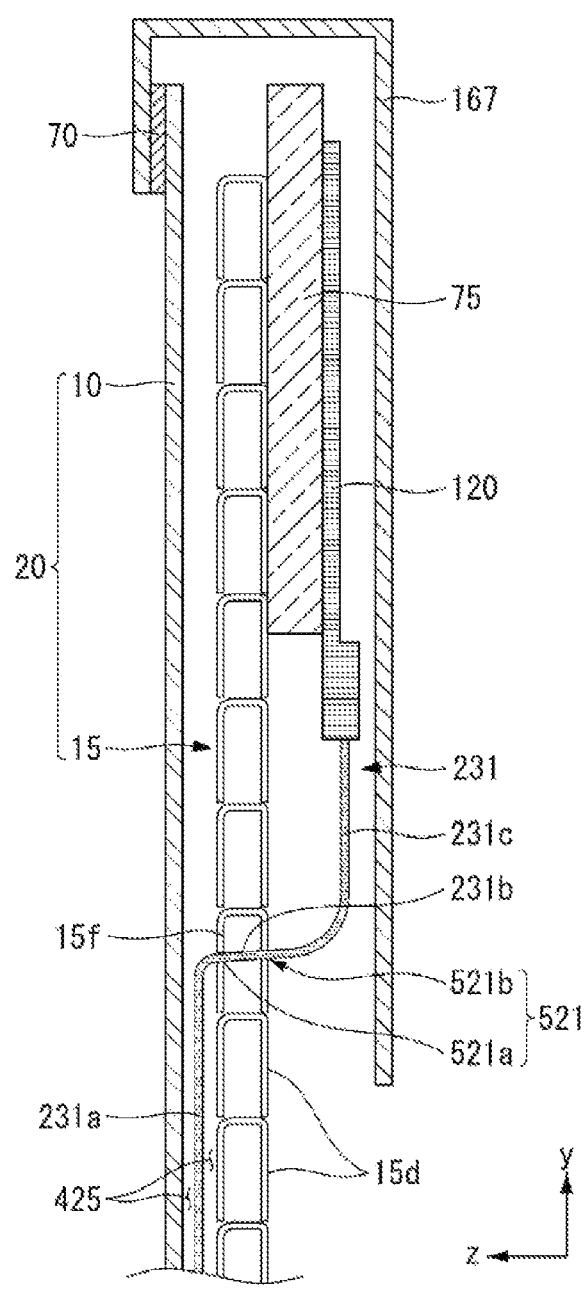

Referring to FIG. 28, in the display device according to the present disclosure, the top case 167 can shield the source PCB 120 and the upper bar 75 as well as the display panel 10 and the module cover 15. Accordingly, the source PCB 120 is not exposed to the outside and thus the exterior of the display device can become neat.

One side of the upper bar 75 may be combined with the rear side of the module cover 15 and the other side thereof may be combined with the source PCB 120. The upper bar 75 may be fixed to the module cover 15 to support the source PCB 120.

Figure 29:
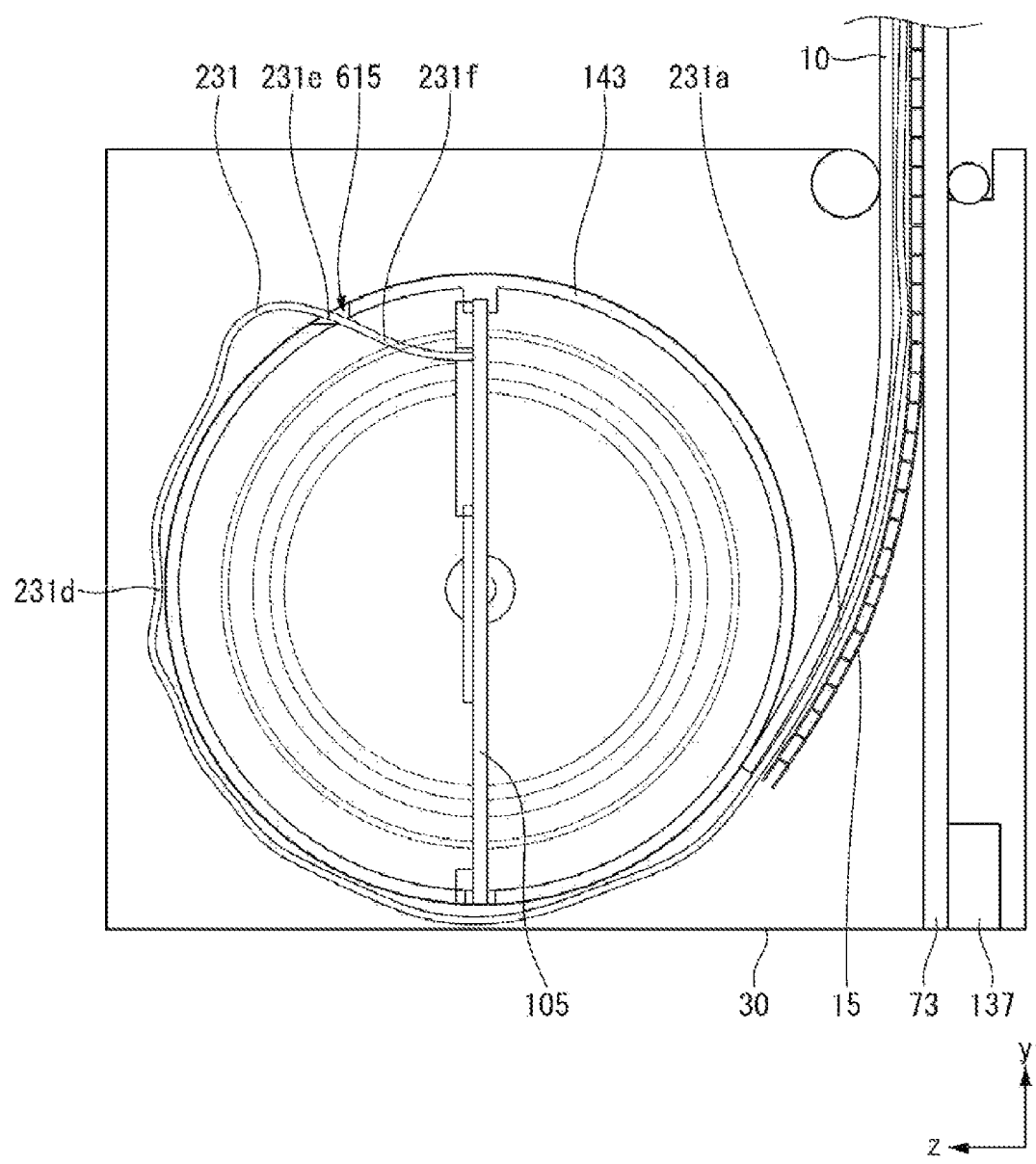

The lower end of the FFC cable 231 can be connected to the timing controller board (106 in FIG. 29) in the panel roller (143 in FIG. 29). The FFC cable 231 can be wound around the panel roller 143 or unwound therefrom along with the display 20.

A portion of the FFC cable 231 may be positioned between the display panel 10 and the module cover 15. The portion of the FFC cable 231 positioned between the display panel 10 and the module cover 15 may be referred to as a first portion 231*a*. The first portion 231*a* may be positioned in a recess 425 formed by a plurality of segments 15*d*. Alternatively, the first portion 231*a* may be accommodated in the recess 425 formed by the plurality of segments 15*d*.

A portion of the FFC cable 231 may penetrate a segment 15*f*. The portion of the FFC cable 231 penetrating the segment 15*f* may be referred to as a second portion 231*b*. The segment 15*f* may include a first hole 521*a* formed in the front side thereof and a second hole 521*b* formed in the rear side thereof. The first hole 521*a* and the second hole 521*b* can be connected to each other to form a single hole 521. The hole 521 can penetrate the segment 15*f* in the third direction. The second portion 231*b* can penetrate the hole 521. The hole 521 may also be referred to as a connection hole 521.

The upper end of the FFC cable 231 can be electrically connected to the source PCB 120. A portion of the FFC cable 231 may be positioned behind the module cover 15. The portion of the FFC cable 231 positioned behind the module cover 15 may be referred to as a third portion 231*c*. The third portion 231*c* can be electrically connected to the source PCB 120.

The third portion 231*c* can be shielded by the top case 167. Accordingly, the third portion 231*c* is not exposed to the outside.

Referring to FIG. 29, in the display device according to the present disclosure, the FFC cable 231 can be connected to the timing controller board 105 mounted in the panel roller 143. A through-hole 615 may be positioned on the panel roller 143 and the FFC cable 231 can be connected to the timing controller board 105 through the through-hole 615.

The through-hole 615 is positioned on one side of the panel roller 143 and can penetrate the outer circumference of the panel roller 143. The FFC cable 231 can be connected to one side of the timing controller board 105 through the through-hole 615.

In the display device according to the present disclosure, connection between the FFC cable 231 and the timing controller board 105 can be maintained using the through-hole 615 even if the FFC cable 231 is positioned on the outer circumference of the panel roller 143. Accordingly, the FFC cable 231 can rotate along with the panel roller 143 and thus may not be twisted.

A portion of the FFC cable 231 may be wound around the panel roller 143. The portion of the FFC cable 231 wound around the panel roller 143 may be referred to as a fourth portion 231*d*. The fourth portion 231*d* can contact the outer circumference of the panel roller 143.

A portion of the FFC cable 231 can penetrate the through-hole 615. The portion of the FFC cable 231 penetrating the through-hole 615 may be referred to as a fifth portion 231*e*.

The lower end of the FFC cable 231 can be electrically connected to the timing controller board 105. A portion of the FFC cable 231 may be positioned inside the panel roller 143. the portion of the FFC cable 231 positioned inside the panel roller 143 may be referred to as a sixth portion 231*f*. The sixth portion 231*f* can be electrically connected to the timing controller board 105.

Figure 30:
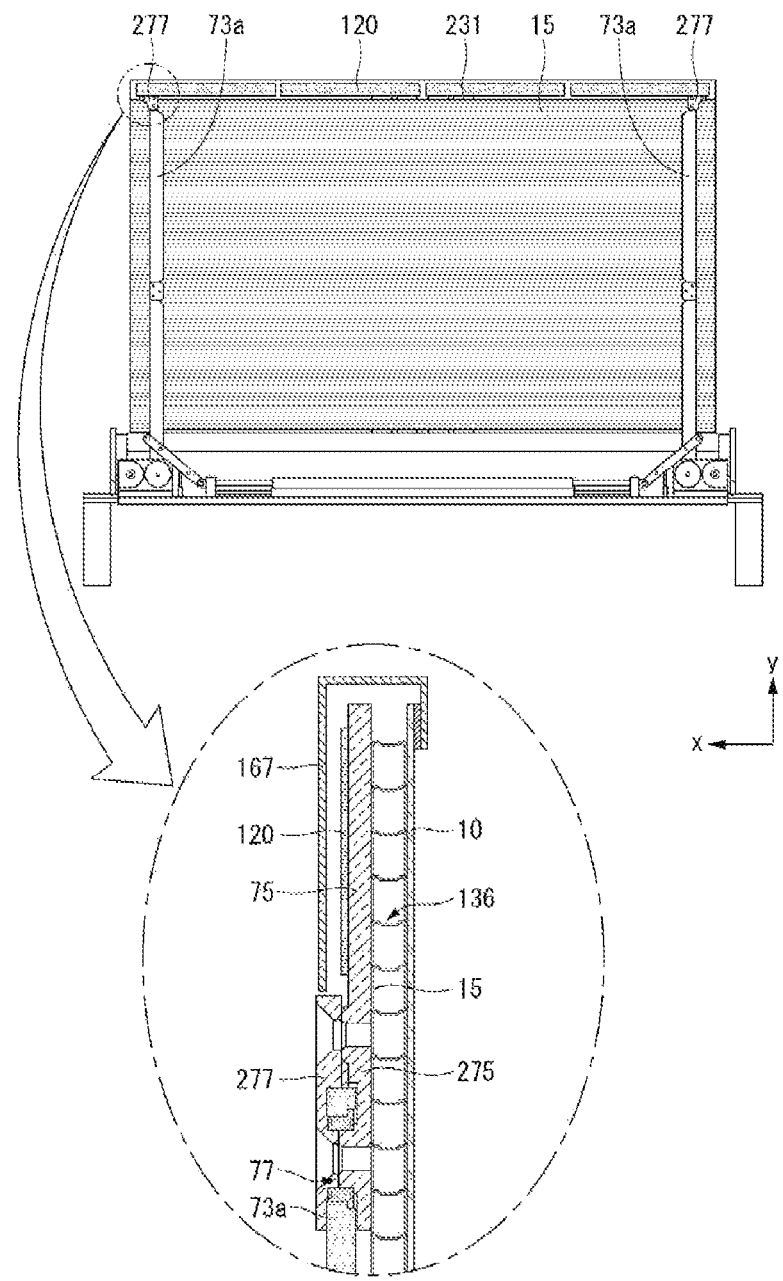
FIGS. 30 to 34 are diagrams showing a display device according to another embodiment of the present disclosure.

Referring to FIG. 30, the first arm 73*a* can be connected to both ends of the upper bar 75. The first arm 73*a* can be rotatably connected to a link bracket 277 through a combination hole 77 formed in the first arm 73*a*. The link bracket 277 can be combined with a connector 275 of the upper bar 75. The link bracket 277 can be separated from the top case 167 downward (−y-axis direction). The link bracket 277 can combine the first arm 73*a* with the connector 275 through at least one screw.

The module cover 15, the source PCB 120 and a first link 73*a* can be combined with the upper bar 75 to realize a compact display device.

Figure 31A:
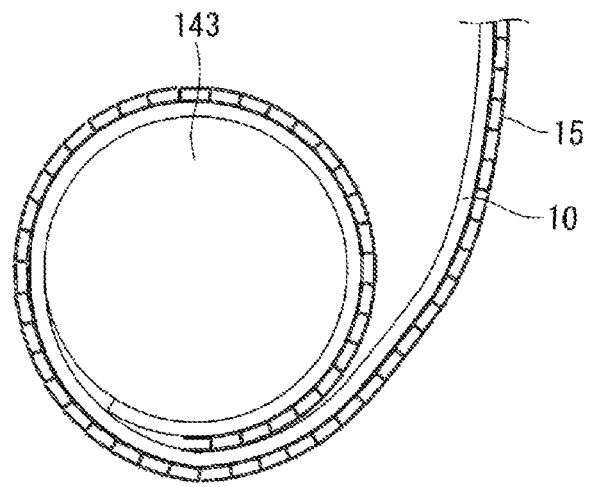
Figure 31B:
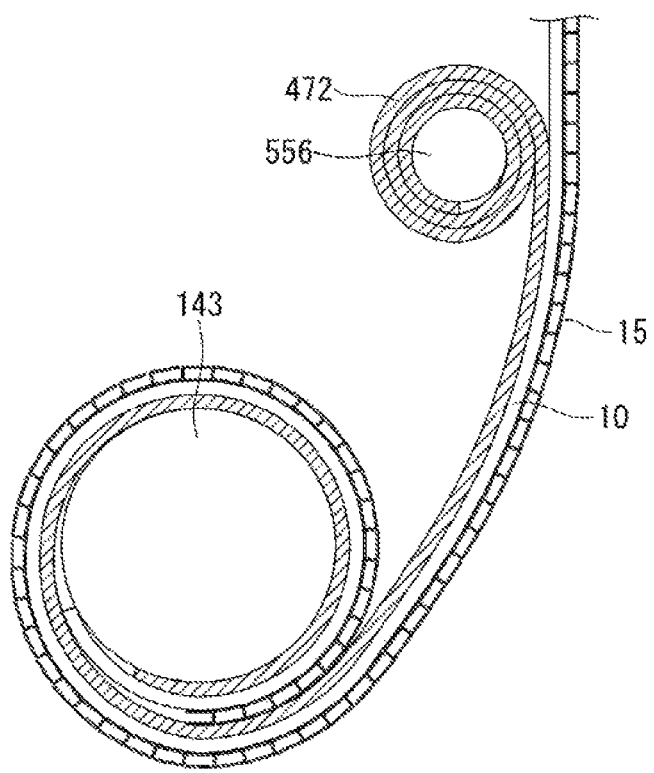

Referring to FIGS. 31A and 31B, an auxiliary roller 556 may be separated from the panel roller 143. The auxiliary roller 556 may be connected to a protection sheet 472. One end of the protection sheet 472 can be connected to the auxiliary roller 556 and the other end thereof can be connected to the display panel 10. The auxiliary roller 556 can wind or unwind the protection sheet 472. The protection sheet 472 may include non-woven fabric.

The auxiliary roller 556 may be positioned in proximity to the winding portion of the panel roller 143. The auxiliary roller 556 can rotate in a direction opposite the rotation direction of the panel roller 143. That is, the auxiliary roller 556 can wind the protection sheet 472 when the panel roller 143 unwinds the display panel 10. In addition, the auxiliary roller 556 can unwind the protection sheet4 472 when the panel roller 143 winds the display panel 10.

Referring to FIG. 31A, when the protection sheet 472 is not provided, friction may occur between the module cover 15 and the display panel 10 as the panel roller 143 winds the module cover 15 and the display panel 10. The display panel 10 may be damaged due to friction between the display panel 10 and the module cover 15.

Referring to FIG. 31B, the display panel 10, the module cover 15 and the protection sheet 472 can be wound around the panel roller 143 or unwound therefrom simultaneously. When the display panel 10, the module cover 15 and the protection sheet 472 are wound around the panel roller 154, the protection sheet 472 can be positioned between the module cover 15 and the display panel 10. The projection sheet 472 can prevent friction between the module cover 15 and the display panel 10. The protection sheet 472 can prevent the display panel 10 from being damaged by preventing friction between the module cover 15 and the display panel 10.

Figure 32:
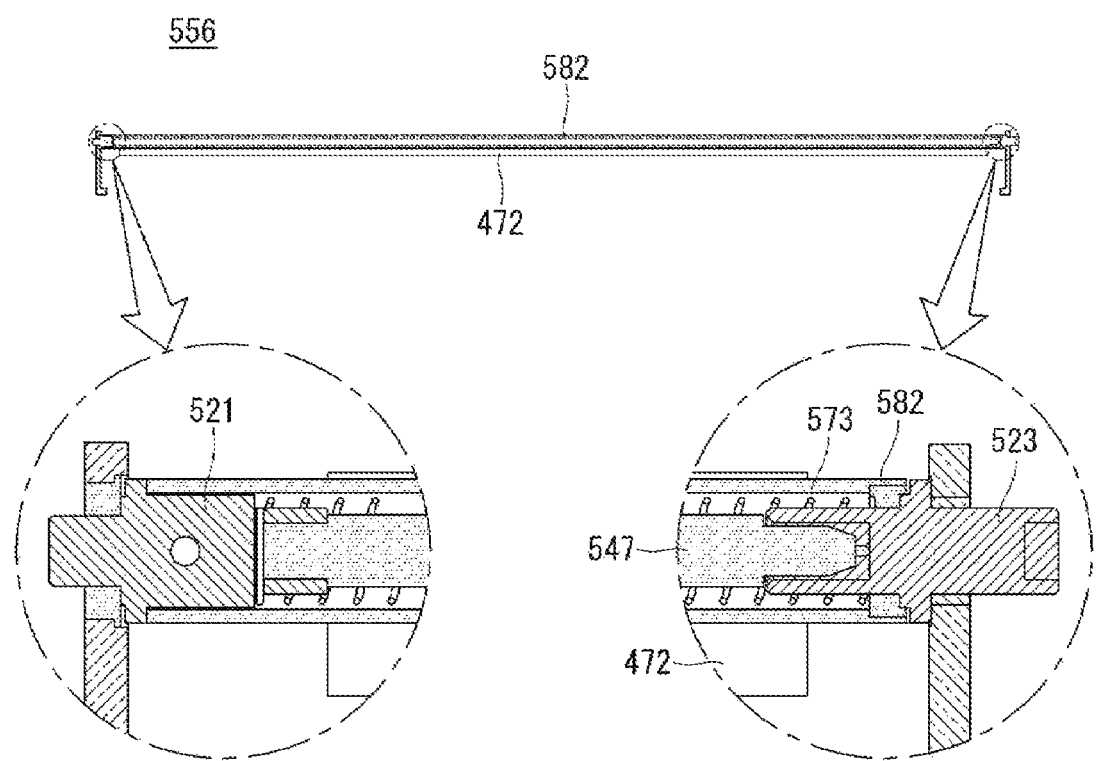

Referring to FIG. 32, the auxiliary roller 556 may include a fixed cap 521, a rotary cap 523, a shaft 547, a coil spring 573 and a roller cover 582.

The coil spring 573 may be disposed inside the auxiliary roller 556. The longitudinal direction of the coil spring 573 may be parallel to the longitudinal direction of the auxiliary roller 556.

The fixed cap 521 may be positioned at one end of the auxiliary roller 556. The fixed cap 521 can be combined with one end of the coil spring 573. The fixed cap 521 can be fixed irrelevant to rotation of the roller cover 582. The fixed cap 521 may not rotate.

The rotary cap 523 may be disposed at the other end of the auxiliary roller 556. The rotary cap 523 may be combined with the other end of the coil spring 573. The rotary cap 523 can rotate along with the roller cover 582 when the roller cover 582 rotates.

When the roller cover 582 rotates, the fixed cap 521 on one side of the roller cover 582 does not rotate, the rotary cap 523 can rotate along with the roller cover 582 and the coil spring 573 can be elastically deformed. The coil spring 573 can store energy while being elastically deformed and apply a restoring force to the rotary cap 523. The restoring force of the coil spring 573 can act in a direction opposite the rotation direction of the rotary capo 523.

Accordingly, as the protection sheet 472 is unwound from the auxiliary roller 556, a force of rewinding the protection sheet 472 around the auxiliary roller 556 can act on the auxiliary roller 556. That is, when the display panel is unwound from the panel roller, the protection sheet 472 can be wound around the auxiliary roller 556.

In addition, as the protection sheet 472 is wound around the auxiliary roller 556, a force of unwinding the protection sheet 472 from the auxiliary roller 556 can act on the auxiliary roller 556. That is, when the display panel is wound around the panel roller, the protection sheet 472 can be unwound from the auxiliary roller 556.

The shaft 547 may be a central axis of the auxiliary roller 556. The shaft 547 can be connected to the fixed cap 521. The coil spring 573 can be combined with the shaft 547. The shaft 547 can support the coil spring 573 such that the coil spring 573 can be stably positioned inside the auxiliary roller 556.

The roller cover 582 can form the appearance of the auxiliary roller 556. The roller cover 582 can accommodate the fixed cap 521, the rotary cap 523, the shaft 547 and the coil spring 573. The roller cover 582 can be connected to one end of the protection sheet 472. That is, the protection sheet 472 can be wound around the roller cover 582.

Figure 33:
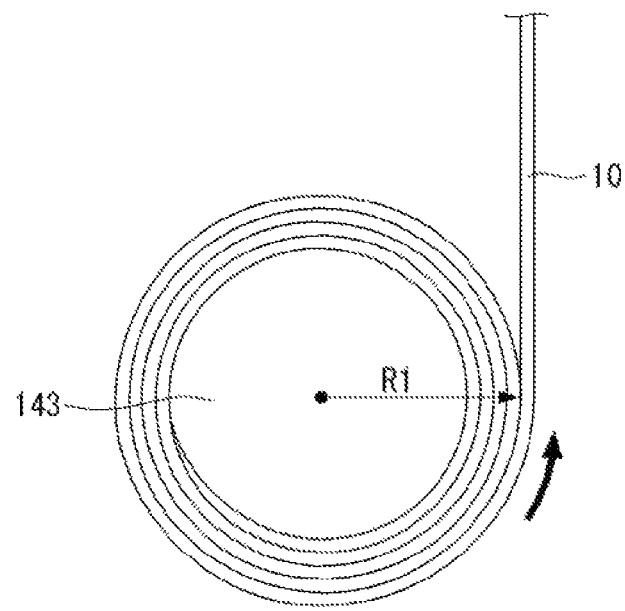
Figure 33:
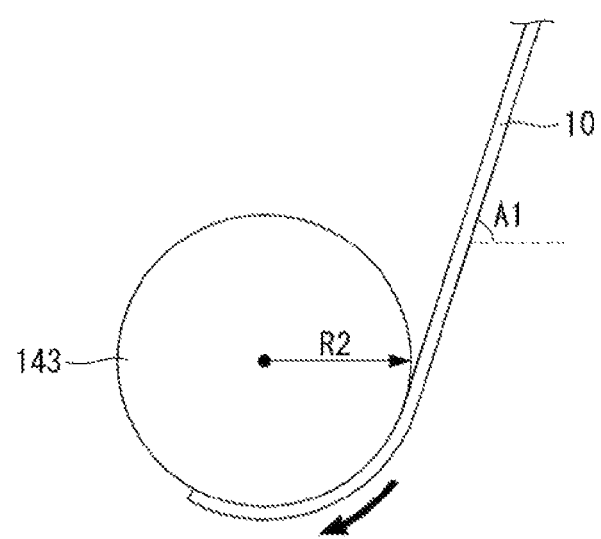

Referring to FIG. 33, a diameter formed by the panel roller 143 and the display panel 10 wound around the panel roller 143 may be referred to as R1. R1 may vary according to a degree to which the display panel 10 is wound around the panel roller 143. The diameter of the panel roller 143 may be referred to as R2.

The panel roller 143 can be fixed inside the housing (30 in FIG. 7). In addition, the entrance (30a in FIG. 7) of the housing through which the display panel passes can be fixed. Accordingly, an angle formed between the display panel 10 unwound from the panel roller 143 in the housing and the base (31 in FIG. 10A) can vary according to R1.

When the display panel 10 has been sufficiently unwound from the panel roller 143, a diameter formed by the panel roller 143 and the display panel 10 wound around the panel roller 143 may be R2 that is the diameter of the panel roller 143. Here, the display panel 10 can tilt at an angle A1 with respect to the base. When the display panel 10 tilts with respect to the base, the display panel 10 may unstably move upward or downward.

Figure 34:
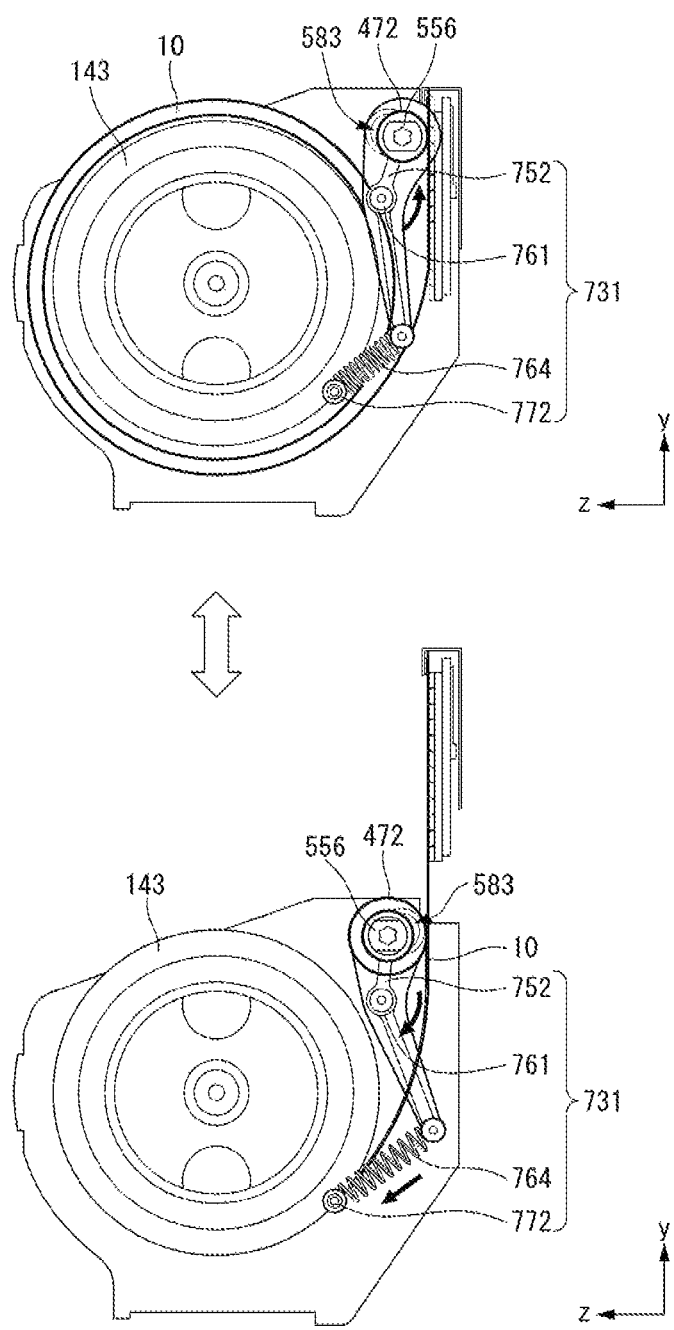

Referring to FIG. 34, a guide assembly 731 can be combined with the auxiliary roller 556.

The auxiliary roller 556 can prevent the display panel 10 from tilting with respect to the base (31 in FIG. 10A). The auxiliary roller 556 can stably guide the display panel 10 unwound from the panel roller 143. However, a diameter formed by the auxiliary roller 556 and the protection sheet 472 wound around the auxiliary roller 556 may vary according to a degree to which the protection sheet 472 is wound around the auxiliary roller 556.

The guide assembly 731 can be combined with the auxiliary roller 556 to adjust the position of the auxiliary roller 556 in response to a degree to which the protection sheet 472 is wound around the auxiliary roller 556. Accordingly, the auxiliary roller 556 can stably guide the display panel 10 unwound from the panel roller 143 even if the diameter formed by the auxiliary roller 556 and the protection sheet wound around the auxiliary roller 556 varies.

The guide assembly 731 may include a guide arm 752, a pin bolt 761, a tensile spring 764 and a supporter 772. One end of the guide arm 752 can be connected to the auxiliary roller 556 and the other end thereof can be connected to the tensile spring 764. The guide arm 752 can rotate on the pin bolt 761. The pin bolt 761 can be fixed to the housing. The auxiliary roller 556 can be connected to the guide arm 752 and rotate on the pin bolt 761.

One end of the tensile spring 764 can be connected to the guide arm 762 and the other end thereof can be connected to the supporter 772. The supporter 772 can be fixed to the housing.

When the display panel 10 is unwound from the panel roller 143, the protection sheets 472 can be wound around the auxiliary roller 556 and the diameter formed by the auxiliary roller 556 and the protection sheet 472 wound around the auxiliary roller 556 can increase. In addition, the auxiliary roller 556 can rotate on the pin bolt 761 counterclockwise. Here, the tensile spring 764 can apply a force to the guide arm 752 such that the guide arm 752 rotates clockwise. The tensile spring 764 can prevent the auxiliary roller 556 from excessively rotating on the pin bolt 761 counterclockwise.

When the display panel 10 is wound around the panel roller 143, the protection sheet 472 can be unwound from the auxiliary roller 556 and the diameter formed by the auxiliary roller 556 and the protection sheet wound around the auxiliary roller 556 can decrease. In addition, the auxiliary roller 556 can rotate on the pin bolt 761 clockwise.

Here, the tensile spring 764 can prevent the auxiliary roller 556 from rotating on the pin bolt 761 counterclockwise.

Hereinafter, description will be given focusing on configurations and operations different from those of the above-described embodiment and description of components identical or similar to those of the above-described embodiment will be omitted in order to avoid redundant description.

Figure 35:
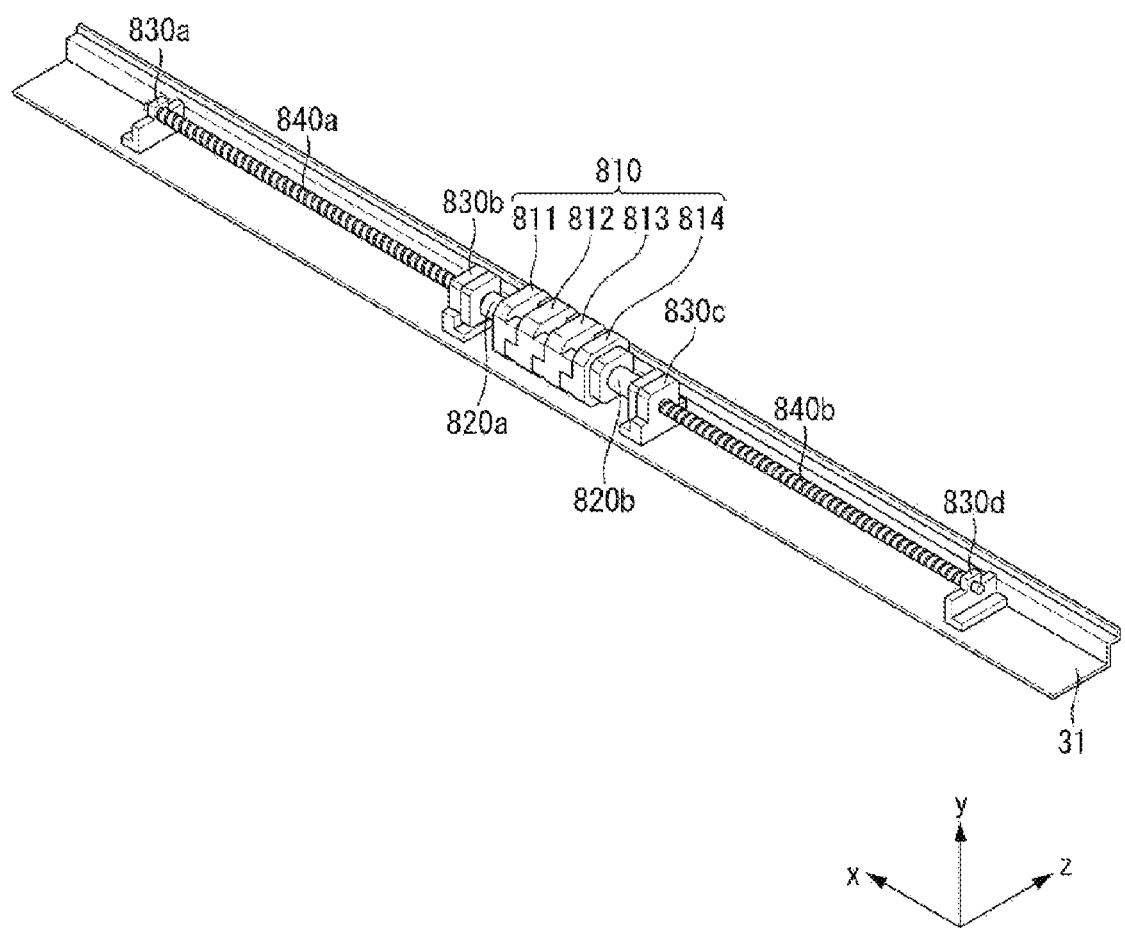
FIGS. 35 to 64 are diagrams showing a display device according to another embodiment of the present disclosure.

Referring to FIG. 35, a motor assembly 810 may be installed on the base 31. The base 31 may be the bottom side of the housing (30 in FIG. 19). A drive shaft of the motor assembly 810 may be formed on both sides thereof. The right drive shaft and the left drive shaft of the motor assembly 810 may rotate in the same direction. Alternatively, the right drive shaft and the left drive shaft of the motor assembly 810 may rotate in opposite directions.

The motor assembly 810 may include a plurality of motors. The plurality of motors may be connected in series. The plurality of motors may be sequentially disposed in the order of a first motor 811, a second motor 812, a third motor 813 and a fourth motor 814 from the right to the left. The right drive shaft of the motor assembly 810 may be formed in the first motor 811. The left drive shaft of the motor assembly 810 may be formed in the fourth motor 814. Since the plurality of motors are connected in series, the motor assembly 810 can output a high torque.

The motor assembly 810 can be connected to lead screws 840*a* and 840*b*. the lead screws 840*a* and 840*b* may include a right lead screw 840*a* connected to the right side of the motor assembly 810 and a left lead screw 840*b* connected to the left side of the motor assembly 810. The right lead screw 840*a* may also be referred to as a first lead screw 840*a*. The left lead screw 840*b* may also be referred to as a second lead screw 840*b*.

The right drive shaft of the motor assembly 810 can be connected to the right lead screw 840*a*. The right drive shaft of the motor assembly 810 can be connected to the right lead screw 840*a* through a right coupling 820*a*. The drive shaft of the first motor 811 can be connected to the right lead screw 840*a*. The drive shaft of the first motor 811 can be connected to the right lead screw 840*a* through the right coupling 820*a*. The right drive shaft may also be referred to as a first drive shaft. The left drive shaft may also be referred to as a second drive shaft.

The left drive shaft of the motor assembly 810 can be connected to the left lead screw 840*b*. The left drive shaft of the motor assembly 810 can be connected to the left lead screw 840*b* through a left coupling 820*b*. The drive shaft of the fourth motor 814 can be connected to the left lead screw 840*b*. The drive shaft of the fourth motor 814 can be connected to the left lead screw 840*b* through the left coupling 820*b*.

The couplings 820*a* and 820*b* may include the right coupling 820*a* which connects the right drive shaft of the motor assembly 810 to the right lead screw 840*a* and the left coupling 820*b* which connects the left drive shaft of the motor assembly 810 to the left lead screw 840*b*.

The lead screws 840*a* and 840*b* may have screw threads formed thereon in the longitudinal direction. The direction of screw threads formed on the right lead screw 840*a* may be opposite to the direction of screw threads formed on the left lead screw 840*b*. Alternatively, the direction of the screw threads formed on the right lead screw 840*a* may be the same as the direction of the screw threads formed on the left lead screw 840*b*.

Bearings 830*a*, 830*b*, 830*c* and 830*d* may be installed on the base 31. The bearings 830*a*, 830*b*, 830*c* and 830*d* may be formed in the longitudinal direction of the base 31. The bearings 830*a*, 830*b*, 830*c* and 830*d* may include right bearings 830*a*, 830*b*, 830*c* and 830*d* disposed on the right side of the motor assembly 810 and left bearings 830*a*, 830*b*, 830*c* and 830*d* disposed on the left side of the motor assembly 810.

The bearings 830*a*, 830*b*, 830*c* and 830*d* can support the lead screws 840*a* and 840*b*. The lead screws 840*a* and 840*b* can be connected to the drive shaft of the motor assembly 810 and rotate. The bearings 830*a*, 830*b*, 830*c* and 830*d* can support the lead screws 840*a* and 840*b* without obstructing rotation of the lead screws 840*a* and 840*b*.

The right bearings 830*a*, 830*b*, 830*c* and 830*d* can support the right lead screw 840*a*. The right bearings 830*a*, 830*b*, 830*c* and 830*d* may include a first right bearing 830*a* supporting the right side of the right lead screw 840*a* and a second right bearing 830*b* supporting the left side of the right lead screw 840*a*. The first right bearing 830*a* may also be referred to as a first bearing 830*a*. The second right bearing 830*b* may also be referred to as a second bearing 830*b*.

The left bearings 830*a*, 830*b*, 830*c* and 830*d* can support the left lead screw 840*b*. The left bearings 830*a*, 830*b*, 830*c* and 830*d* may include a first left bearing 830*c* supporting the right side of the left lead screw 840*b* and a second left bearing 830*d* supporting the left side of the left lead screw 840*b*.

The bearings 830*a*, 830*b*, 830*c* and 830*d*, the couplings 820*a* and 820*b* and the motor assembly 810 may be sequentially arranged in the order of the first right bearing 830*a*, the second right bearing 830*b*, the right coupling 820*a*, the motor assembly 810, the left coupling 820*b*, the first left bearing 830*c* and the second left bearing 830*d* from the right side to the left side.

Figure 36:
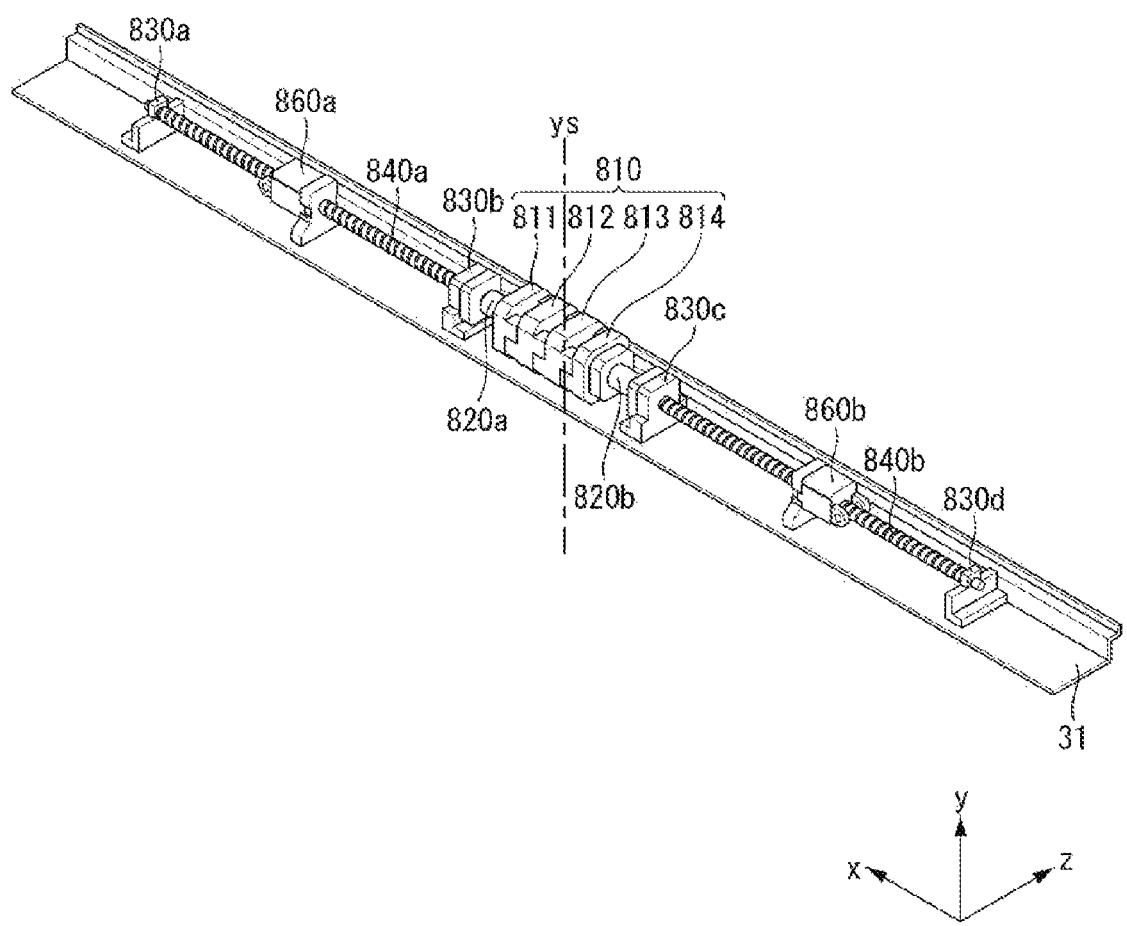
Figure 37:
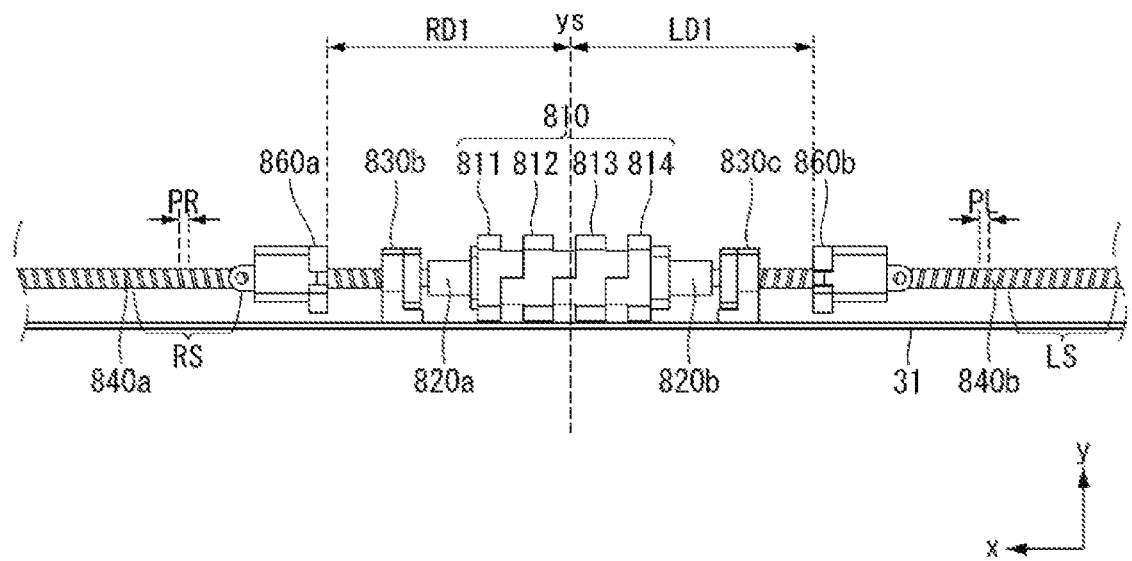

Referring to FIGS. 36 and 37, the display device may further include sliders 860*a* and 860*b*. The sliders 860*a* and 860*b* can be combined with the lead screws 840*a* and 840*b*, and the lead screws 840*a* and 840*b* can be disposed to penetrate the sliders 860*a* and 860*b*. A plurality of sliders 860*a* and 860*b* may be provided. The sliders 860*a* and 860*b* may include a right slider 860*a* combined with the right lead screw 840*a* and a left slider 860*b* combined with the left lead screw 840*b*. The right slider 860*a* may also be referred to as a first slider 860*a*. The left slider 860*b* may also be referred to as a second slider 860*b*.

Figure 43:
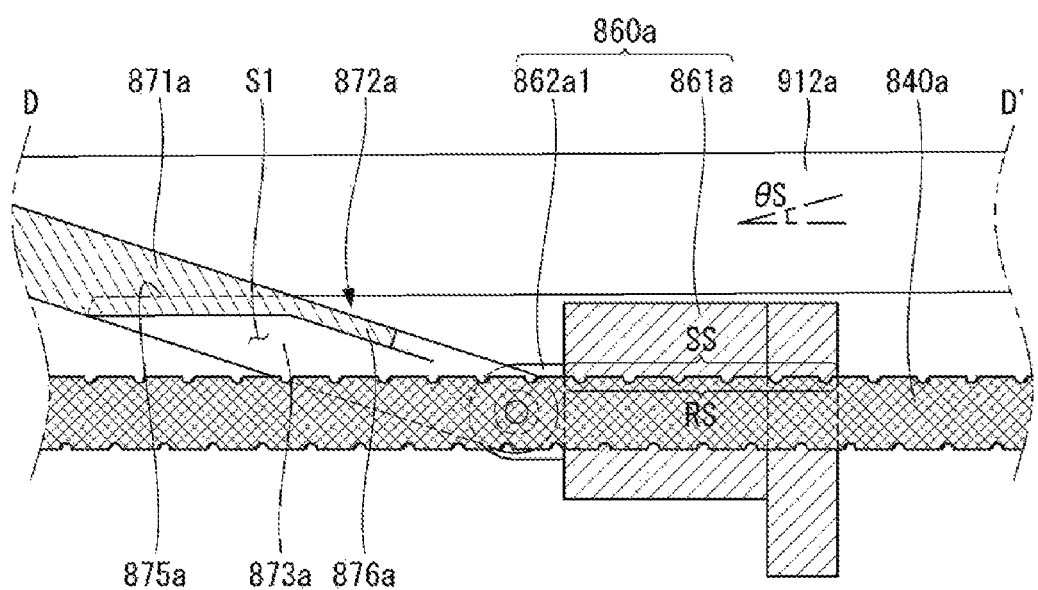
Figure 44A:
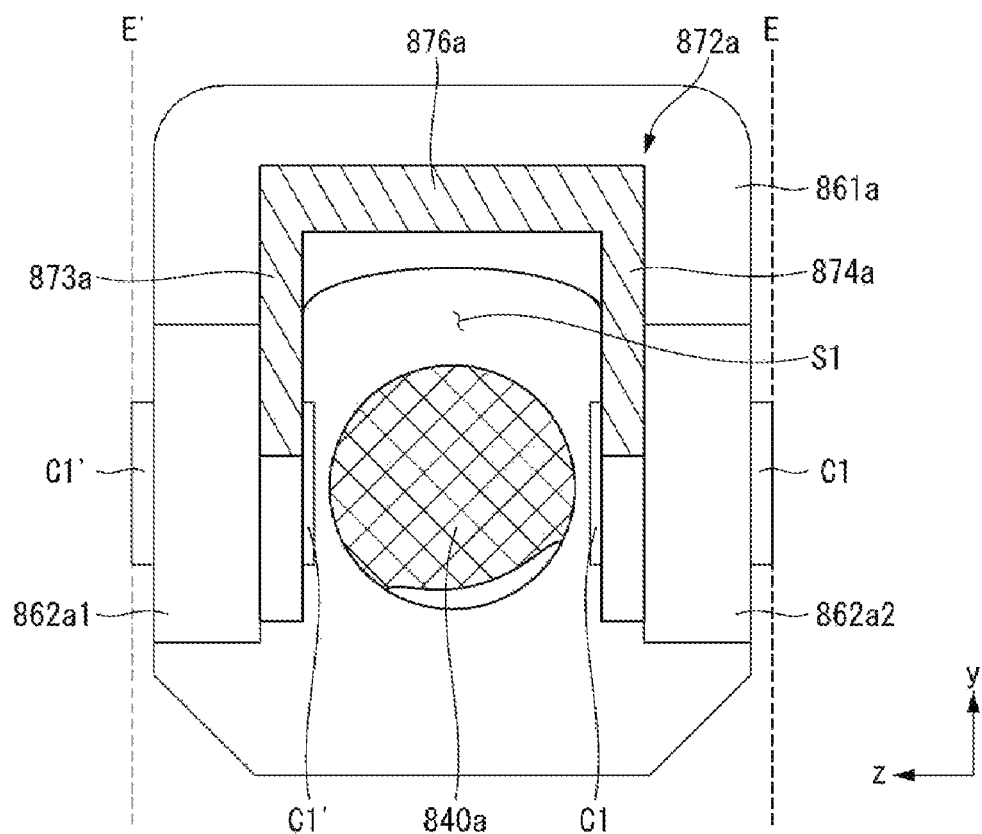
Figure 44B:
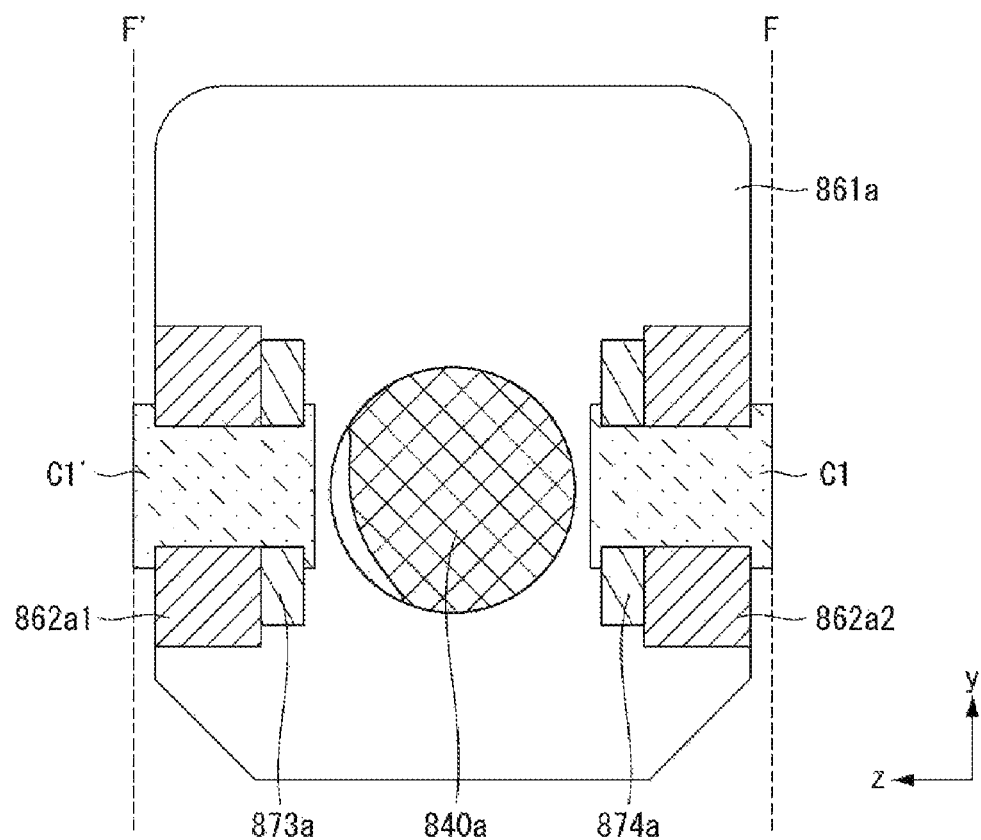

The sliders 860*a* and 860*b* may have screw threads (SS in FIG. 43) formed on the inner circumference thereof. The screw threads SS formed on the inner circumference of the sliders 860*a* and 860*b* can engage with the screw threads RS and LS formed on the lead screws 840*a* and 840*b*. The sliders 860*a* and 860*b* can move forward or backward in the longitudinal direction of the lead screws 840*a* and 840*b* according to rotation of the lead screws 840*a* and 840*b*.

The right slider 860*a* can engage with the right lead screw 840*a*. The right slider 860*a* can move forward or backward between the first right bearing 830*a* and the second right bearing 830*b* according to rotation of the right lead screw 840*a*.

The left slider 860*b* can engage with the left lead screw 840*b*. The left slider 860*b* can move forward or backward between the first left bearing 830*c* and the second left bearing 830*d* according to rotation of the left lead screw 840*b*.

The right slider 860*a* can be separated from an axis of symmetry ys of the motor assembly 810 by a distance RD1. The left slider 860*b* can be separated from the axis of symmetry of the motor assembly 810 by a distance LD1. The distance RD1 may be the same as the distance LD1. That is, the right slider 860a and the left slider 860b can be symmetrical on the basis of the axis of symmetry of the motor assembly 810.

The motor assembly 810 may cause the rotation direction of the right drive shaft of the motor assembly 810 to be the same as the rotation direction of the left drive shaft. The direction of screw threads RS of the right lead screw 840a may be opposite to the direction of screw threads LS of the left lead screw 840b. Accordingly, when the right slider 860a moves in the +x-axis direction according to rotation of the right drive shaft, the left slider 860b can move in the −x-axis direction according to rotation of the left drive shaft. Further, when the right slider 860a moves in the −x-axis direction according to rotation of the right drive shaft, the left slider 860b can move in the +x-axis direction according to rotation of the left drive shaft.

Figure 38:
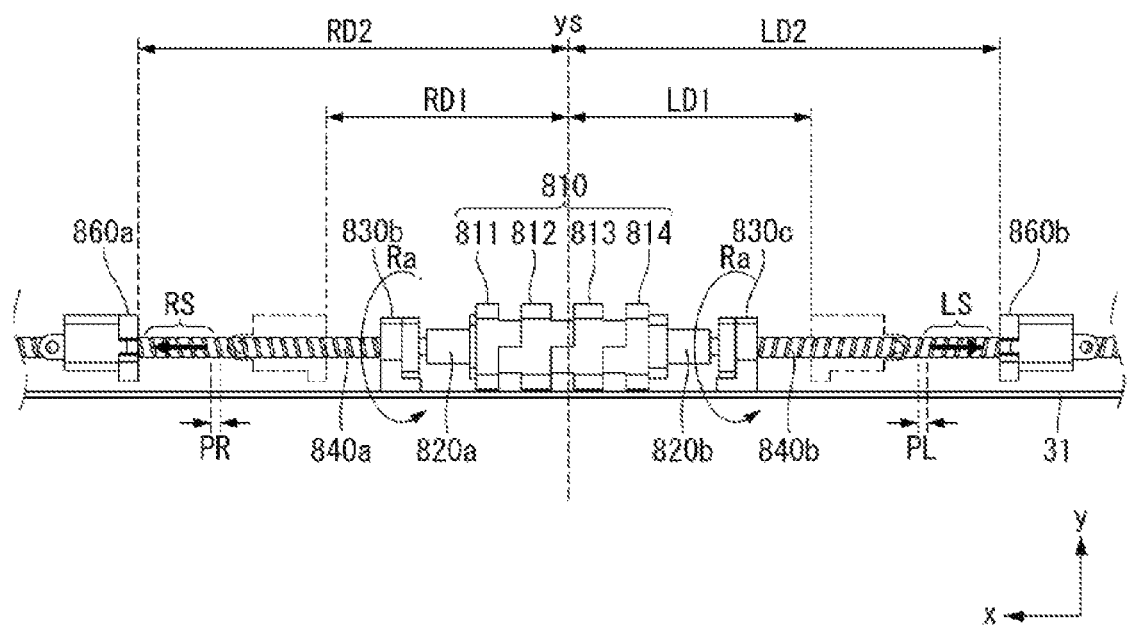

Referring to FIG. 38, the direction of the screw threads RS of the right lead screw 840a may be opposite to the direction of the screw threads LS of the left lead screw 840b. The right lead screw 840a may have a pitch PL and the left lead screw 840b may have a pitch PR. The pitch PL of the right lead screw 840a and the pitch PR of the left lead screw 840b may be formed in the same length.

The motor assembly 810 may output the same power of the right drive shaft and the left drive shaft. The rotation direction Ra of the right drive shaft may be the same as the rotation direction Ra of the left drive shaft. Further, the number of rotation per unit time of the right drive shaft may be the same as the number of rotation per unit time of the left drive shaft. In addition, a torque of the right drive shaft and a torque of the left drive shaft may have the same direction. Further, the torque of the right drive shaft and the torque of the left drive shaft may have the same magnitude.

The right slider 860a can move in the +x-axis direction according to rotation of the right drive shaft at a position separated from the axis of symmetry ys of the motor assembly 810 by a distance RD1. When the right drive shaft rotates n times, the right slider 860a can be separated from the axis of symmetry ys of the motor assembly 810 by a distance LD2. Here, a difference of (the number of rotation n)*(the pitch PL of the right slider 860a) can be generated between the distance RD1 and the distance LD2.

The left slider 860b can move in the −x-axis direction according to rotation of the left drive shaft at a position separated from the axis of symmetry ys of the motor assembly 810 by a distance LD1. When the left drive shaft rotates n times, the left slider 860b can be separated from the axis of symmetry ys of the motor assembly 810 by a distance RD2. Here, a difference of (the number of rotation n)*(the pitch PR of the left slider 860b) can be generated between the distance LD1 and the distance RD2.

That is, when the pitch PL of the right slider 860a is the same as the pitch PR of the left slider 860b, displacement of the right slider 860a and the displacement of the left slider 860b may have the same magnitude and opposite directions.

In addition, when initial positions of the right slider 860a and the left slider 860b are symmetrical on the basis of the axis of symmetry ys of the motor assembly 810, the right slider 860a and the left slider 860b can become far away from each other while maintaining symmetry on the basis of the axis of symmetry ys of the motor assembly 810.

Figure 39:
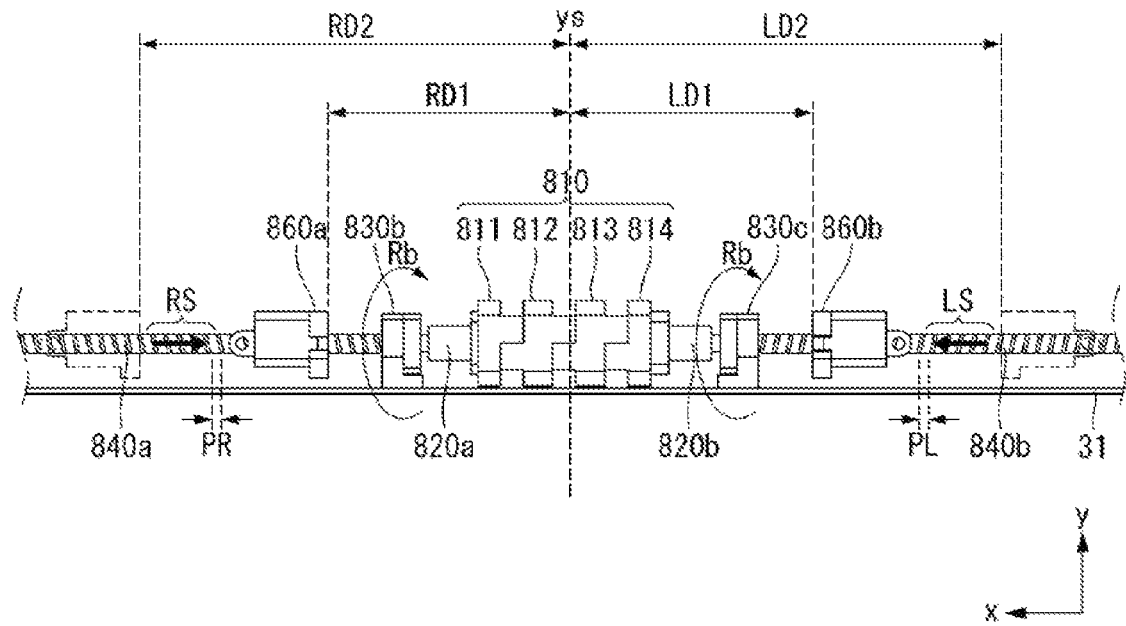

Referring to FIG. 39, the right slider 860a can move in the −x-axis direction according to rotation of the right drive shaft at a position separated from the axis of symmetry ys of the motor assembly 810 by a distance LD1. The rotation direction Rb of the right drive shaft may be the same as the rotation direction Lb of the left drive shaft. When the right drive shat rotates n times, the right slider 860a can be separated from the axis of symmetry ys of the motor assembly 810 by a distance RD1. Here, a difference of (the number of rotation n)*(the pitch PL of the right slider 860a) can be generated between the distance RD1 and the distance LD2.

The left slider 860b can move in the +x-axis direction according to rotation of the left drive shaft at a position separated from the axis of symmetry ys of the motor assembly 810 by a distance RD2. When the left drive shaft rotates n times, the left slider 860b can be separated from the axis of symmetry ys of the motor assembly 810 by a distance LD1. Here, a difference of (the number of rotation n)*(the pitch PR of the left slider 860b) can be generated between the distance LD1 and the distance RD2.

That is, when the pitch PL of the right slider 860a is the same as the pitch PR of the left slider 860b, displacement of the right slider 860a and displacement of the left slider 860b may have the same magnitude and opposite directions.

In addition, when the initial positions of the right slider 860a and the left slider 860b are symmetrical on the basis of the axis of symmetry ys of the motor assembly 810, the right slider 860a and the left slider 860b can approach each other while maintaining symmetry on the basis of the axis of symmetry ys of the motor assembly 810.

Figure 40:
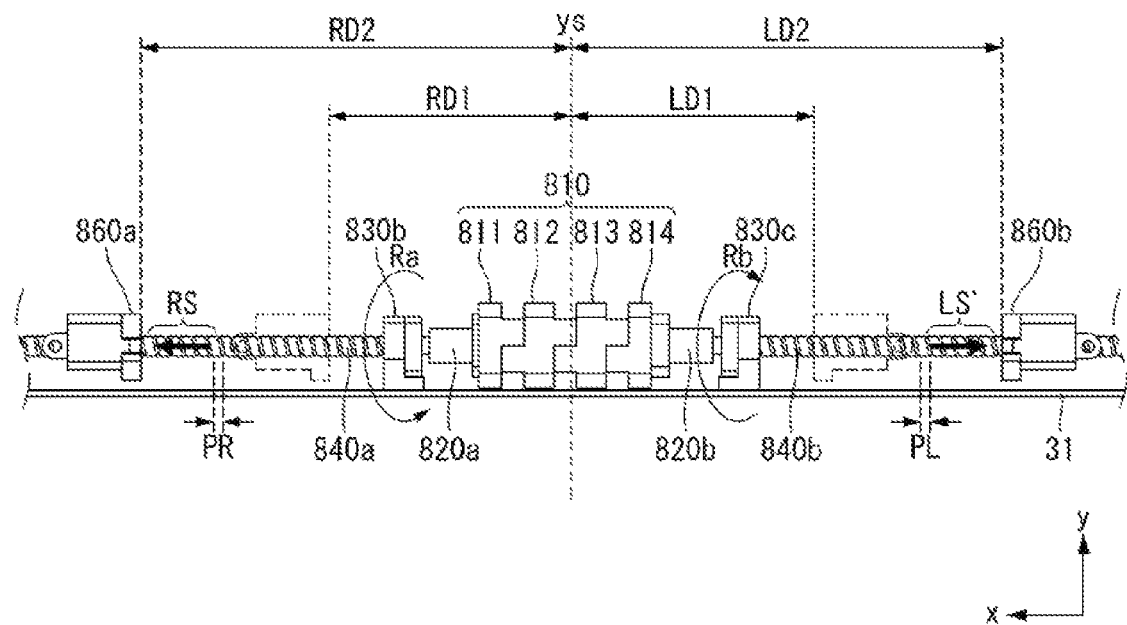

Referring to FIG. 40, the motor assembly 810 may cause the rotation direction Ra of the right drive shaft of the motor assembly 810 to be opposite to the rotation direction Rb of the left drive shaft. The direction of the screw threads RS of the right lead screw 840a may be the same as the direction of the screw threads LS' of the left lead screw 840b. Accordingly, when the right slider 860a moves in the +x-axis direction according to rotation of the right drive shaft, the left slider 860b can move in the −x-axis direction according to rotation of the left drive shaft. Further, when the right slider 860a moves in the −x-axis direction according to rotation of the right drive shaft, the left slider 860b can move in the +x-axis direction according to rotation of the left drive shaft.

The right lead screw 840a may have a pitch PL and the left lead screw 840b may have a pitch PR. The pitch PL of the right lead screw 840a and the pitch PR of the left lead screw 840b may be formed in the same length.

The motor assembly 810 may output the same power of the right drive shaft and the left drive shaft. The rotation direction of the right drive shaft may be opposite to the rotation direction of the left drive shaft. Further, the number of rotation per unit time of the right drive shaft may be the same as the number of rotation per unit time of the left drive shaft. In addition, a torque of the right drive shaft and a torque of the left drive shaft may have opposite directions. Further, the torque of the right drive shaft and the torque of the left drive shaft may have the same magnitude.

The right slider 860a can move in the +x-axis direction according to rotation of the right drive shaft at a position separated from the axis of symmetry ys of the motor assembly 810 by a distance RD1. When the right drive shaft rotates n times, the right slider 860a can be separated from the axis of symmetry ys of the motor assembly 810 by a distance LD2. Here, a difference of (the number of rotation n)*(the pitch PL of the right slider 860a) can be generated between the distance RD1 and the distance LD2.

The left slider 860b can move in the −x-axis direction according to rotation of the left drive shaft at a position separated from the axis of symmetry ys of the motor assembly 810 by a distance LD1. When the left drive shaft rotates n times, the left slider 860*b* can be separated from the axis of symmetry ys of the motor assembly 810 by a distance RD2. Here, a difference of (the number of rotation n)*(the pitch PR of the left slider 860*b*) can be generated between the distance LD1 and the distance RD2.

That is, when the pitch PL of the right slider 860*a* is the same as the pitch PR of the left slider 860*b*, displacement of the right slider 860*a* and the displacement of the left slider 860*b* may have the same magnitude and opposite directions.

In addition, when the initial positions of the right slider 860*a* and the left slider 860*b* are symmetrical on the basis of the axis of symmetry ys of the motor assembly 810, the right slider 860*a* and the left slider 860*b* can become far away from each other while maintaining symmetry on the basis of the axis of symmetry ys of the motor assembly 810.

Figure 41:
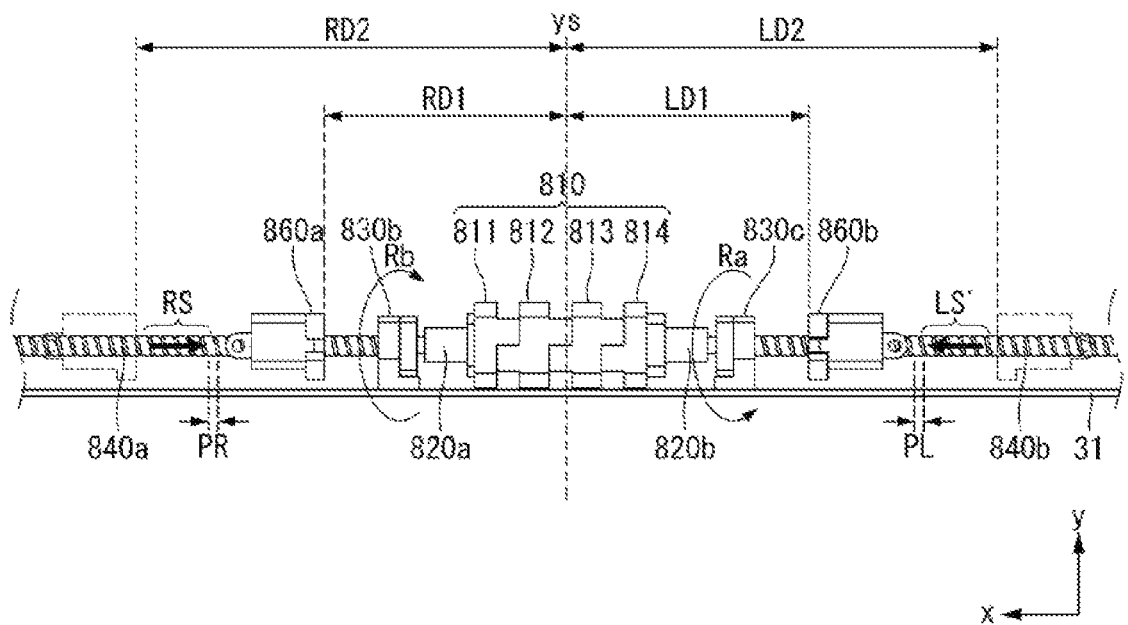
Figure 42:
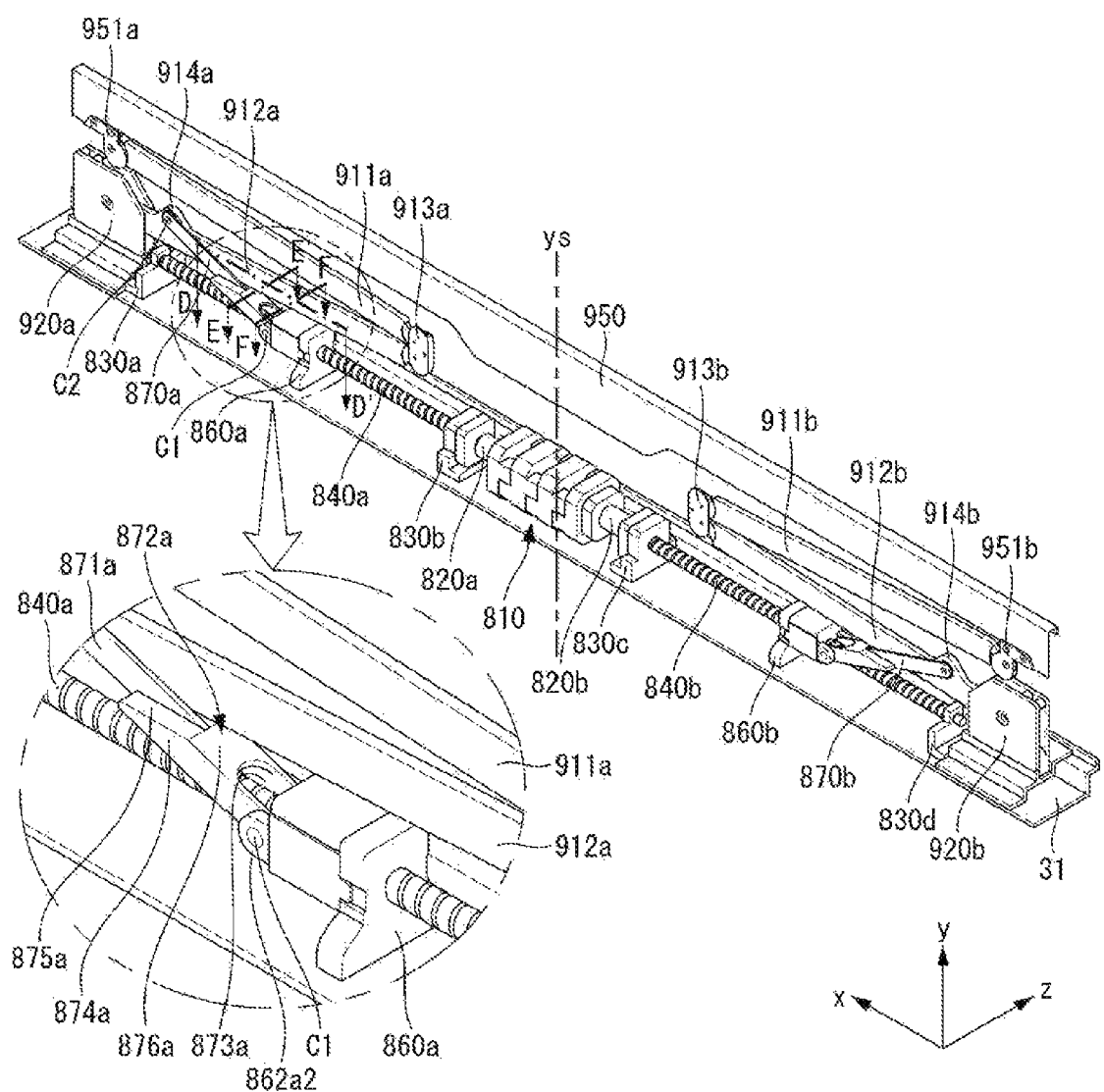

Referring to FIG. 41, the motor assembly 810 may cause the rotation direction Ra of the right drive shaft of the motor assembly 810 to be opposite to the rotation direction Rb of the left drive shaft. The right slider 860*a* can move in the −x-axis direction according to rotation of the right drive shaft at a position separated from the axis of symmetry ys of the motor assembly 810 by a distance LD2. When the right drive shaft rotates n times, the right slider 860*a* can be separated from the axis of symmetry ys of the motor assembly 810 by a distance RD1. Here, a difference of (the number of rotation n)*(the pitch PL of the right slider 860*a*) can be generated between the distance RD1 and the distance LD2.

The left slider 860*b* can move in the +x-axis direction according to rotation of the left drive shaft at a position separated from the axis of symmetry ys of the motor assembly 810 by a distance RD2. When the left drive shaft rotates n times, the left slider 860*b* can be separated from the axis of symmetry ys of the motor assembly 810 by a distance LD1. Here, a difference of (the number of rotation n)*(the pitch PR of the left slider 860*b*) can be generated between the distance LD1 and the distance RD2.

That is, when the pitch PL of the right slider 860*a* is the same as the pitch PR of the left slider 860*b*, displacement of the right slider 860*a* and the displacement of the left slider 860*b* may have the same magnitude and opposite directions.

In addition, when the initial positions of the right slider 860*a* and the left slider 860*b* are symmetrical on the basis of the axis of symmetry ys of the motor assembly 810, the right slider 860*a* and the left slider 860*b* can approach each other while maintaining symmetry on the basis of the axis of symmetry ys of the motor assembly 810.

Referring to FIGS. 42 to 44B, link mounts 920*a* and 920*b* may be installed on the base 31. The link mounts 920*a* and 920*b* may include a right link mount 920*a* separated from the first right bearing 830*a* to the right and a left link mount 920*b* separated from the second left bearing 830*d* to the left.

Links 910*a* and 910*b* can be connected to the link mounts 920*a* and 920*b*. The links 910*a* and 910*b* may include a right link 910*a* connected to the right link mount 920*a* and a left link 910*b* connected to the left link mount 920*b*.

The right link 910*a* may also be referred to as a first link. The left link 910*b* may also be referred to as a second link. The right link mount 920*a* may also be referred to as a first link mount 920*a*. The left link mount 920*b* may also be referred to as a second link mount 920*b*.

The links 910*a* and 910*b* may include first arms 911*a* and 911*b*, second arms 912*a* an d912*b* and arm joints 913*a* and 913*b*. One side of the second arms 912*a* and 912*b* can be rotatably connected to the link mounts 920*a* and 920*b*. The other side of the second arms 912*a* and 912*b* can be rotatably connected to the arm joints 913*a* and 913*b*. One side of the first arms 911*a* and 911*b* can be rotatably connected to the arm joints 913*a* and 913*b*. The other side of the first arms 911*a* and 911*b* can be rotatably connected to link brackets 951*a* and 951*b*.

The link brackets 951*a* and 951*b* may include a right link bracket 951*a* connected to the first arm 911*a* of the right link 910*a* and a left link bracket 951*b* connected to the first arm 911*b* of the left link 910*b*. The link brackets 951*a* and 951*b* can be connected to an upper bar 950.

The upper bar 950 can connect the right link bracket 951*a* to the left link bracket 951*b*.

Rods 870*a* and 870*b* can connect the sliders 860*a* and 860*b* to the links 910*a* and 910*b*. One side of the rods 870*a* and 870*b* can be rotatably connected to the sliders 860*a* and 860*b*. The other side of the rods 870*a* and 870*b* can be rotatably connected to the second arms 912*a* and 912*b*. The rods 870*a* and 870*b* may include a right rod 870*a* for connecting the right slider 860*a* to the second arm 912*a* of the right link 910*a* and a left rod 870*b* for connecting the left slider 860*b* to the second arm 912*b* of the left link 910*b*. The right rod 870*a* may also be referred to as a first rod 870*a*. The left rod 870*b* may also be referred to as a second rod 870*b*.

Specifically, a structure formed by the right lead screw 840*a*, the right slider 860*a*, the right rod 870*a* and the right link 910*a* will be described. The right slider 860*a* may include a body 861*a* and a rod mount 862*a*. The body 861*a* may have screw threads SS formed on the inner circumference thereof. The screw threads formed on the body 861*a* may engage with screw threads RS of the right lead screw 840*a*. The right lead screw 840*a* can penetrate the body 861*a*.

The rod mount 862*a* may be formed on the right side of the body 861*a*. The rod mount 862*a* can be rotatably connected to one side of the right rod 870*a*. The rod mount 862*a* may include a first rod mount 862*a*1 and a second rod mount 862*a*2. The first rod mount 862*a*1 may be disposed in front of the right lead screw 840*a*. The second rod mount 862*a*2 may be disposed behind the right lead screw 840*a*. The first rod mount 862*a*1 and the second rod mount 862*a*2 can be separated from each other. The second rod mount 862*a*2 can be separated from the first rod mount 862*a*1 in the −z-axis direction. The right lead screw 840*a* may be positioned between the first rod mount 862*a*1 and the second rod mount 862*a*2.

The rod mount 862*a* can be rotatably connected to one side of the rod 870*a* through a connection member C1. The connection member C1 can penetrate the rod mount 862*a* and the right rod 870*a*.

The right rod 870*a* can be rotatably connected to the second arm 912*a* through a connection member C2. The connection member C2 can penetrate the second arm 912*a* and the right rod 870*a*.

The right rod 870*a* may include a transmission part 871*a* connected to the second arm 912*a* of the right link 910*a* and a cover 872*a* connected to the rod mount 862*a* of the right slider 860*a*. The transmission part 871*a* can transmit a force generated when the right slider 860*a* moves forward and backward along the right lead screw 840*a* to the right link 910*a*.

The cover 872*a* may include a first plate 873*a* disposed in front of the right lead screw 840*a*. The first plate 873*a* may be disposed to be perpendicular to the base 31. The first plate 873*a* can face the right lead screw 840*a*.

The cover 872*a* may include a second plate 874*a* disposed behind the right lead screw 840*a*. The second plate 874*a* may be disposed to be perpendicular to the base 31. The second plate 874*a* can face the right lead screw 840*a*.

Further, the second plate 874a can be separated from the first plate 873a. The right lead screw 840a can be positioned between the first plate 873a and the second plate 874a.

The cover 872a may include a third plate 875a which connects the first plate 873a and the second plate 874a. The third plate 875a can be connected to the transmission part. The third plate 875a can be positioned on the right lead screw 840a.

The cover 872a may include a fourth plate 876a which connects the first plate 873a and the second plate 874a. The fourth plate 876a can be connected to the third plate 875a. The fourth plate 876a can be positioned on the right lead screw 840a.

One side of the first plate 873a can be connected to the first rod mount 862a1. The first plate 873a may be connected to the first rod mount 862a1 through a connection member C1'. The other side of the first plate 873a can be connected to the third plate 875a.

One side of the second plate 874a can be connected to the second rod mount 862a2. The second plate 874a may be connected to the second rod mount 862a2 through a connection member C1. The other side of the second plate 874a can be connected to the third plate 875a.

When the right slider 860a moves to be close to the motor assembly 810, the right lead screw 840a and the right rod 870a can contact each other. When the right lead screw 840a and the right rod 870a contact each other, interference may occur therebetween and movement of the right slider 860a may be limited.

The cover 872a can provide a space S1 inside thereof. The first plate 873a, the second plate 874a, the third plate 875a and the fourth plate 876a can form the space S1. When the right slider 860a moves to be close to the motor assembly 810, the right lead screw 840a can be accommodated in or escape to the space S1 provided by the cover 872a. The right slider 860a can move closely to the motor assembly 810 due to the space S1 provided by the cover 872a as compared to a case in which the cover 872a is not provided. That is, the cover 872a can widen the operation range of the right slider 860a by providing the space S1 inside thereof. In addition, the size of the housing (30 in FIG. 2) can be reduced since the right lead screw 840a is accommodated in the cover 872a.

Furthermore, the cover 872a can limit a minimum value of an angle θS between the second arm 912a and the base 31. The third plate 875a of the cover 872a can contact the second arm 912a and support the second arm 912a when θS sufficiently decreases. The third plate 875a can limit the minimum value of θS and prevent the second arm 912a from loosening by supporting the second arm 912a. That is, the cover 872a can serve as a stopper for preventing the second arm 912a from loosening. In addition, the third plate 875a can reduce an initial load for causing the second arm 912a to stand by limiting the minimum value of θS.

The lead screws 840a and 840b can be driven by the single motor assembly 810. The second arms 912a and 912b can stand while maintaining symmetry as the lead screws 840a and 840b are driven by the single motor assembly 810. However, when the single motor assembly 810 drives the lead screws 840a and 840b, a load applied to the motor assembly 810 to cause the second arms 912a and 912b to stand may excessively increase. Here, the third plate 875a can reduce the load applied to the motor assembly 810 to cause the second arms 912a and 912b to stand by limiting the minimum value of θS.

The structure formed by the left lead screw 840b, the left slider 860b, the left rod 870b and the left link 910b can be symmetrical to the above-described structure formed by the right lead screw 840a, the right slider 860a, the right rod 870a and the right link 910a. Here, the axis of symmetry may be the axis of symmetry ys of the motor assembly 810.

Figure 45:
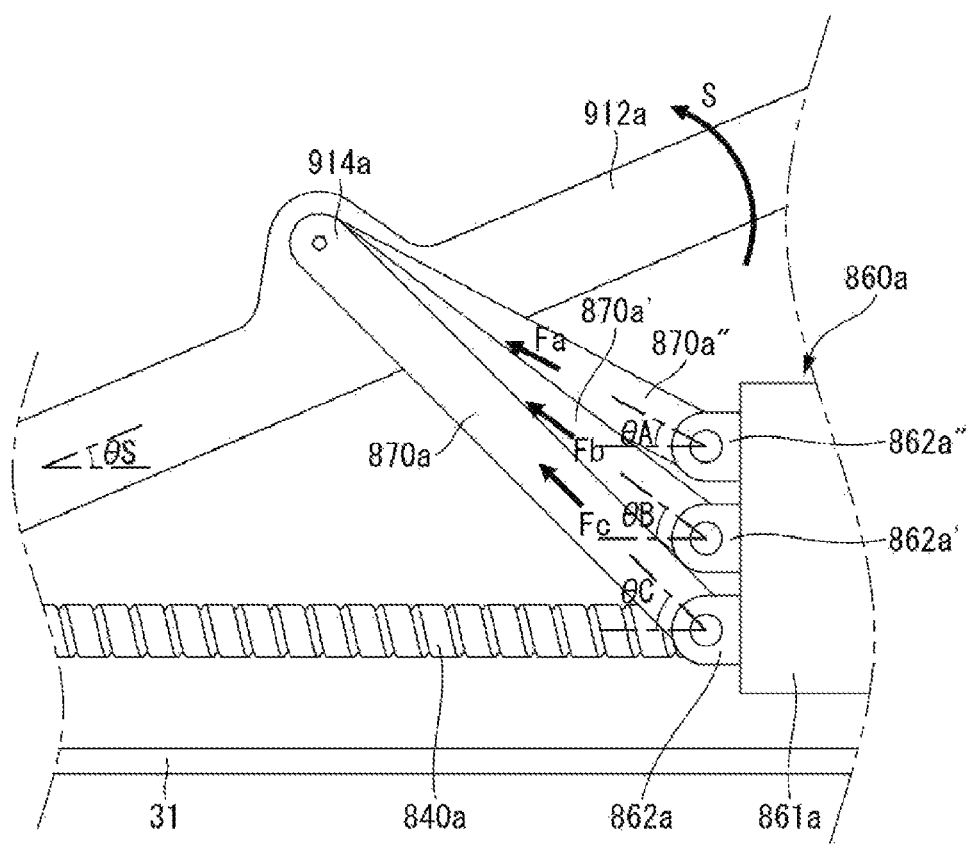
Figure 46:
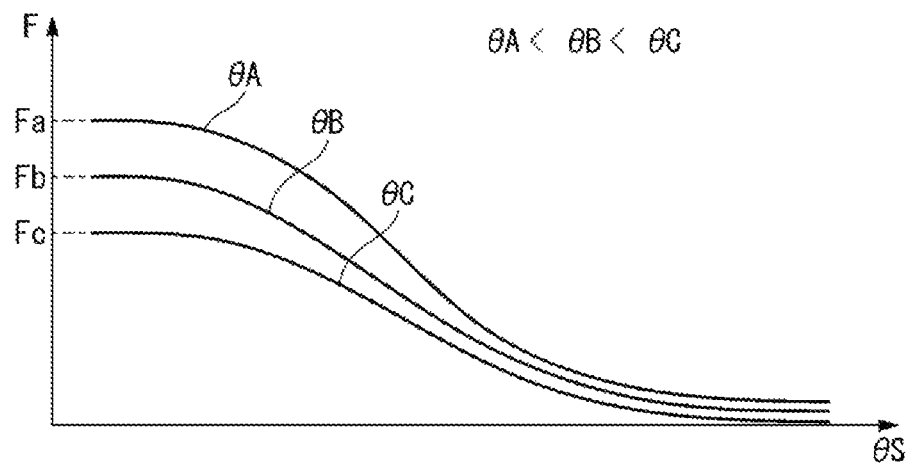

Referring to FIGS. 45 and 46, the right rod 870a is connected to a protrusion 914a. The protrusion 914a may also be referred to as a connector 914a.

The angle between the right rod 870a and the base 31 may vary according to the position of the connector. The angle between the second arm 912a and the base 31 may be referred to as the angle θS. When the right slider 860a is closest to the motor assembly 810 within the operation range thereof, the second arm 912a can be regarded as being in a state in which it lies with respect to the base 31. When the second arm 912a lies with respect to the base 31, the angle θS can have a minimum value. For example, when the second arm 912a lies with respect to the base 31, the angle θS can have a value close to 0 degrees.

When the right slider 860a moves in the +x-axis direction, the angle θS can gradually increase. When the right slider 860a moves in the +x-axis direction, the second arm 912a can be regarded as standing with respect to the base 31. When the angle θS gradually increases, the second arm 912a can be regarded as standing with respect to the base 31.

When the right slider 860a is farthest from the motor assembly 810 within the operation range thereof, the second arm 912a can be regarded as being in a state in which it stands with respect to the base 31. When the second arm 912a stands with respect to the base 31, the angle θS can have a maximum value. For example, when the second arm 912a stands with respect to the base 31, the second arm 912a can be positioned to be perpendicular to the base 31. Further, when the second arm 912a stands with respect to the base 31, the angle between the second arm 912a and the base 31 can have a value close to 90 degrees.

A direction in which the angle (angle θS) between the second arm 912a of the right link 910a and the base 31 increases may be referred to as a standing direction S. Further, a direction in which the angle between the second arm 912a of the left link 910b and the base 31 increases may be referred to as the standing direction S.

When a rod mount 862a" is positioned on the upper side of the body 861a, an angle between the right rod 870a" and the base 31 may be referred to as θA and a minimum force by which the right rod 870a" causes the second arm 912a to stand may be referred to as Fa.

When the rod mount 862a' is positioned at a middle height of the body 861a, an angle between the right rod 870a' and the base 31 may be referred to as θB and a minimum force by which the right rod 870a' causes the second arm 912a to stand may be referred to as Fb.

When the rod mount 862a is positioned on the lower side of the body 861a, an angle between the right rod 870a and the base 31 may be referred to as θC and a minimum force by which the right rod 870a causes the second arm 912a to stand may be referred to as Fc.

Here, the relationship of θA<θB<θC can be established for the same angle θS. In addition, the relationship of Fc<Fb<Fa can be established for the same angle θS.

That is, if the angle between the second arm 912a and the base 31 is fixed, the force required to cause the second arm 912a to stand can decrease as the angle between the right rot 870a and the base 31 increases.

The cover (872a in FIG. 43) of the right rod 870a provides the space (S1 in FIG. 43) in which the right lead screw 840a can be accommodated such that the rod mound 862a can be connected close to the lower side of the body 861a or the right lead screw 840a.

The lead screws 840a and 840b can be driven by the single motor assembly 810. The second arms 912a and 912b can stand while maintaining symmetry as the lead screws 840a and 840b are driven by the single motor assembly 810. However, when the single motor assembly 810 drives the lead screws 840a and 840b, a load applied to the motor assembly 810 to cause the second arms 912a and 912b to stand may excessively increase. Here, it is possible to reduce the load applied to the motor assembly 810 to cause the second arm 912a to stand by increasing the angle between the right rod 870a and the base 41.

The structure formed by the left lead screw 840b, the left slider 860b, the left rod 870b and the second arm 912b can be symmetrical to the above-described structure formed by the right lead screw 840a, the right slider 860a, the right rod 870a and the second arm 912a. Here, the axis of symmetry may be the axis of symmetry ys of the motor assembly 810.

Figure 47:
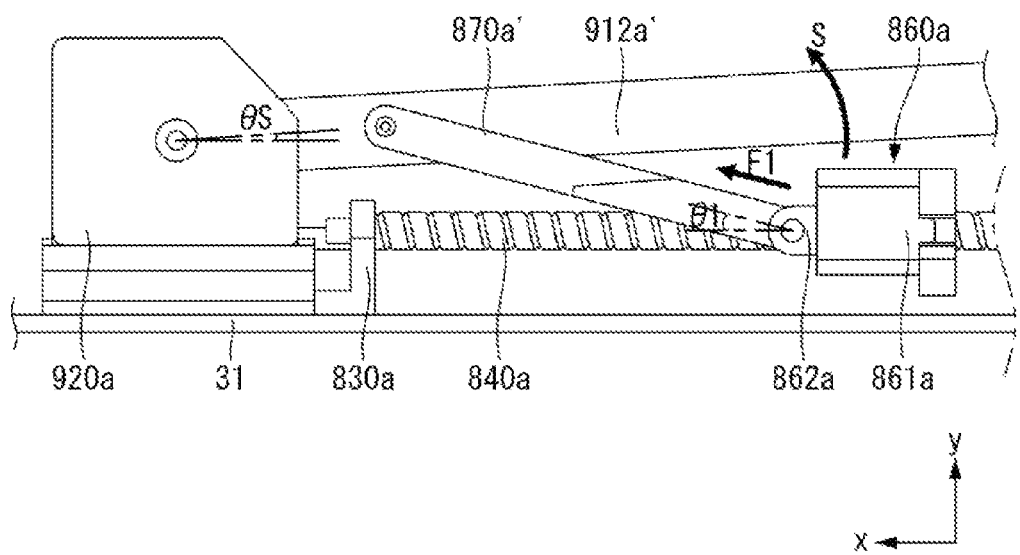
Figure 48:
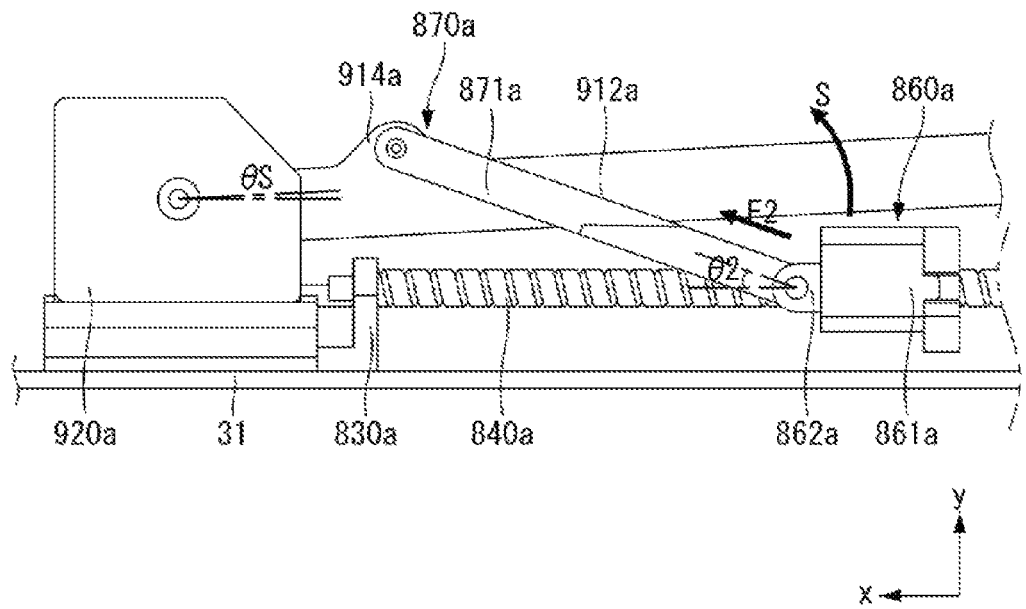
Figure 49:
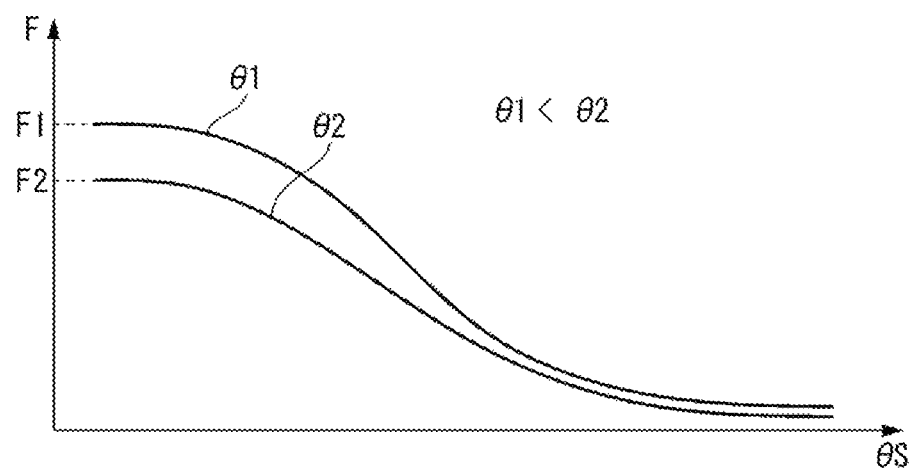

Referring to FIGS. 47 to 49, the second arm 912a may include a bar 915a and the protrusion 914a. FIG. 47 shows that the right rod 870a is connected to the bar 915a and FIG. 48 shows that the right rod 870a is connected to the protrusion 914a. The protrusion 914a may also be referred to as a connector 914a.

The angle between the second arm 912a and the base 31 may be referred to as θS. When the right slider 860a is closest to the motor assembly 810 within the operation range thereof, the second arm 912a can be regarded as being in a state in which it lies with respect to the base 31. When the second arm 912a lies with respect to the base 31, the angle θS can have a minimum value. For example, when the second arm 912a lies with respect to the base 31, the angle θS can have a value close to 0 degrees.

When the right slider 860a moves in the +x-axis direction, the angle θS can gradually increase. When the right slider 860a moves in the +x-axis direction, the second arm 912a can be regarded as standing with respect to the base 31. When the angle θS gradually increases, the second arm 912a can be regarded as standing with respect to the base 31.

When the right slider 860a is farthest from the motor assembly 810 within the operation range thereof, the second arm 912a can be regarded as being in a state in which it stands with respect to the base 31. When the second arm 912a stands with respect to the base 31, the angle θS can have a maximum value. For example, when the second arm 912a stands with respect to the base 31, the second arm 912a can be positioned to be perpendicular to the base 31. Further, when the second arm 912a stands with respect to the base 31, the angle between the second arm 912a and the base 31 can have a value close to 90 degrees.

A direction in which the angle (angle θS) between the second arm 912a of the right link 910a and the base 31 increases may be referred to as a standing direction S. Further, a direction in which the angle between the second arm 912a of the left link 910b and the base 31 increases may be referred to as the standing direction S.

Referring to FIG. 47, the angle between the right rod 870a and the right lead screw 840a may be referred to as θ1. When the second arm 912a lies with respect to the base 31, the angle θ1 can have a minimum value.

The motor assembly 810 can rotate the drive shaft in order to cause the second arm 912a to stand. When the drive shaft rotates, the right slider 860a can move in the +x-axis direction. The right slider 860a can apply a force to the right rod 870a and the right rod 870a can transmit the force to the bar 915a of the second arm 912a. The second arm 912a can rotate in the standing direction S by receiving the force from the right rod 870a. When the right link 910a stands, the angles θS and θ1 can increase.

When the second arm 912a lies with respect to the base 31, a minimum force for causing the second arm 912a to stand may be referred to as F1. That is, F1 may refer to a minimum force that needs to be transmitted by the right rod 870a to the bar 915a of the second arm 912a in order to cause the second arm 912a to stand.

Referring to FIG. 48, the angle between the right rod 870a and the right lead screw 840a may be referred to as θ2. When the second arm 912a lies with respect to the base 31, the angle θ2 can have a minimum value.

The motor assembly 810 can rotate the drive shaft in order to cause the second arm 912a to stand. When the drive shaft rotates, the right slider 860a can move in the +x-axis direction and the left slider 860b can move in the −x-axis direction. The sliders 860a and 860b can apply force to the rods 870a and 870b and the rods 870a and 870b can transmit the force to the bar 915a of the second arm 912a. The second arm 912a can rotate in the standing direction S by receiving the force from the rods 870a and 870b. When the links 910a and 910b stand, the angles θS and θ2 can increase.

When the second arm 912a lies with respect to the base 31, a minimum force for causing the second arm 912a to stand may be referred to as F2. That is, F2 may refer to a minimum force that needs to be transmitted by the right rod 870a to the bar 915a of the second arm 912a in order to cause the second arm 912a to stand.

When a case in which the right rod 870a is connected to the bar 915a of the second arm 912a is compared to a case in which the right rod 870a is connected to the protrusion 914a of the second arm 912a with reference to FIGS. 47 and 48, the angle θ2 between the right rod 870a connected to the protrusion 914a of the second arm 912a and the right lead screw 840a can be greater than the angle θ1 between the right rod 870a connected to the bar 915a of the second arm 912a and the right lead screw 840a if the angle θS between the second arm 912a and the base 31 is uniform.

Furthermore, with respect to the force necessary to cause the second arm 912a to stand, the force F1 required when the right rod 870a is connected to the bar 915a of the second arm 912a can be greater than the force F2 required when the right rod 870a is connected to the protrusion 914a of the second arm 912a if the angle θS between the second arm 912a and the base 31 is uniform.

That is, if the angle θS between the second arm 912a and the base 31 is uniform, the force necessary to cause the second arm 912a to stand can decrease as the angle between the right rod 870a and the right lead screw 840a increases. Further, the right rod 870a can cause the second arm 912a to stand by being connected to the protrusion 914a with a force less than that in a case in which the right rod 870a is connected to the bar 915a.

The lead screws 840a and 840b can be driven by the single motor assembly 810. The second arms 912a and 912b can stand while maintaining symmetry as the lead screws 840a and 840b are driven by the single motor assembly 810. However, when the single motor assembly 810 drives the lead screws 840a and 840b, a load applied to the motor assembly 810 to cause the second arms 912a and 912b to stand may excessively increase. Here, it is possible to increase the angle between the right rod 870a and the base 31 and reduce the load applied to the motor assembly 810 in order to cause the second arm 912a to stand by connecting the right rod 870a to the protrusion 914a of the second arm 912a.

The structure formed by the left lead screw 840b, the left slider 860b, the left rod 870b and the second arm 912a can be symmetrical to the structure formed by the right lead screw 840a, the right slider 860a, the right rod 870a and the second arm 912a. Here, the axis of symmetry may be the axis of symmetry ys of the motor assembly 810.

Figure 50:
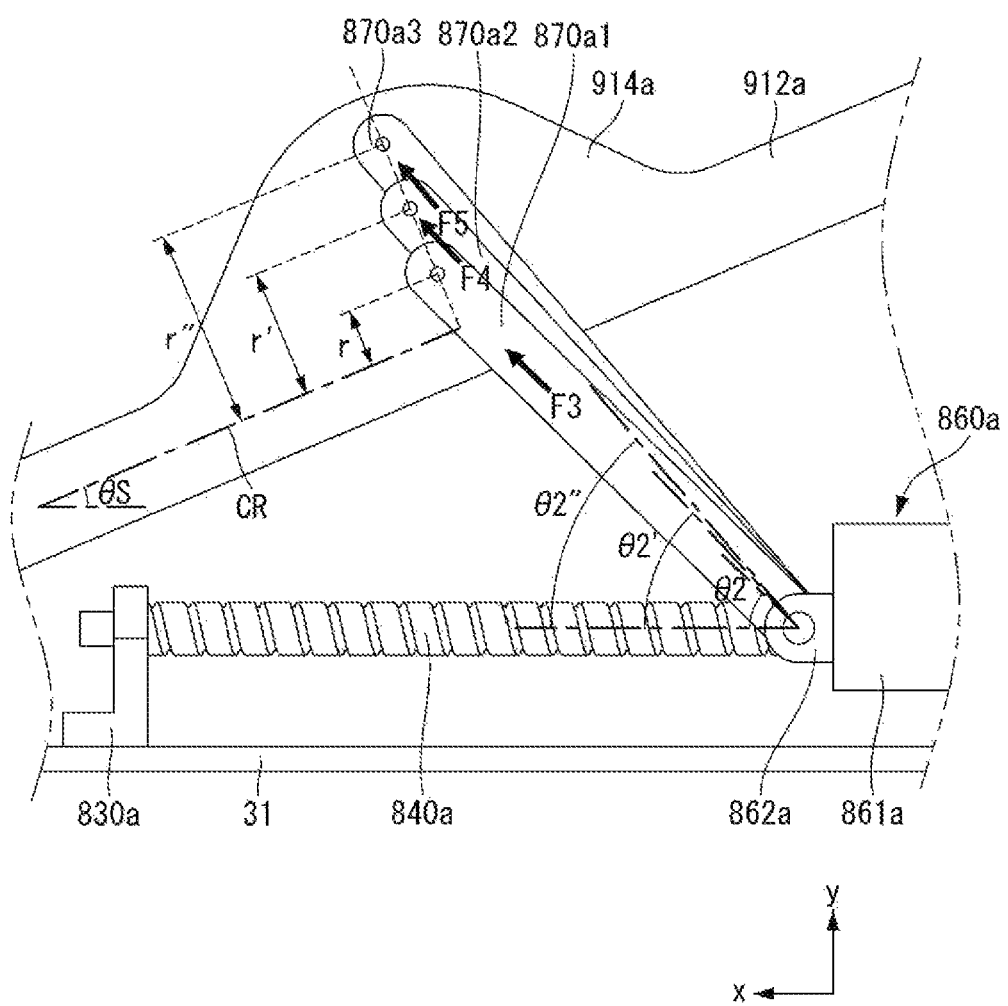
Figure 51:
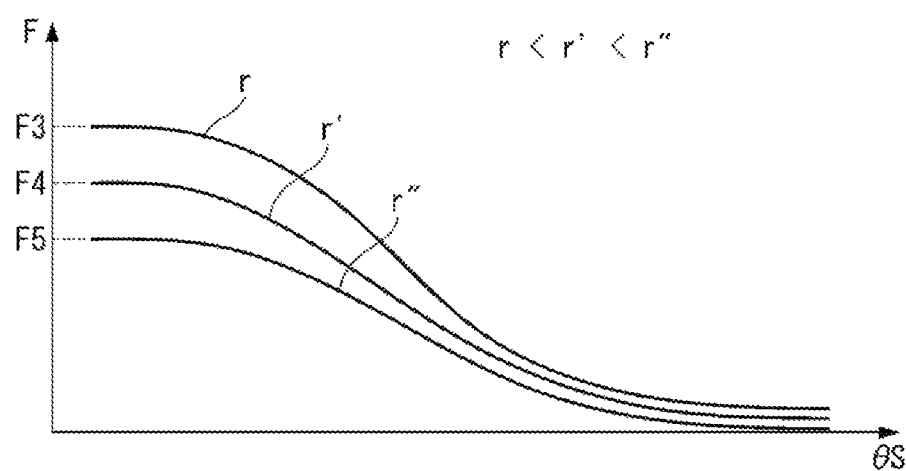

Referring to FIGS. 50 and 51, the right rod 870a is connected to the protrusion 914a. The protrusion 914a may also be referred to as a connector 914a.

The angle between the right rod 870a and the base 31 can vary according to a position at which the protrusion 914a is connected to the right rod 870a. the angle between the second arm 912a and the base 31 may be referred to as θS. When the right slider 860a is closest to the motor assembly 810 within the operation range thereof, the second arm 912a can be regarded as being in a state in which it lies with respect to the base 31. When the second arm 912a lies with respect to the base 31, the angle θS can have a minimum value. For example, when the second arm 912a lies with respect to the base 31, the angle θS can have a value close to 0 degrees.

When the right slider 860a moves in the +x-axis direction, the angle θS can gradually increase. When the right slider 860a moves in the +x-axis direction, the second arm 912a can be regarded as standing with respect to the base 31. When the angle θS gradually increases, the second arm 912a can be regarded as standing with respect to the base 31.

When the right slider 860a is farthest from the motor assembly 810 within the operation range thereof, the second arm 912a can be regarded as being in a state in which it stands with respect to the base 31. When the second arm 912a stands with respect to the base 31, the angle θS can have a maximum value. For example, when the second arm 912a stands with respect to the base 31, the second arm 912a can be positioned to be perpendicular to the base 31. Further, when the second arm 912a stands with respect to the base 31, the angle between the second arm 912a and the base 31 can have a value close to 90 degrees.

A direction in which the angle (angle θS) between the second arm 912a of the right link 910a and the base 31 increases may be referred to as a standing direction S. Further, a direction in which the angle between the second arm 912a of the left link 910b and the base 31 increases may be referred to as the standing direction S.

The angle between the right road 870a and the base 31 may be referred to as θ2 and a minimum force by which the right rod 870a causes the second arm 912a to stand may be referred to as F3 when the right rod 870a1 and the protrusion 914a are connected to each other at a distance r from the central axis CR of the second arm 912a.

The angle between the right road 870a2 and the base 31 may be referred to as θ2' and a minimum force by which the right rod 870a2 causes the second arm 912a to stand may be referred to as F4 when the right rod 870a2 and the protrusion 914a are connected to each other at a distance r' from the central axis CR of the second arm 912a.

The angle between the right road 870a3 and the base 31 may be referred to as θ2" and a minimum force by which the right rod 870a3 causes the second arm 912a to stand may be referred to as F5 when the right rod 870a3 and the protrusion 914a are connected to each other at a distance r" from the central axis CR of the second arm 912a.

Here, a relationship of θ2<θ2'<θ2" can be established for the same angle θS. Further, a relationship of F5<F4<F3 can be established for the same angle θS.

That is, if the angle between the second arm 912a and the base 31 is uniform, the force necessary to cause the second arm 912a to stand can decrease as the angle between the right road 870a and the base 31 increases.

The structure formed by the left lead screw 840b, the left slider 860b, the left rod 870b and the second arm 912b can be symmetrical to the structure formed by the right lead screw 840a, the right slider 860a, the right rod 870a and the second arm 912a. Here, the axis of symmetry may be the axis of symmetry ys of the motor assembly 810.

Figure 52:
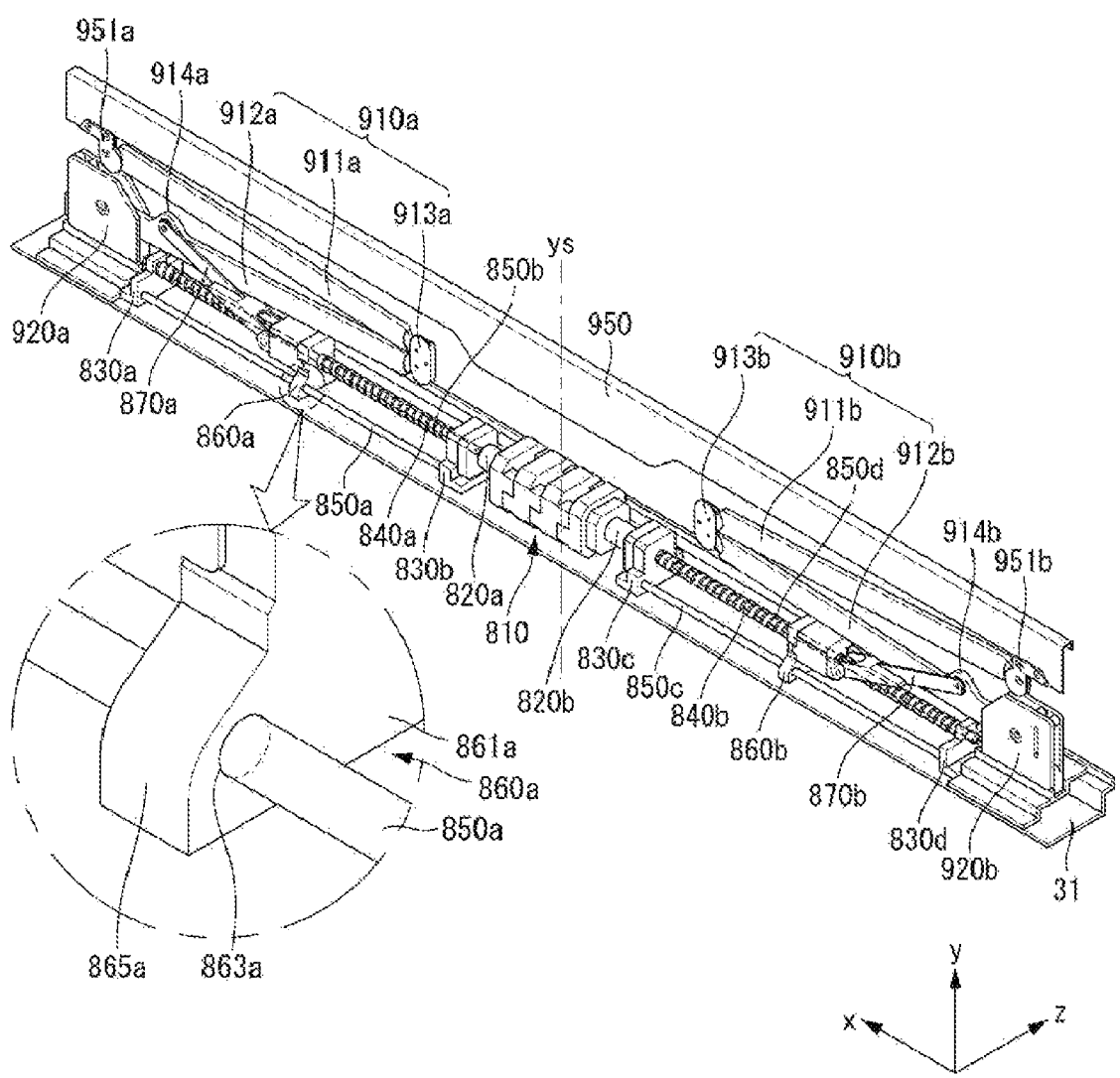

Referring to FIG. 52, guides 850a, 850b, 850c and 850d can be connected to the bearing 830a, 830b, 830c and 830d. The guides 850a, 850b, 850c and 850d may include right guides 850a and 850b disposed on the right side of the motor assembly 810 and left guides 850c and 850d disposed on the left side of the motor assembly 810.

One side of the right guides 850a and 850b can be connected to the first right bearing 830a and the other side thereof can be connected to the second right bearing 830b. The right guides 850a and 850b can be positioned in parallel to the right lead screw 840a. Further, the right guides 850a and 850b can be separated from the right lead screw 840a.

The right guides 850a and 850b may include a first right guide 850a and a second right guide 850b. The first right guide 850a and the second right guide 850b can be separated from each other. The right lead screw 840a can be positioned between the first right guide 850a and the second right guide 850b.

The right slider 860a may include a protrusion. Alternatively, the display device may include a protrusion formed on the right slider 860a. The protrusion may be formed on the body of the slider. The protrusion may include a front protrusion (not shown) protruding from the body 861a of the right slider 860a in the +Z-axis direction and a rear protrusion 865a protruding from the body of the slider in the −z-axis direction.

The first right guide 850a can penetrate the rear protrusion 865a. Alternatively, a first hole 863a may be formed in the rear protrusion and the first right guide 850a may penetrate the first hole 863a. The first hole 863a may be formed in the x-axis direction. The first hole 863a may also be referred to as a hole 863a.

The second right guide (not shown) can penetrate the front protrusion (not shown). Alternatively, a second hole (not shown) may be formed in the front protrusion and the second right guide may penetrate the second hole. The second hole may be formed in the x-axis direction.

The right guides 850a and 850b can guide the right slider 860a such that the right slider 860a can move more stably when moving forward or backward along the right lead screw 840a. Since the right guides 850a and 850b stably guide the right slider 860a, the right slider 860a can move forward or backward along the right lead screw 840a without rotating with respect to the right lead screw 840a.

The structure formed by the left guides 850c and 850d, the left bearings 830a, 830b, 830c and 830d, the left slider 860b and the left lead screw 840b can be symmetrical to the above-described structure formed by the right guides 850a and 850b, the right bearings 830a, 830b, 830c and 830d, the right slider 860a and the right lead screw 840a. Here, the axis of symmetry may be the axis of symmetry ys of the motor assembly 810.

Figure 53:
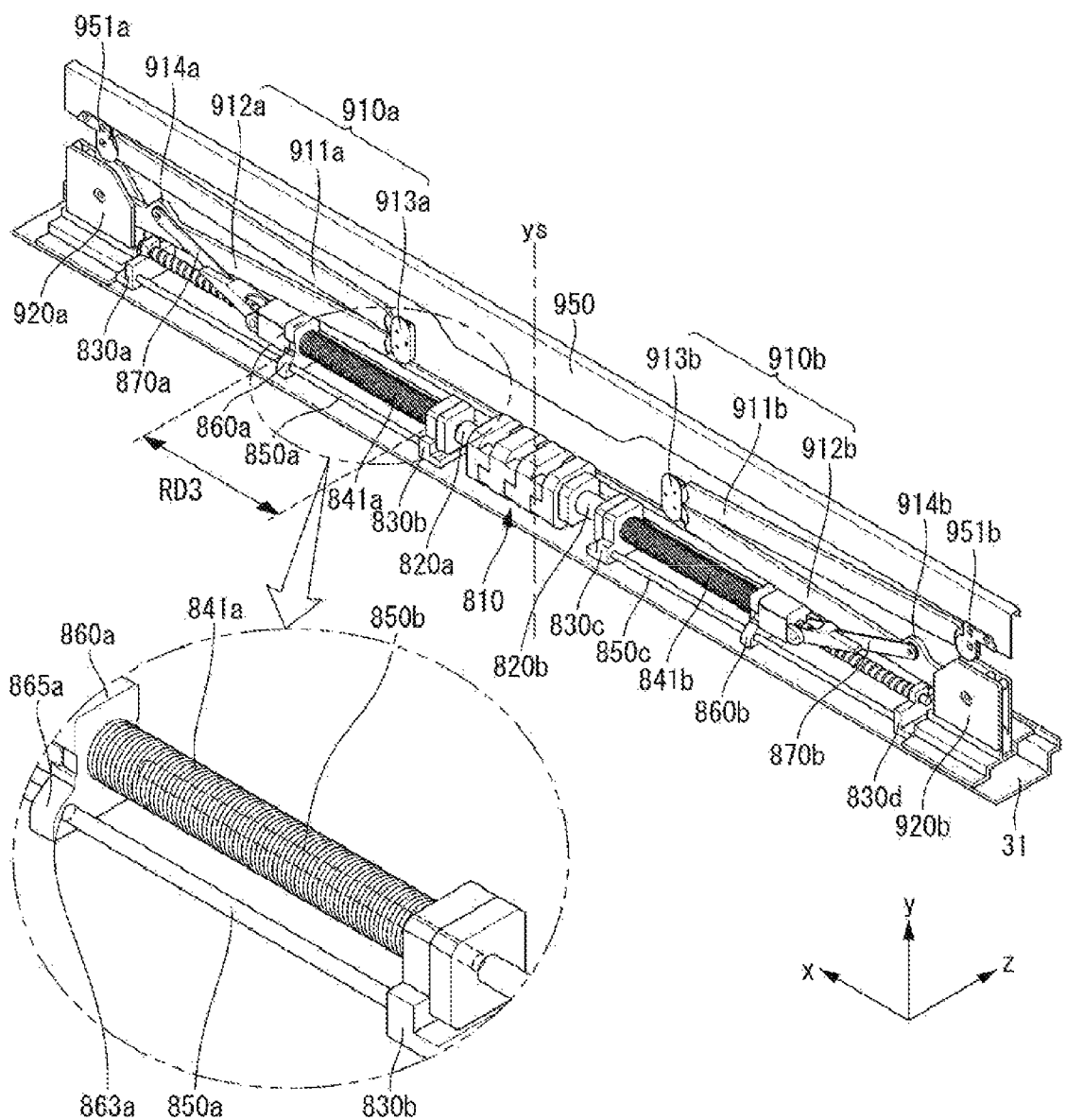

Referring to FIG. 53, the lead screws 840a and 840b may be inserted into first springs 841a and 841b. Alternatively, the lead screws 840*a* and 840*b* may penetrate the first springs 841*a* and 841*b*. The first springs 841*a* and 841*b* may include a first right spring 841*a* disposed on the right side of the motor assembly 810 and a first left spring 841*b* disposed on the left side of the motor assembly 810.

The first right spring 841*a* can be disposed between the right slider 860*a* and the second right bearing 830*b*. One end of the first right spring 841*a* can contact or can be separated from the right slider 860*a*. The other end of the first right spring 841*a* can contact or can be separated from the second right bearing 830*b*.

When the second arm 912*a* lies with respect to the base 31, the distance between the right slider 860*a* and the second right bearing 830*b* may be a distance RD3. The first right spring 841*a* may have a length greater than the distance RD3 in a state in which the first right spring 841*a* is not compressed or extended. Accordingly, when the second arm 912*a* lies with respect to the base 31, the first right spring 841*a* can be compressed between the right slider 860*a* and the second right bearing 830*b*. In addition, the first right spring 841*a* can provide a restoring force to the right slider 860*a* in the +x-axis direction.

When the second arm 912*a* switches from a state in which it lies with respect to the base 31 to a state in which it stands, the restoring force provided by the first right spring 841*a* can assist the second arm 912*a* to stand. Since the first right spring 841*a* assists the second arm 912*a* to stand, the load of the motor assembly 810 can be reduced.

The lead screws 840*a* and 840*b* can be driven by the single motor assembly 810. The second arms 912*a* and 912*b* can stand while maintaining symmetry as the lead screws 840*a* and 840*b* are driven by the single motor assembly 810. However, when the single motor assembly 810 drives the lead screws 840*a* and 840*b*, a load applied to the motor assembly 810 to cause the second arms 912*a* and 912*b* to stand may excessively increase. Here, when the first right spring 841*a* assists the second arm 912*a* to stand, the load of the motor assembly 810 can be reduced and the load applied to the motor assembly 810 to cause the second arm 912*a* to stand can be decreased.

When the second arm 912*a* switches from a state in which it stands with respect to the base 31 to a state in which it lies, the restoring force provided by the first right spring 841*a* can relieve the impact occurring when the second arm 912*a* lies with respect to the base 31. That is, the first right spring 841*a* can serve as a damper when the second arm 912*a* lies with respect to the base 31. Since the first right spring 841*a* serves as a damper, the load of the motor assembly 810 can be reduced.

The structure formed by the first left spring 841*b*, the left bearings 830*a*, 830*b*, 830*c* and 830*d*, the left slider 860*b*, the left lead screw 840*b* and the second arm 912*a* can be symmetrical to the above-described structure formed by the first right spring 841*a*, the right bearings 830*a*, 830*b*, 830*c* and 830*d*, the right slider 860*a*, the right lead screw 840*a* and the second arm 912*a* Here, the axis of symmetry may be the axis of symmetry ys of the motor assembly 810.

Figure 54:
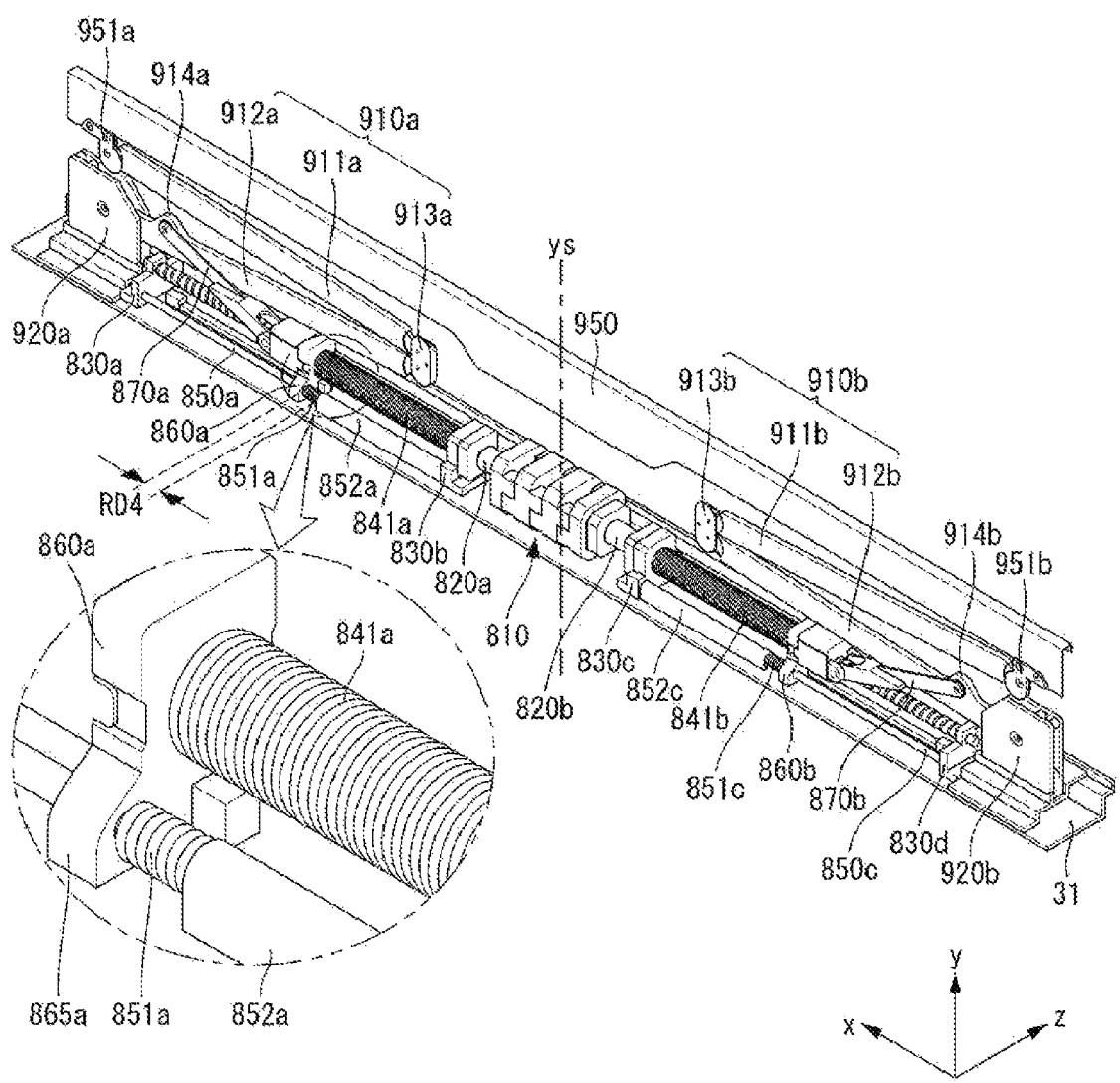

Referring to FIG. 54, the guides 850*a*, 850*b*, 850*c* and 850*d* may be inserted into second springs 851*a* and 851*b*. Alternatively, the guides 850*a*, 850*b*, 850*c* and 850*d* may penetrate the first springs 841*a* and 841*b*. The second springs 851*a* and 851*b* may include a second right spring 851*a* disposed on the right side of the motor assembly 810 and a second left spring 851*b* disposed on the left side of the motor assembly 810.

A plurality of second right springs 851*a* may be provided. The second right springs 851*a* may include springs 940*a* and 940*b* having the first right guide 850*a* inserted thereinto and springs 940*a* and 940*b* having the second right guide 850*b* inserted thereinto. Alternatively, the second right spring 851*a* may include the springs 940*a* and 940*b* that the first right guide 850*a* penetrates and the springs 940*a* and 940*b* that the second right guide 850*b* penetrates.

The guides 850*a*, 850*b*, 850*c* and 850*d* may include projections 852*a* and 852*b*. The projections 852*a* and 852*b* may include a right projection 852*a* disposed on the right side of the motor assembly 810 and a left projection 852*b* disposed on the left side of the motor assembly 810.

The right projection 852*a* can be disposed between the right slider 860*a* and the second right bearing 830*b*. In addition, the second right spring 851*a* can be disposed between the right slider 860*a* and the second right bearing 830*b*. One end of the second right spring 851*a* can contact or can be separated from the right slider 860*a*. The other end of the second right spring 851*a* can contact or can be separated from the right projection 852*a*.

When the second arm 912*a* lies with respect to the base 31, the distance between the right slider 860*a* and the right projection 852*a* may be a distance RD4. The second right spring 851*a* may have a length greater than the distance RD4 in a state in which the second right spring 851*a* is not compressed or extended. Accordingly, when the second arm 912*a* lies with respect to the base 31, the second right spring 851*a* can be compressed between the right slider 860*a* and the right projection 852*a*. In addition, the second right spring 851*a* can provide a restoring force to the right slider 860*a* in the +x-axis direction.

When the second arm 912*a* switches from a state in which it lies with respect to the base 31 to a state in which it stands, the restoring force provided by the second right spring 851*a* can assist the second arm 912*a* to stand. Since the second right spring 851*a* assists the second arm 912*a* to stand, the load of the motor assembly 810 can be reduced.

The lead screws 840*a* and 840*b* can be driven by the single motor assembly 810. The second arms 912*a* and 912*b* can stand while maintaining symmetry as the lead screws 840*a* and 840*b* are driven by the single motor assembly 810. However, when the single motor assembly 810 drives the lead screws 840*a* and 840*b*, a load applied to the motor assembly 810 to cause the second arms 912*a* and 912*b* to stand may excessively increase. Here, when the second right spring 851*a* assists the second arm 912*a* to stand, the load of the motor assembly 810 can be reduced and the load applied to the motor assembly 810 to cause the second arm 912*a* to stand can be decreased.

When the second arm 912*a* switches from a state in which it stands with respect to the base 31 to a state in which it lies, the restoring force provided by the second right spring 851*a* can relieve the impact occurring when the second arm 912*a* lies with respect to the base 31. That is, the second right spring 851*a* can serve as a damper when the second arm 912*a* lies with respect to the base 31. Since the second right spring 851*a* serves as a damper, the load of the motor assembly 810 can be reduced.

The structure formed by the second left spring 851*b*, the left projection 852*b*, the left slider 860*b*, the left guides 850*c* and 850*d* and the second arm 912*a* can be symmetrical to the above-described structure formed by the second right spring 851*a*, the right projection 852*a*, the right slider 860*a*, the right guides 850*a* and 850*b* and the second arm 912*a* Here, the axis of symmetry may be the axis of symmetry ys of the motor assembly 810.

Figure 55:
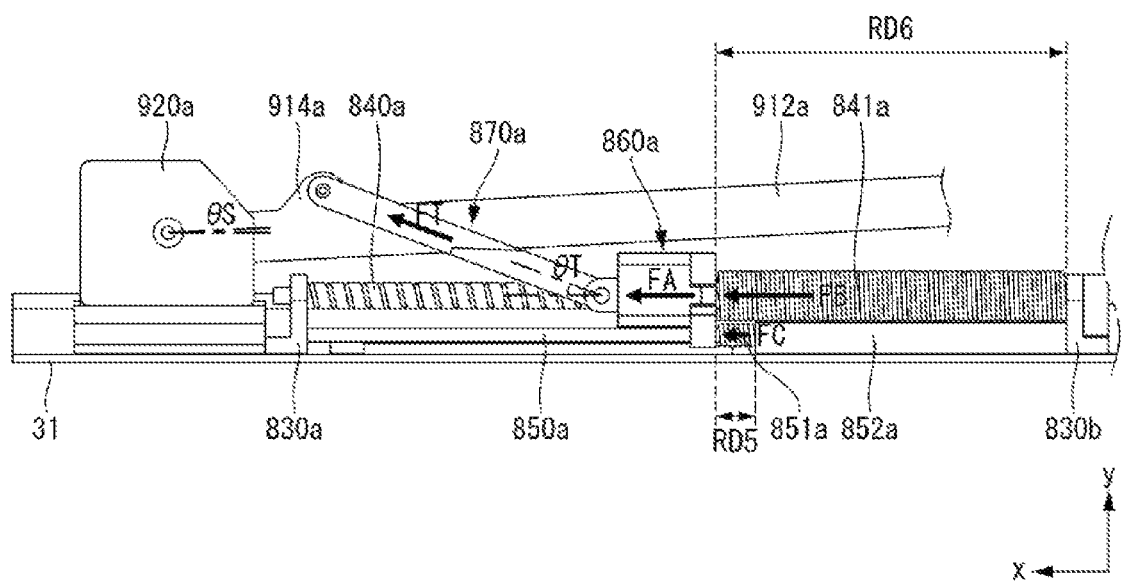
Figure 56:
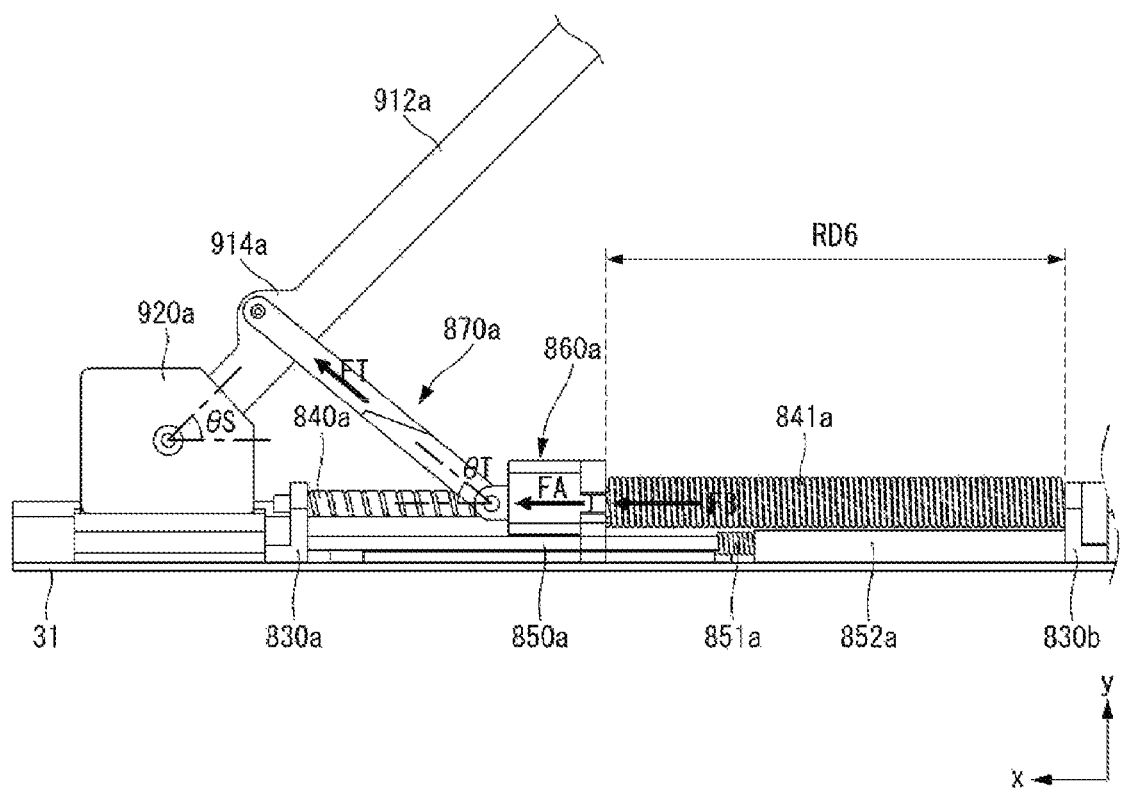
Figure 57:
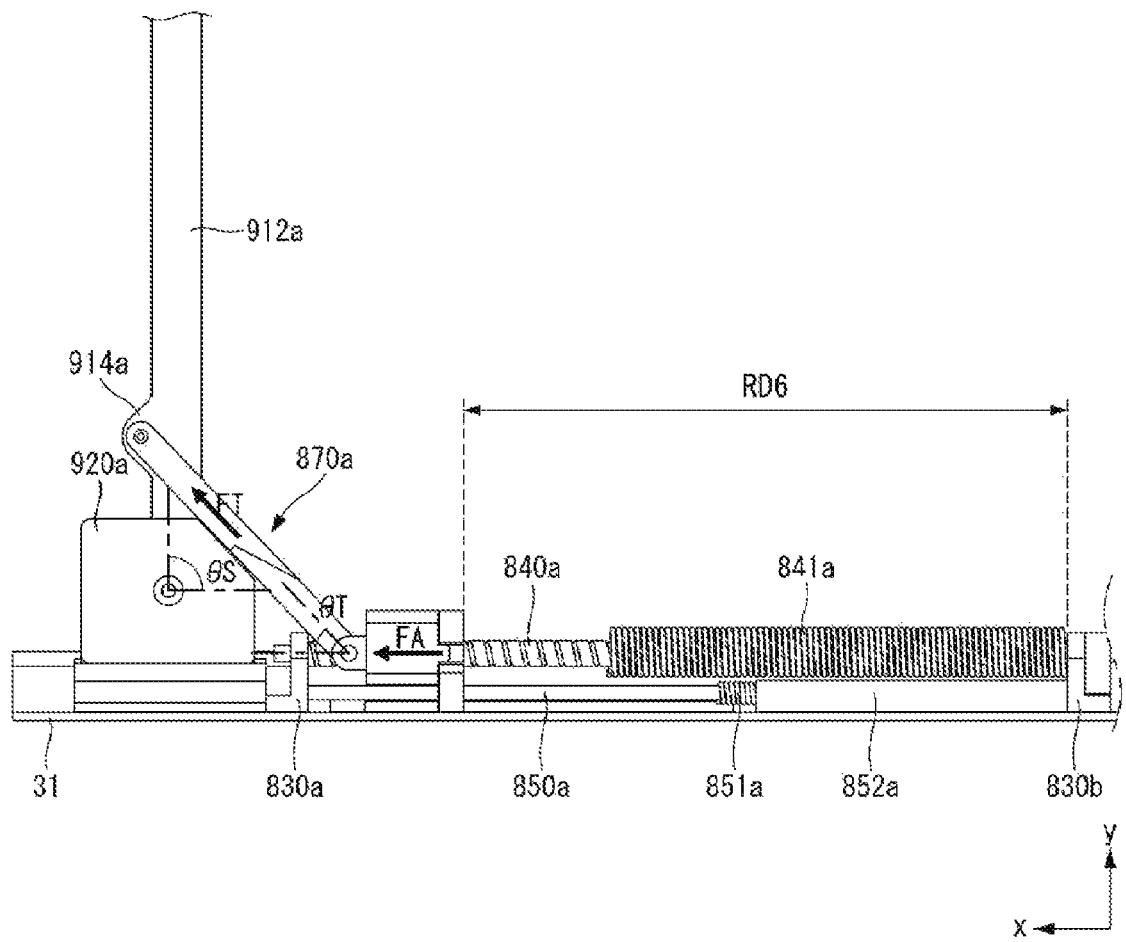

Referring to FIGS. 55 to 57, the second arm 912a can stand by receiving restoring force from the first right spring 841a and the second right spring 851a.

The angle between the second arm 912a and the base 31 may be referred to as θS. The angle between the right rod 870a and the base 31 may be referred to as θT. A force by which the motor assembly 810 moves the right slider 860a in the +x-axis direction may be referred to as FA. A force applied by the first right spring 841a to the right slider 860a may be referred to as FB. A force applied by the second right spring 851a to the right slider 860a may be referred to as FC. A force transmitted by the right rod 870a to the second arm 912a may be referred to as FT.

When the second arm 912a lies with respect to the base 31, the angles θS and θT can have minimum values. When the second arm 912a switches from a state in which it lies with respect to the base 31 to a state in which it stands, the angles θS and θT can gradually increase.

When the second arm 912a lies with respect to the base 31, the first right spring 841a can be compressed. The compressed first right spring 841a can provide the restoring force FB to the right slider 860a. The restoring force FB can act in the +x direction. When the second arm 912a lies with respect to the base 31, a compression displacement amount of the first right spring 841a can be maximized and the restoring force FB can have a maximum value. When the second arm 912a switches from a state in which it lies with respect to the base 31 to a state in which it stands, the compression displacement amount of the first right spring 841a can gradually decrease and the restoring force FB can also gradually decrease.

When the second arm 912a lies with respect to the base 31, the second right spring 851a can be compressed. The compressed second right spring 851a can provide the restoring force FC to the right slider 860a. The restoring force FC can act in the +x direction. When the second arm 912a lies with respect to the base 31, a compression displacement amount of the second right spring 851a can be maximized and the restoring force FC can have a maximum value. When the second arm 912a switches from a state in which it lies with respect to the base 31 to a state in which it stands, the compression displacement amount of the second right spring 851a can gradually decrease and the restoring force FC can also gradually decrease.

A force FT transmitted by the right rod 870a to the second arm 912a can be a resultant force of the force FA by which the motor assembly 810 moves the right slider 860a in the +x direction, the restoring force FB of the first right spring 841a and the restoring force FC of the second right spring 851a.

When the second arm 912a starts to stand in a state in which it lies with respect to the base 31, the load of the motor assembly 810 may have a maximum value. Here, the restoring force FB provided by the first right spring 841a can have a maximum value. Further, the restoring force FC provided by the second springs 851a and 851b can also have a maximum value.

When the second arm 912a switches from a state in which it lies with respect to the base 31 to a state in which it stands, the restoring force provided by the first right spring 841a and the second right spring 851a can assist the second arm 912a to stand. Since the first right spring 841a and the second right spring 851a assist the second arm 912a to stand, the load of the motor assembly can be reduced.

The first right spring 841a and the second right spring 851a can simultaneously provide the restoring force (resultant force of the restoring force FB and the restoring force FC) to the right slider 860a. The restoring force (resultant force of the restoring force FB and the restoring force FC) can be provided to the right slider 860a until the distance RD5 between the right slider 860a and the right projection 852a becomes equal to the length of the second right spring 851a.

When the distance RD5 between the right slider 860a and the right projection 852a becomes equal to the length of the second right spring 851a, the compression displacement amount of the second right spring 851a can become 0. When the compression displacement amount of the second right spring 851a becomes 0, the restoring force FC provided by the second right spring 851a to the right slider 860a can become 0.

When the distance RD5 between the right slider 860a and the right projection 852a becomes greater than the length of the second right spring 851a, only the first right spring 841a can provide the restoring force FB to the right slider 860a. The restoring force FB can be provided to the right slider 860a until the distance RD6 between the right slider 860a and the second right bearing 830b becomes equal to the length of the first right spring 841a.

When the distance RD6 between the right slider 860a and the second right bearing 830b becomes equal to the length of the first right spring 841a, the compression displacement amount of the first right spring 841a can become 0. When the compression displacement amount of the first right spring 841a becomes 0, the restoring force FB provided by the first right spring 841a to the right slider 860a can become 0.

When the distance RD6 between the right slider 860a and the second right bearing 830b becomes greater than the length of the first right spring 841a, the motor assembly 810 can cause the second arm 912a without being provided with the restoring force from the first right spring 841a or the second right spring 851a.

The structure formed by the first left spring 841b, the second left spring 851b, the left projection 852b, the left slider 860b, the left guides 850c and 850d, the left lead screw 840b, the left rod 870b and the second arm 912a can be symmetrical to the above-described structure formed by the first right spring 841a, the second right spring 851a, the right projection 852a, the right slider 860a, the right guides 850a and 850b, the right lead screw 840a, the right rod 870a and the second arm 912a. Here, the axis of symmetry may be the axis of symmetry ys of the motor assembly 810.

Figure 58:
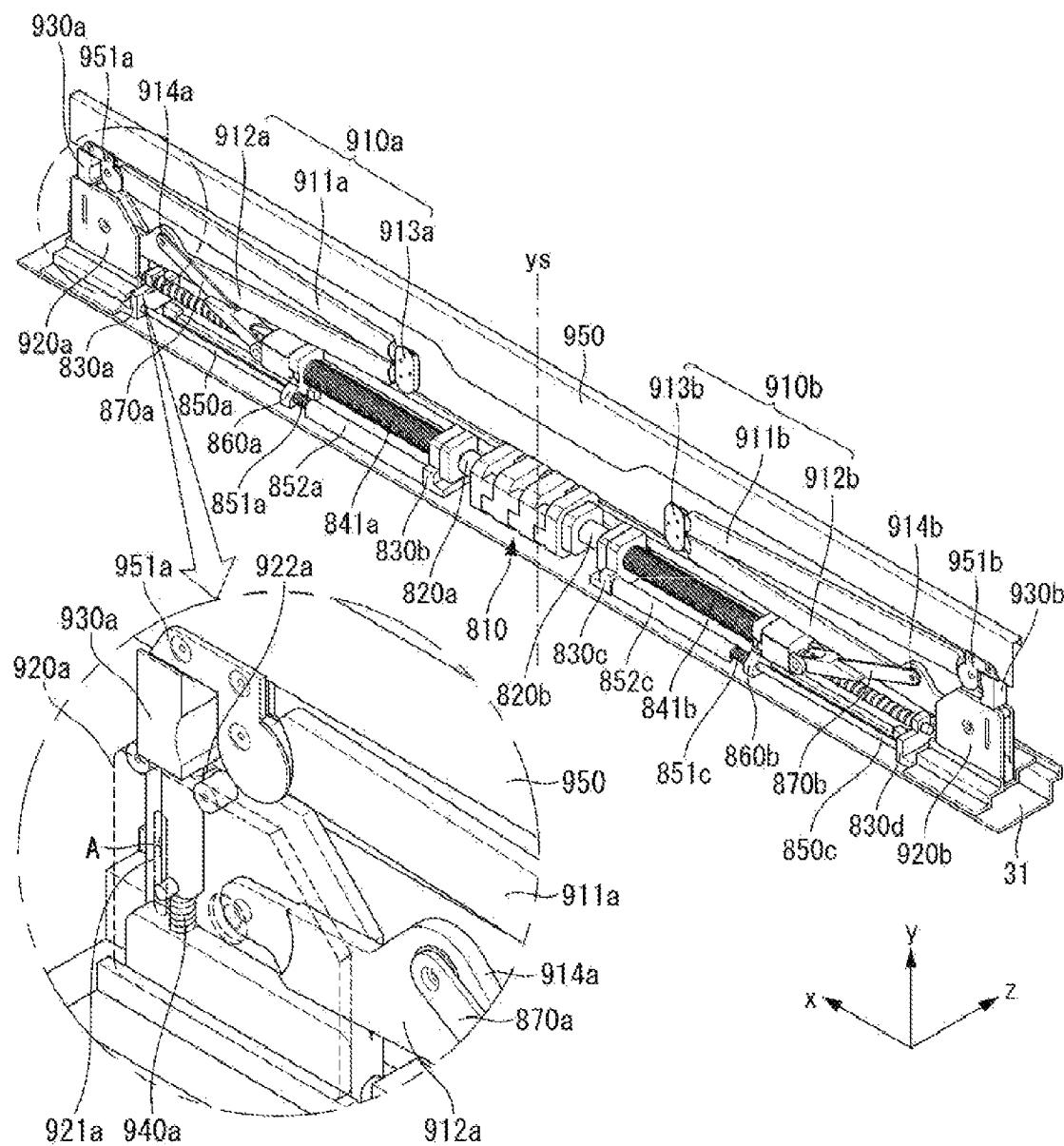

Referring to FIG. 58, pushers 930a and 930b may be connected to the link mounts 920a and 920b. The pushers 930a and 930b may include a right pusher 930a disposed on the right side of the motor assembly 810 and a left pusher 930b disposed on the left side of the motor assembly 810.

The link mounts 920a and 920b can form an accommodation space A. The accommodation space A can accommodate springs 940a and 940b and the pushers 930a and 930b. The springs 940a and 940b may include a right spring 940a disposed on the right side of the motor assembly 810 and a left spring 940b disposed on the left side of the motor assembly 810. The accommodation space A may also be referred to as an internal space A.

The link mounts 920a and 920b may include a first hole 922a which connects the accommodation space A and the outer space (a first hole corresponding to 920b is not shown). The first hole 922a can be formed at the upper surfaces of the link mounts 920a and 920b. The first hole 922a may also be referred to as a hole 922a.

The pushers 930a and 930b can be positioned to be perpendicular to the base 31. The pushers 930a and 930b may be disposed in parallel to the y axis. The springs 940*a* and 940*b* can be positioned to be perpendicular to the base 31. The springs 940*a* and 940*b* may be disposed in parallel to the y axis.

The pushers 930*a* and 930*b* may include first parts 931*a* and 931*b* and second parts 932*a* and 932*b*. The second parts 932*a* and 932*b* can be connected to the lower side of the first parts 931*a* and 931*b*. The lower ends of the second parts 932*a* and 932*b* can be connected to the springs 940*a* and 940*b*. All or part of the second parts 932*a* and 932*b* can be accommodated in the accommodation space A formed by the link mounts 920*a* and 920*b*. The second parts 932*a* and 932*b* may have a diameter equal to or less than the diameter of the first hole 922*a*. The second parts 932*a* and 932*b* can penetrate the first hole 922*a*.

The first parts 931*a* and 931*b* can be positioned outside the link mounts 920*a* and 920*b*. The first parts 931*a* and 931*b* may be positioned outside the accommodation space A of the link mounts 920*a* and 920*b*. The first parts 931*a* and 931*b* may have a diameter greater than the diameter of the first hole 922*a*.

The first parts 931*a* and 931*b* can contact or can be separated from the link brackets 951*a* and 951*b*. For example, when the second arm 912*a* lies with respect to the base 31, the first parts 931*a* and 931*b* can contact the link brackets 951*a* and 951*b*. When the second arm 912*a* stands with respect to the base 31, the first parts 931*a* and 931*b* can be separated from the link brackets 951*a* and 951*b*.

When the first part 931*a* and 931*b* come into contact with the link brackets 951*a* and 951*b*, the pushers 930*a* and 930*b* can receive force from the link brackets 951*a* and 951*b*. The pushers 930*a* and 930*b* may receive the force in the downward direction. The pushers 930*a* and 930*b* may receive the force in the −y-axis direction. The link brackets 951*a* and 951*b* may press the pushers 930*a* and 930*b*. The link brackets 951*a* and 951*b* may press the pushers 930*a* and 930*b* in the downward direction. The link brackets 951*a* and 951*b* may press the pushers 930*a* and 930*b* in the −y direction.

When the first parts 931*a* and 931*b* receive force, the springs 940*a* and 940*b* can be compressed. The compressed springs 940*a* and 940*b* can provide restoring force to the pushers 930*a* and 930*b*. The restoring force can be provided in a direction opposite the direction of the force applied to the first parts 931*a* and 931*b*. The restoring force may act in the +y direction.

The link mounts 920*a* and 920*b* may include a second hole 921*a* (a second hole corresponding to 920*b* is not shown). The second hole 921*a* can connect the accommodation space A and the outer space. All or part of the springs 940*a* and 940*b* can be exposed to the outside through the second hole 921*a*. All or part of the pushers 930*a* and 930*b* can be exposed to the outside through the second hole 921*a*. In case of maintenance of the display device, a service provider can check operation states of the pushers 930*a* and 930*b* through the second hole 921*a*. The second hole 921*a* can provide convenience of maintenance to the service provider.

Figure 59:
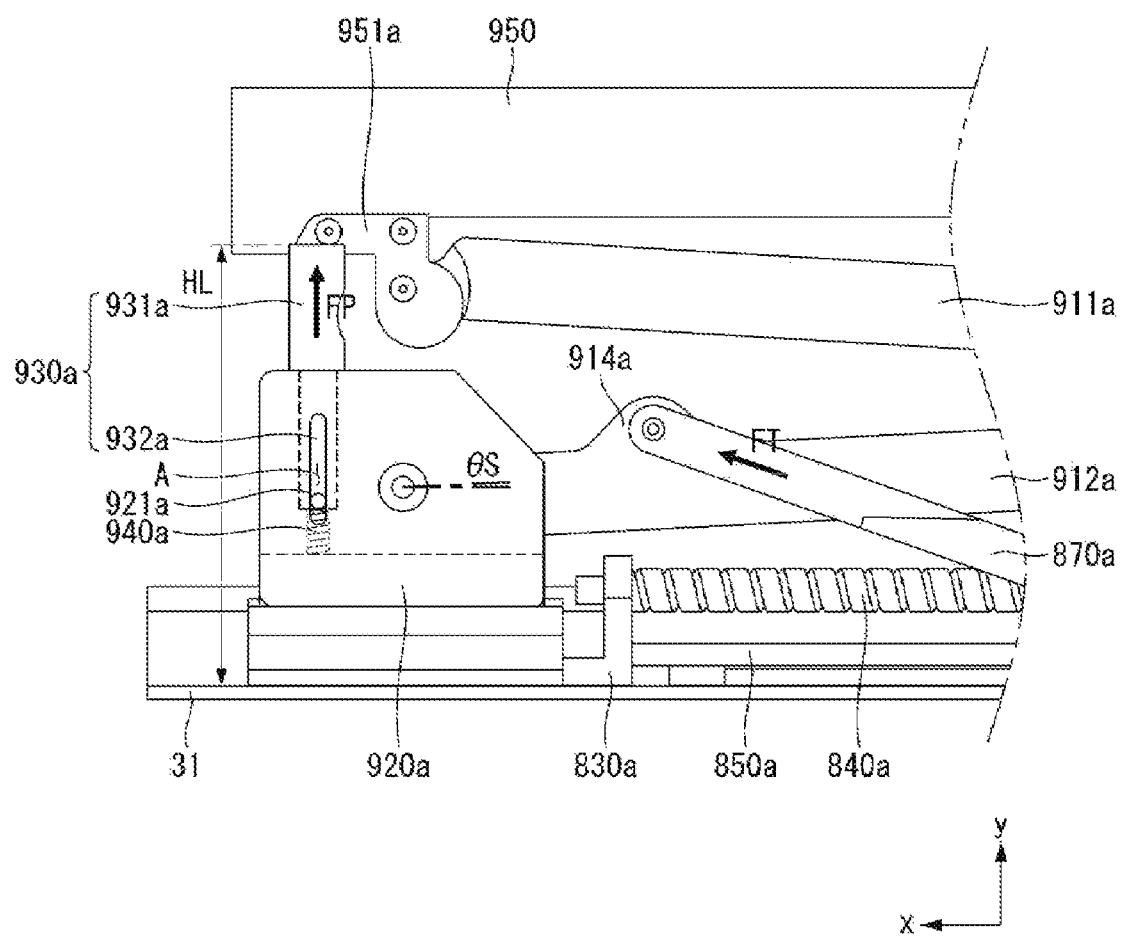
Figure 60:
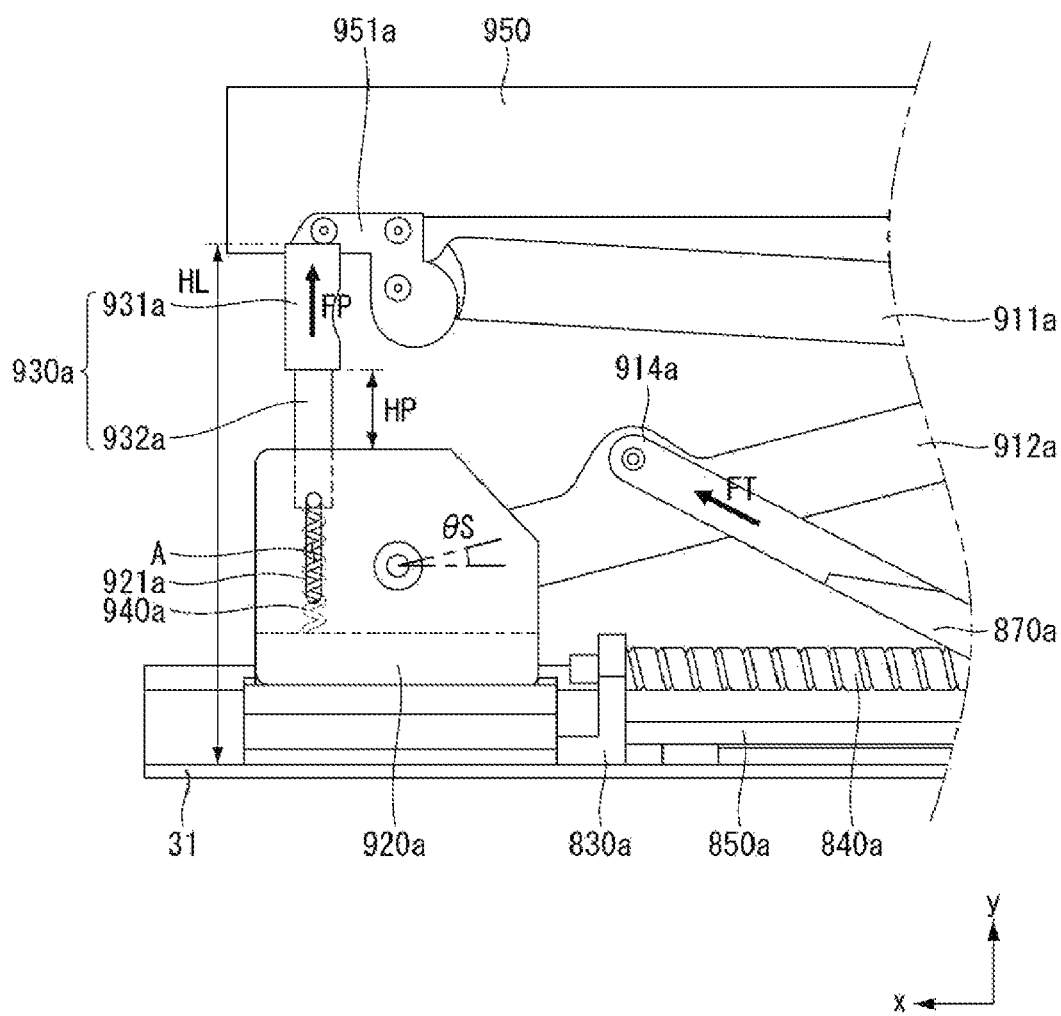
Figure 61:
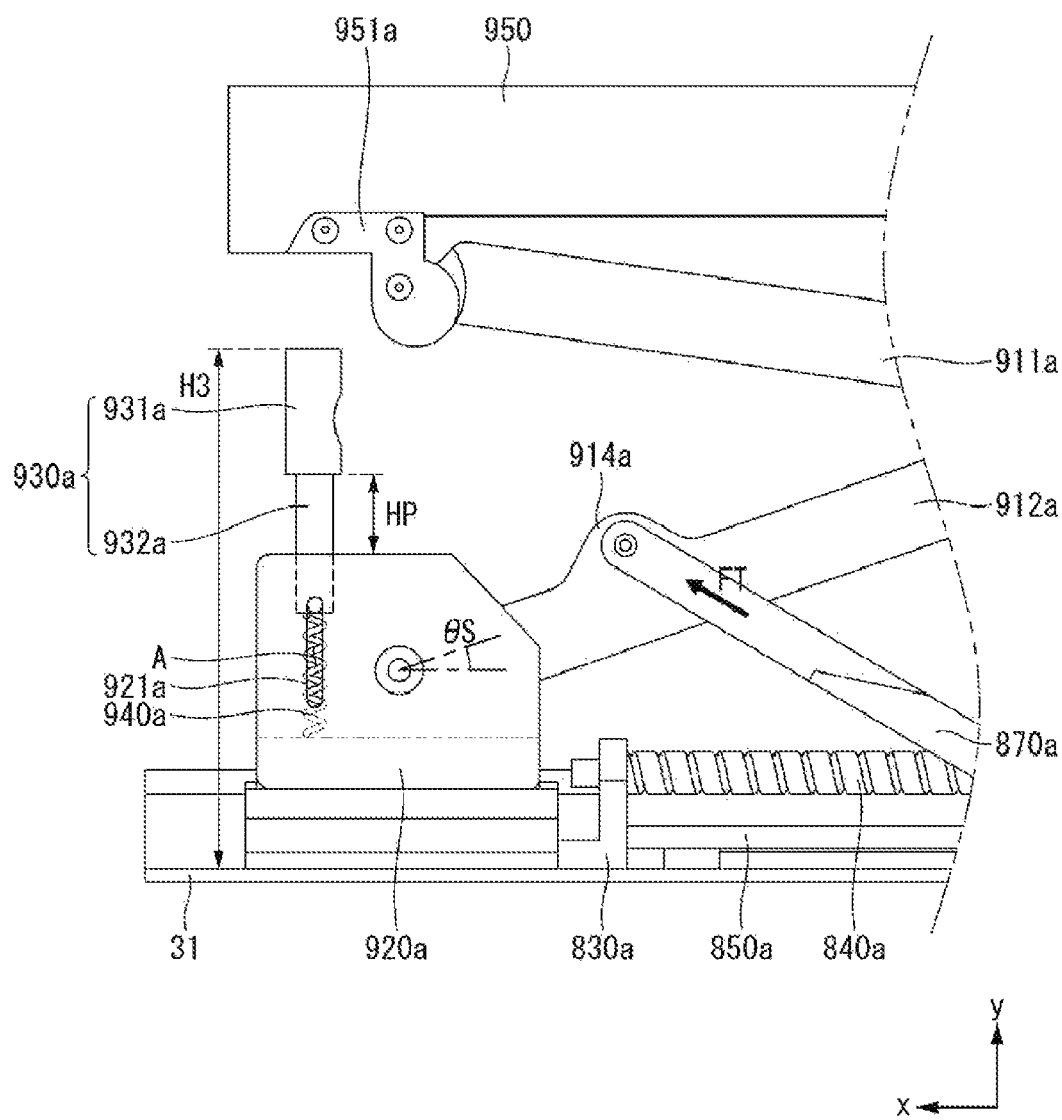

Referring to FIGS. 59 to 61, the right link 910*a* can stand by receiving a restoring force from the right pusher 930*a*. Description will be given on the basis of the right link 910*a*.

The angle between the second arm 912*a* and the base 31 may be referred to as θS. The force transmitted by the right rod 870*a* to the second arm 912*a* may be referred to as FT. The force transmitted by the right pusher 930*a* to the right link bracket 951*a* may be referred to as FP.

Referring to FIG. 59, when the second arm 912*a* lies with respect to the base 31, the angle θS can have a minimum value. The right spring 940*a* connected to the right pusher 930*a* can be compressed to maximum and the restoring force FP can have a maximum value. The compressed right spring 940*a* can provide the restoring force FP to the right pusher 930*a*. The right pusher 930*a* can transmit the restoring force FP to the right link bracket 951*a*. The restoring force FP can act in the +y direction.

When the second arm 912*a* lies with respect to the base 31, the distance HL from the base 31 to the upper end of the right pusher 930*a* can have a minimum value. The first part 931*a* of the right pusher 930*a* can protrude to the outside of the right link mount 920*a* and the entire second part 932*a* of the right pusher 930*a* can be accommodated in an accommodation space 923*a* of the right link mount 920*a*.

Referring to FIG. 60, when the second arm 912*a* switches from a state in which it lies with respect to the base 31 to a state in which it stands, the angle θS can gradually increase. A compression displacement amount of the right spring 940*a* can gradually decrease and the restoring force FP can also gradually decrease.

As the angle θS gradually increases, at least a part of the second part 932*a* of the right pusher 930*a* can protrude to the outside of the right link mount 920*a*. The length of the portion of the second part 932*a* of the right pusher 930*a* which has protruded to the outside of the right link mount 920*a* may be referred to as HP. The distance HL from the base 31 to the upper end of the right pusher 930*a* can increase by HP as compared to a case in which the second arm 912*a* lies with respect to the base 31.

Referring to FIG. 61, when the second arm 912*a* stands with respect to the base 31, the right pusher 930*a* and the right link bracket 951*a* can be separated from each other. The compression displacement amount of the right spring 940*a* can become 0. When the compression displacement amount of the right spring 940*a* becomes 0, the restoring force FP provided by the right pusher 930*a* to the right link bracket 951*a* can become 0.

In addition, the length HP of the portion of the second part 932*a* of the right pusher 930*a* which has protruded to the outside of the right link mount 920*a* can have a maximum value. The distance HL from the base 31 to the upper end of the right pusher 930*a* can have a maximum value.

That is, the right pusher 930*a* can assist the second arm 912 to stand by applying a restoring force to the right link bracket 951 while the right pusher 930*a* contacts the right link bracket 951*a* to reduce the load of the motor assembly 810.

The lead screws 840*a* and 840*b* can be driven by the single motor assembly 810. The second arms 912*a* and 912*b* can stand while maintaining symmetry as the lead screws 840*a* and 840*b* are driven by the single motor assembly 810. However, when the single motor assembly 810 drives the lead screws 840*a* and 840*b*, a load applied to the motor assembly 810 to cause the second arms 912*a* and 912*b* to stand may excessively increase. Here, the right pusher 930*a* can assist the second arm 912*a* to stand by applying a restoring force to the right link bracket 951*a* to reduce the load of the motor assembly.

When the second arm 912*a* switches from a state in which it stands with respect to the base 31 to a state in which it lies, the restoring force provided by the right pusher 930*a* to the right link bracket 951*a* can relieve the impact occurring when the link 910*a* lies with respect to the base 31. That is, the right pusher 930*a* can serve as a damper when the link 910a lies with respect to the base 31. Since the right pusher 930a serves as a damper, the load of the motor assembly 810 can be reduced.

The structure formed by the left pusher 930b, the left spring 940b, the left link bracket 951b, the left link mount 920b and the left rod 870b can be symmetrical to the above-described structure formed by the right pusher 930a, the right spring 940a, the right link bracket 951a, the right link mount 920b and the right rod 870a. Here, the axis of symmetry may be the axis of symmetry of the motor assembly 810.

Figure 62:
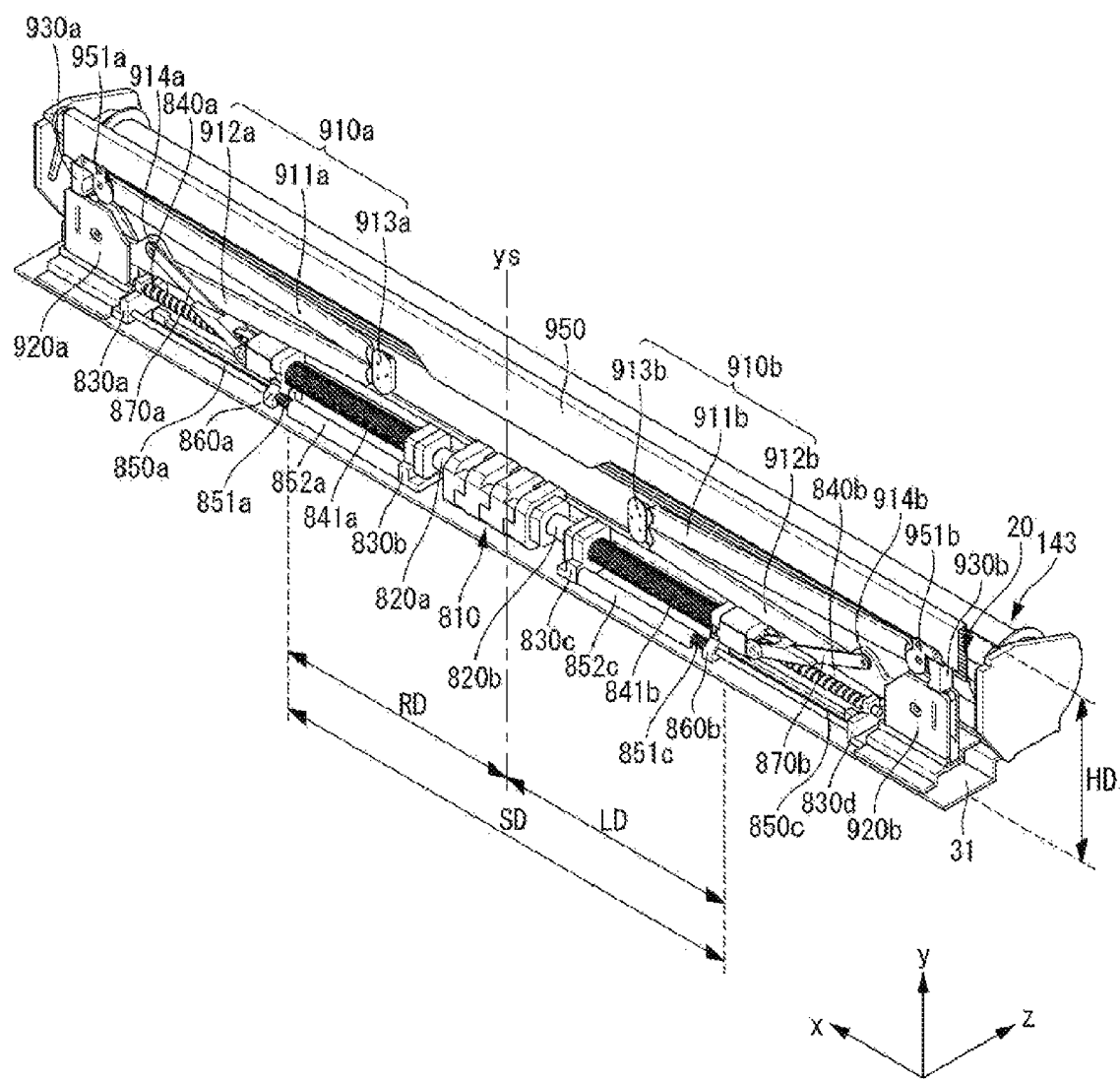
Figure 63:
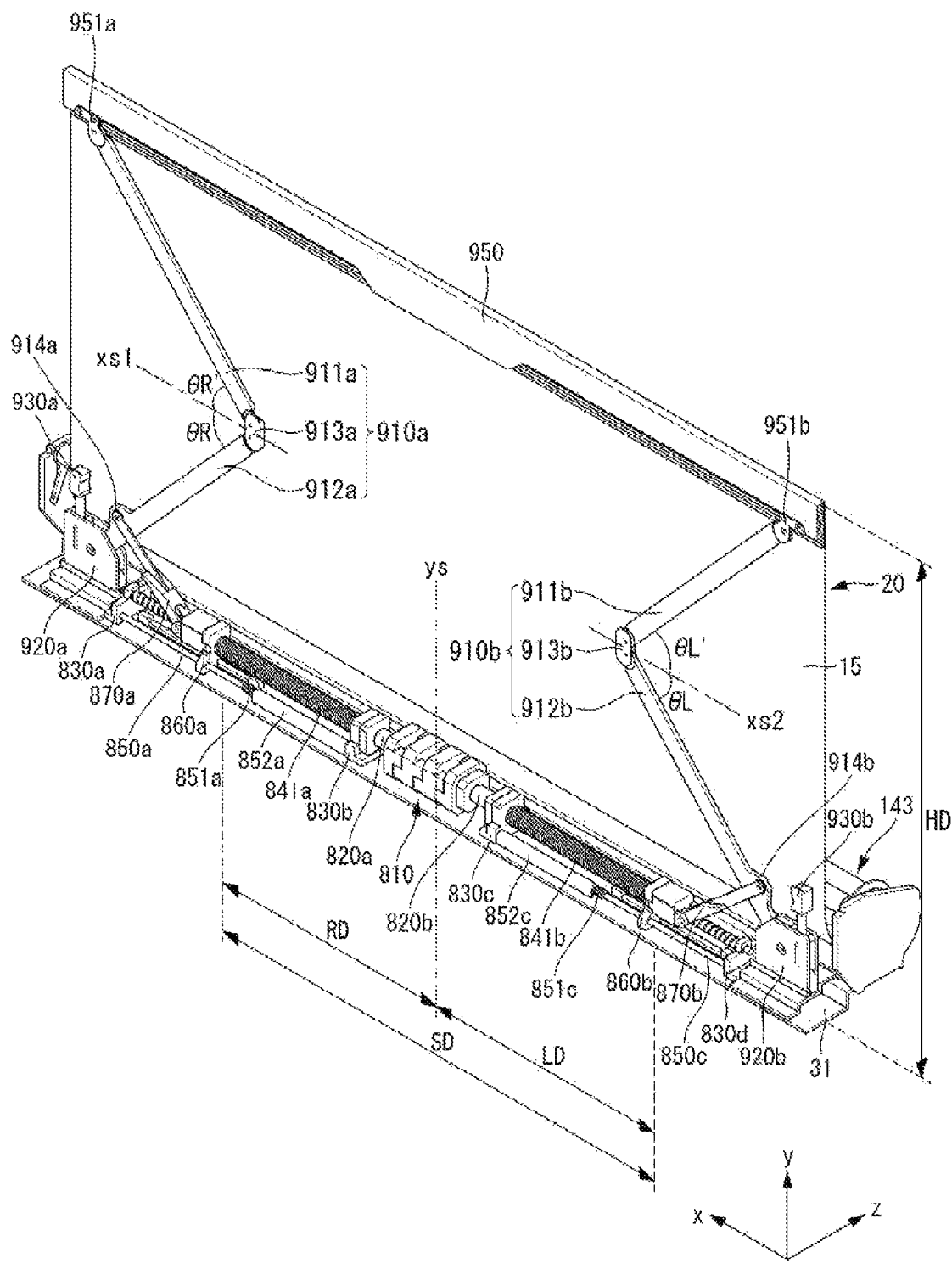
Figure 64:
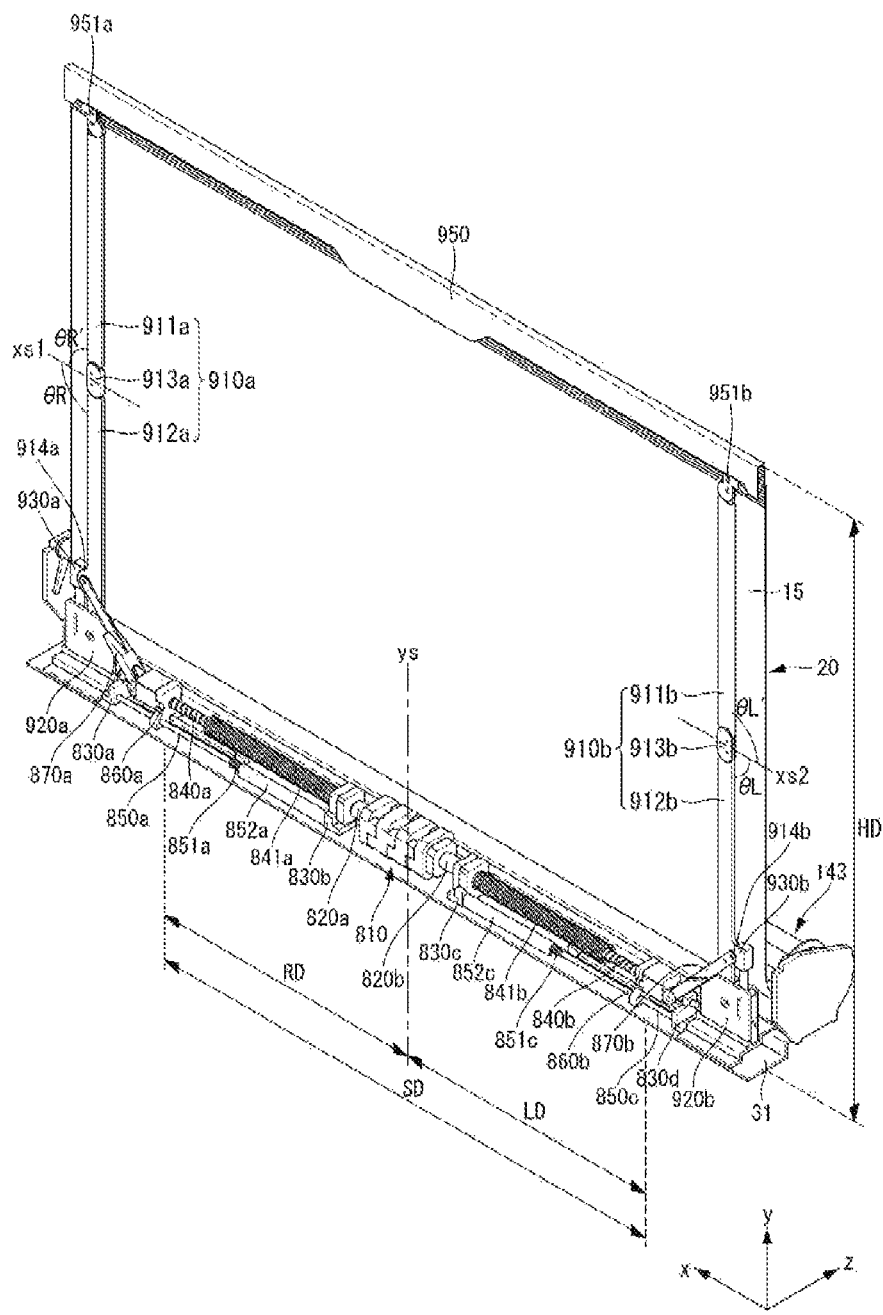

Referring to FIGS. 62 to 64, the panel roller 143 can be installed on the base 31. The panel roller 143 may be installed in front of the lead screws 840a and 840b. Further, the panel roller 143 may be disposed in parallel to the longitudinal direction of the lead screws 840a and 840b. The panel roller 143 may be separated from the lead screws 840a and 840b.

The display 20 may include the display panel 10 and the module cover 15. The lower side of the display 20 can be connected to the panel roller 143 and the upper side of the display 20 can be connected to the upper bar 75. The display 20 can be wound around or unwound from the panel roller 143.

The distance from the axis of symmetry ys of the motor assembly 810 to the right slider 860a may be referred to as RD. The distance from the axis of symmetry ys of the motor assembly 810 to the left slider 860b may be referred to as LD. The distance between the right slider 860a and the left slider 860b may be referred to as SD. The distance SD may be the sum of the distance RD and the distance LD. The distance from the base 31 to the upper end of the display 20 may be referred to as HD.

Referring to FIG. 62, when the second arms 912a and 912b lie with respect to the base 31, the distance SD between the right slider 860a and the left slider 860b can have a minimum value. The distance RD from the axis of symmetry ys of the motor assembly 810 to the right slider 860a can be the same as the distance LD from the axis of symmetry ys of the motor assembly 810 to the left slider 860b.

When the second arms 912a and 912b lie with respect to the base 31, the distance HD from the base 31 to the upper end of the display 20 can have a minimum value.

When the second arms 912a and 912b lie with respect to the base 31, the first springs 841a and 841b can contact the sliders 860a and 860b. Further, the second springs 851a and 851b can contact the sliders 860a and 860b. The pushers 930a and 930b can contact the link brackets 951a and 951b.

When the second arms 912a and 912b lie with respect to the base 31, compression amounts of the first springs 841a and 841b can have a maximum value and a restoring force provided by the first springs 841a and 841b to the sliders 860a and 860b can have a maximum value.

When the second arms 912a and 912b lie with respect to the base 31, compression amounts of the second springs 851a and 851b can have a maximum value and a restoring force provided by the second springs 851a and 851b to the sliders 860a and 860b can have a maximum value.

When the second arms 912a and 912b lie with respect to the base 31, compression amounts of the springs 940a and 940b can have a maximum value and a restoring force provided by the springs 940a and 940b to the pushers 930a and 930b can have a maximum value 940

When the second arms 912a and 912 start to stand with respect to the base 31, the second arms 912a and 912b can stand by receiving restoring force from the first springs 841a and 841b, the second springs 851a and 851b and the springs 940a and 940b. Accordingly, the load applied to the motor assembly 810 can be reduced.

Referring to FIG. 63, as standing of the second arms 912a and 912b with respect to the base 31 progresses, the distance SD between the right slider 860a and the left slider 860b can gradually increase. Even when the distance SD increases, the distance LD can be the same as the distance RD. That is, the right slider 860a and the left slider 860b can be symmetrically positioned on the basis of the axis of symmetry ys of the motor assembly 810. Further, a degree to which the second arm 912a of the right link 910a stands with respect to the base 31 can be the same as a degree to which the second arm 912b of the left link 910b stands with respect to the base 31.

As standing of the second arms 912a and 912b with respect to the base 31 progresses, the distance HD from the base 31 to the upper end of the display 20 can gradually increase. The display 20 can be unwound from the panel roller 143. Otherwise, the display 20 can be unfolded from the panel roller 143.

When the second arms 912 and 912b sufficiently stand with respect to the base 31, the first springs 841a and 841b can be separated from the sliders 860a and 860b. Further, when the second arms 912 and 912b sufficiently stand with respect to the base 31, the second springs 851a and 851b can be separated from the sliders 860a and 860b. Further, when the second arms 912 and 912b sufficiently stand with respect to the base 31, the pushers 930a and 930b can be separated from the link brackets 951a and 951b. Separation of the first springs 841a and 841b from the sliders 860a and 860b, separation of the second springs 851a and 851b from the sliders 860a and 860b, and separation of the pushers 930a and 930b from the link brackets 951a and 951b can be independently performed. That is, the order of separation of the first springs 841a and 841b from the sliders 860a and 860b, separation of the second springs 851a and 851b from the sliders 860a and 860b, and separation of the pushers 930a and 930b from the link brackets 951a and 951b may be variable.

The angle between an axis xs1 parallel to the base 31 and the second arm 912a may be referred to as $\theta R$. In addition, the angle between the axis xs1 parallel to the base 31 and the first arm 911a may be referred to as $\theta R'$. The axis xs1 can be parallel to the x axis. $\theta R$ and $\theta R'$ can be maintained as the same angle.

When the second arm 912a lies with respect to the base 31, the second arm 912a stands with respect to the base 31, or standing of the second arm 912a with respect to the base 31 is completed, $\theta R$ and $\theta R'$ can be maintained as equal to each other.

The angle between an axis xs2 parallel to the base 31 and the second arm 912b may be referred to as L. In addition, the angle between the axis xs2 parallel to the base 31 and the first arm 911b may be referred to as EL'. The axis xs2 can be parallel to the x axis.

When the second arm 912b lies with respect to the base 31, the second arm 912b stands with respect to the base 31, or standing of the second arm 912b with respect to the base 31 is completed, $\theta L$ and $\theta L'$ can be maintained as equal to each other.

The axis xs1 and the axis xs2 can be the same axis.

Referring to FIG. 64, when the second arms 912a and 912b stand with respect to the base 31, the distance SD between the right slider 860a and the left slider 860b can have a maximum value. Even when the distance SD is maximized, the distance LD can be the same as the distance RD.

When the second arms 912a and 912b stand with respect to the base 31, the distance HD from the base 31 to the upper end of the display 20 can have a maximum value.

Figure 65:
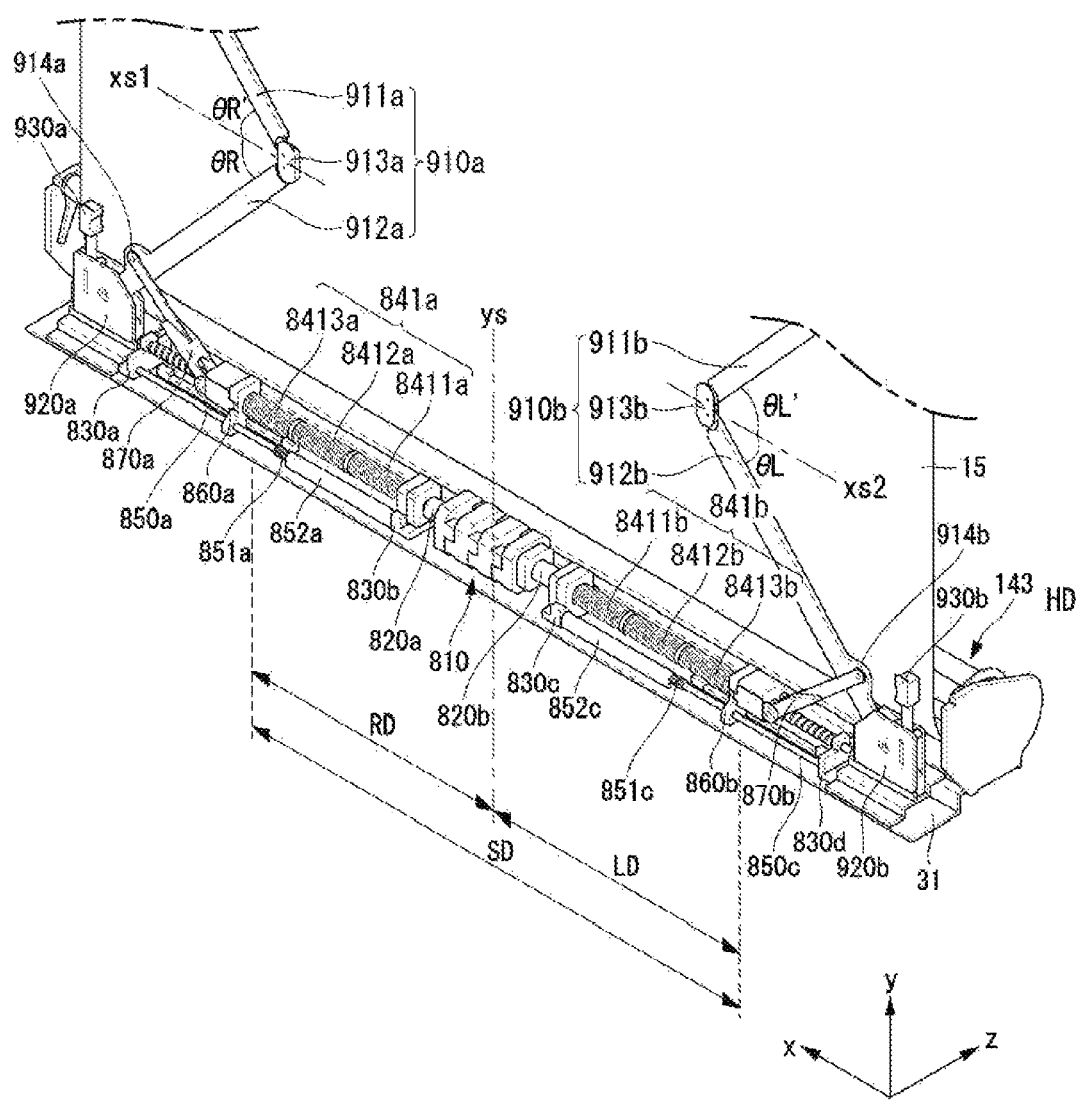
FIGS. 65 to 76 are diagrams showing a display device according to another embodiment of the present disclosure.

During operation of the display device described with reference to FIGS. 62 to 64, noise due to torsion (buckling) when the first springs 841a and 841b are compressed may be generated. Referring to FIG. 65, the first springs 841a and 841b may include a plurality of first springs 841a and 841b. The plurality of first springs 841a and 841b may include first part springs 8411a and 8411b, second part springs 8412a and 8412b and third part springs 8413a and 8413b. The first part springs 8411a and 8411b, the second part springs 8412a and 8412b and the third part springs 8413a and 8413b may have the lead screws 840a and 840b inserted thereinto and may be arranged in series.

Accordingly, torsion (buckling) during compression of the first springs 841a and 841b can be prevented.

Figure 66:
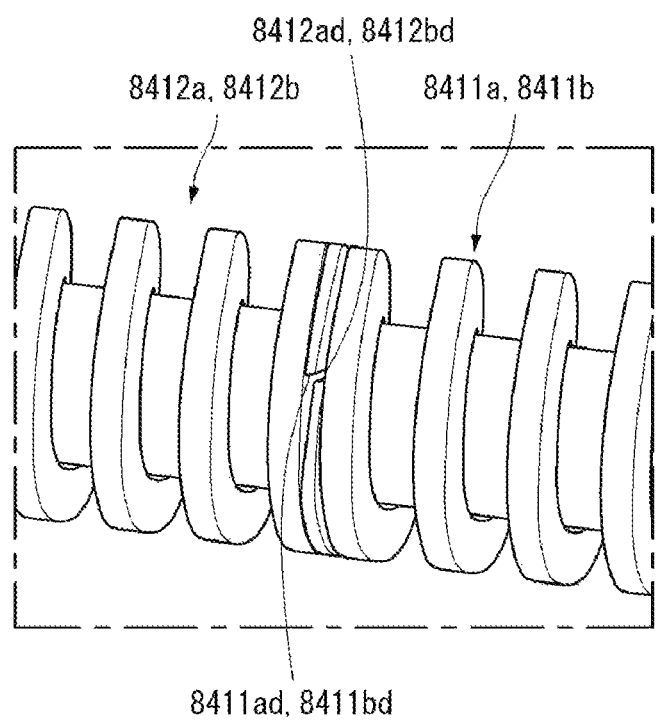
Figure 67:
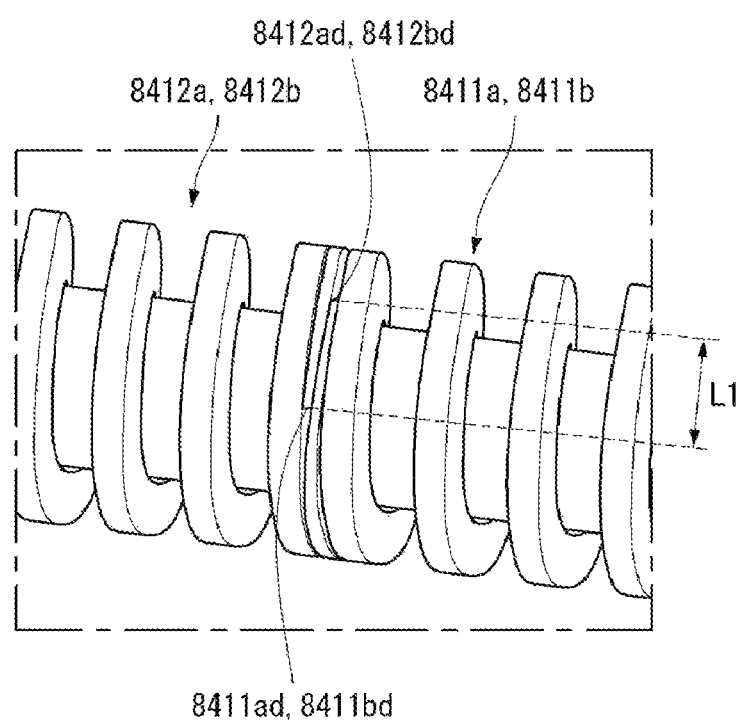

Referring to FIGS. 66 and 67, the first part springs 8411a and 8411b may include first ends 8411ad and 8411bd and the second part springs 8412a and 8412b may include second ends 8412ad and 8412bd. The first ends 8411ad and 8411bd may face or contact the second ends 8412ad and 8412bd. The first ends 8411ad and 8411bd can be inserted between the second part springs 8412a and 8412b and the second ends 8412ad and 8412bd. On the other hand, the second ends 8412ad and 8412bd can be inserted between the first part springs 8411a and 8411b and the first ends 8411ad and 8411bd. When the cross section of the first ends 8411ad and 8411bd and/or the second ends 8412ad and 8412bd is thin, the first ends 8411ad and 8411bd can be inserted deeply (L1) between the second part springs 8412a and 8412b and the second ends 8412ad and 8412bd or the second ends 8412ad and 8412bd can be inserted deeply (L1) between the first part springs 8411a and 8411b and the first ends 8411ad and 8411bd. In this case, the first part springs 8411a and 8411b are combined with the second part springs 8412a and 8412b and thus torsion (buckling) may occur when the springs are compressed.

Figure 68:
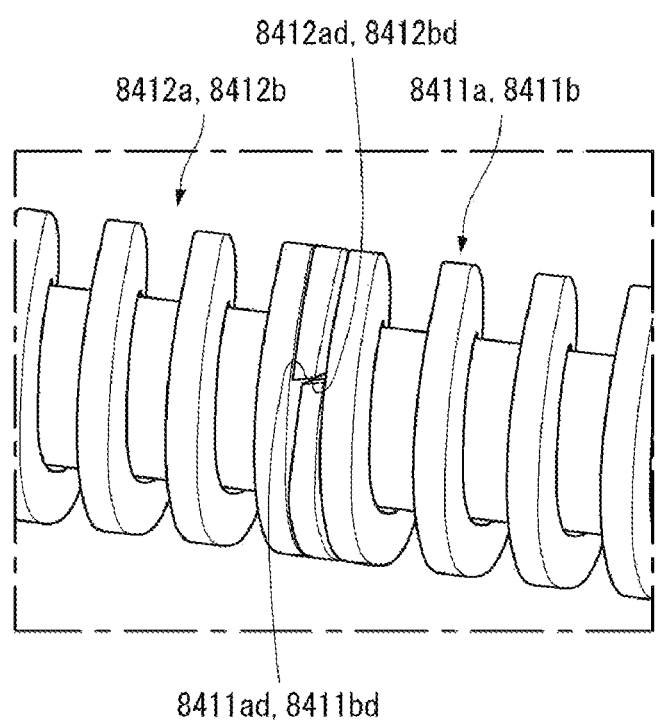
Figure 69:
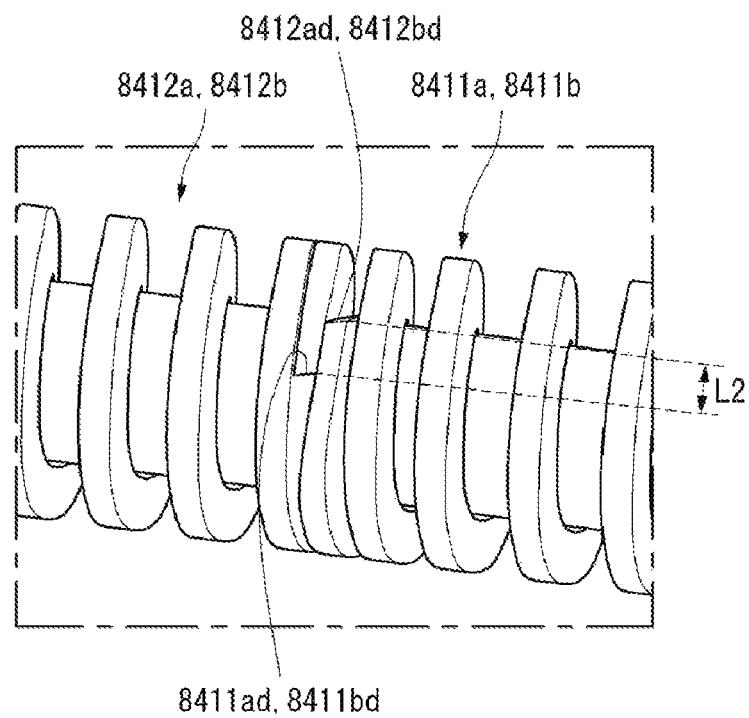

Referring to FIGS. 68 and 69, when the cross section of the first ends 8411ad and 8411bd and/or the second ends 8412ad and 8412bd is thick, the first ends 8411ad and 8411bd can be prevented (L2) from being inserted deeply (L1, refer to FIG. 67) between the second part springs 8412a and 8412b and the second ends 8412ad and 8412bd or the second ends 8412ad and 8412bd can be prevented (L2) from being inserted deeply (L1, refer to FIG. 67) between the first part springs 8411a and 8411b and the first ends 8411ad and 8411bd. In this case, although it is possible to prevent occurrence of torsion (buckling) in case of spring compression when the first part springs 8411a and 8411b are combined with the second part springs 8412a and 8412b, noise due to friction between the ends 8411ad, 8411bd, 8412ad and 8412bd may be generated.

Figure 70:
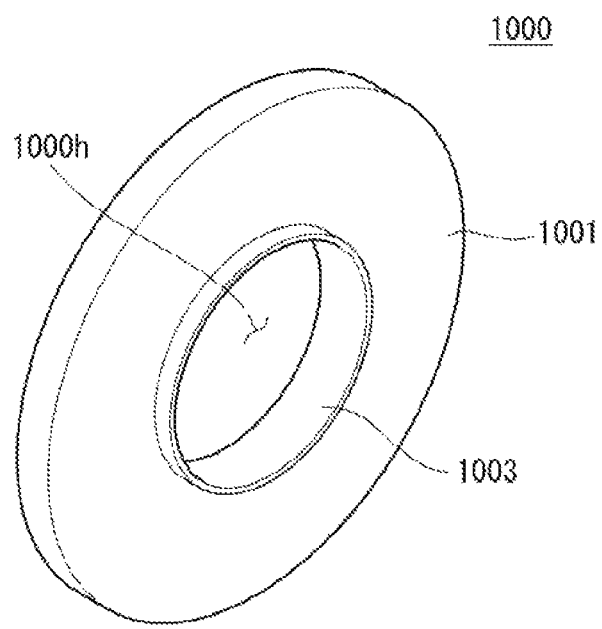
Figure 71:
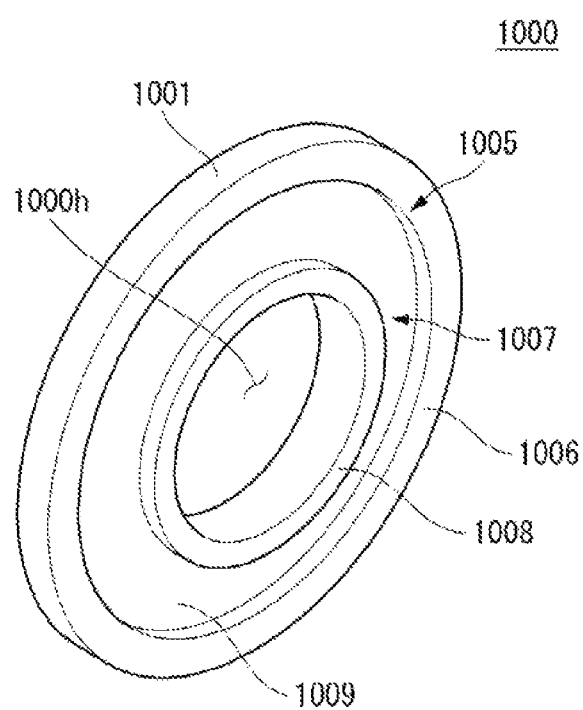
Figure 72:
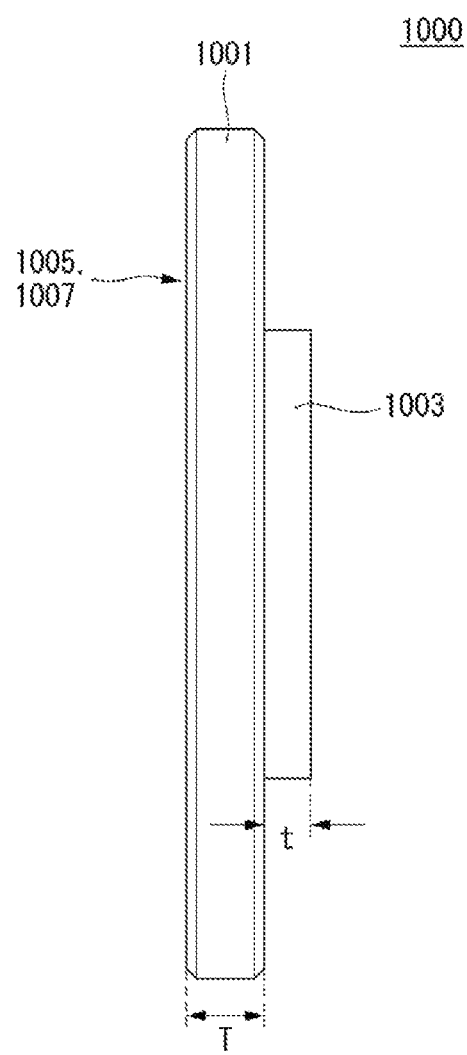

Referring to FIGS. 70 to 72, a spacer 1000 may include a body 1001, a supporting rib 1003 and frictional ribs 1005 and 1007. The body 1001 may be a circular plate in a ring shape which is flat in the diameter direction. The body 1001 may have a hole 1000h formed at the center thereof. The diameter of the hole 1000h may be slightly greater than the outer diameter of the lead screws 840a and 840b. The outer diameter of the body 1001 may be substantially the same as or greater than the outer diameter of the first springs 841a and 841b.

The supporting rib 1003 may have a cylindrical shape. The outer diameter of the supporting rib 1003 may be substantially the same as the inside diameter of the center hole 1000h of the body 1001. The supporting rib 1003 may protrude from one side of the body 1001. The supporting rib 1003 may form a wall for one side of the body 1001. The protrusion length t of the supporting rib 1003 may be about a half the thickness T of the body 1001.

The frictional ribs 1005 and 1007 may include a first frictional rib 1005 and a second frictional rib 1007. The first frictional rib 1005 may be a circular plate in a ring shape. The first frictional rib 1005 may extend or protrude from the body 1001 in a direction to the central axis of the body 1001 in contact with the outer circumference of the body 1001 and may have substantially the same outer diameter as that of the body 1001. The second frictional rib 1007 may extend or protrude from the body 1001 in the direction to the central axis of the body 1001 in contact with the inner circumference of the body 1001 and may have substantially the same inside diameter as that of the body 1001. The first fictional rib 1005 may include a first friction surface 1006, and the first friction surface 1006 may be a smoothly ground surface. The second fictional rib 1007 may include a second friction surface 1008, and the second friction surface 1008 may be a smoothly polished surface. The frictional ribs 1005 and 1007 may face the supporting fib 1003 with respect to the body 1001.

An accommodation part 1009 may be positioned between the first frictional rib 1005 and the second frictional rib 1007. The accommodation part 1009 may be one surface of the body 1001. The accommodation part 1009 can separate the first frictional rib 1005 and the second frictional rib 1007 from each other. The accommodation part 1009 can accommodate a lubricant such as a lubricating oil or grease.

Figure 73:
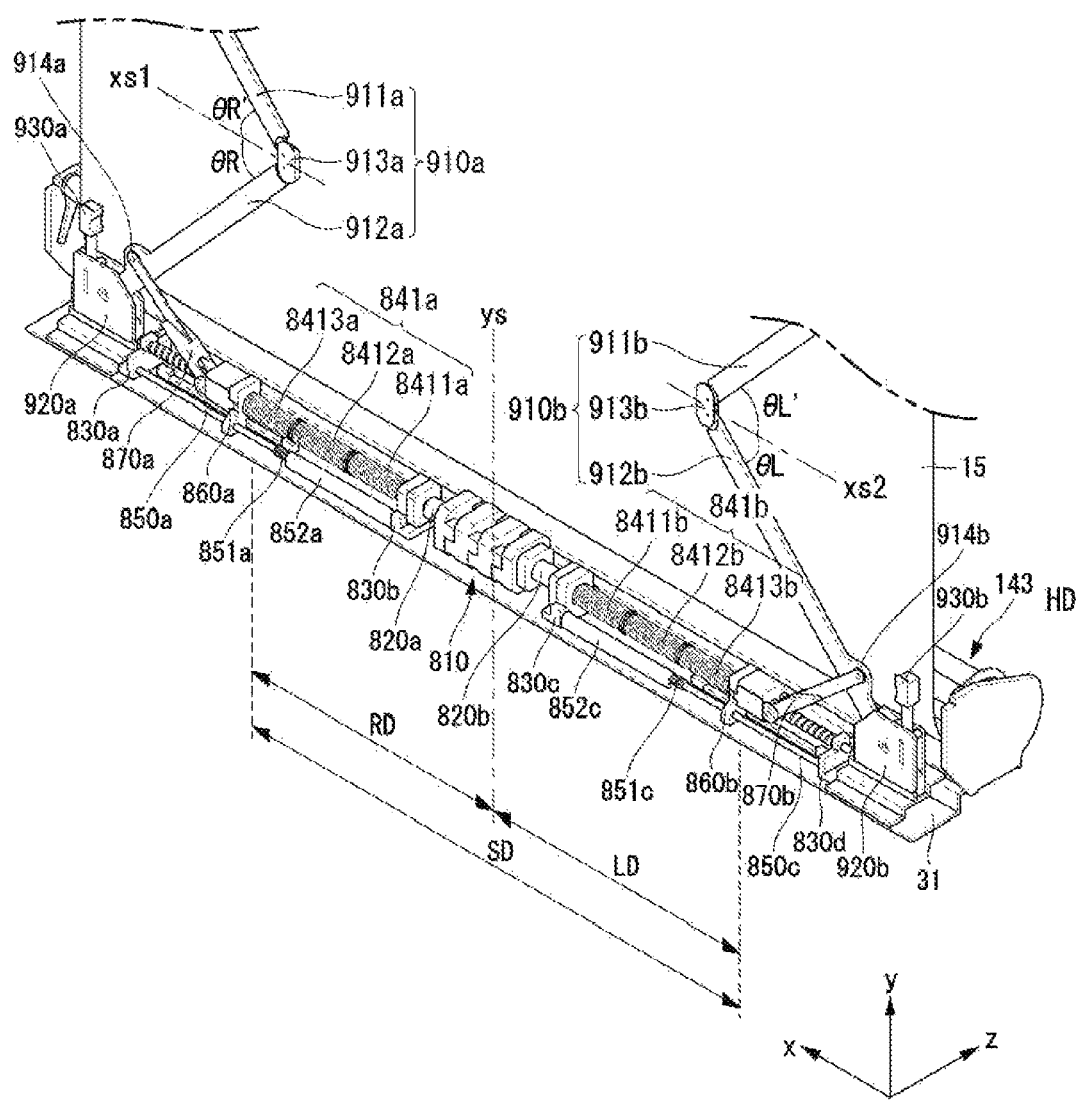
Figure 74:
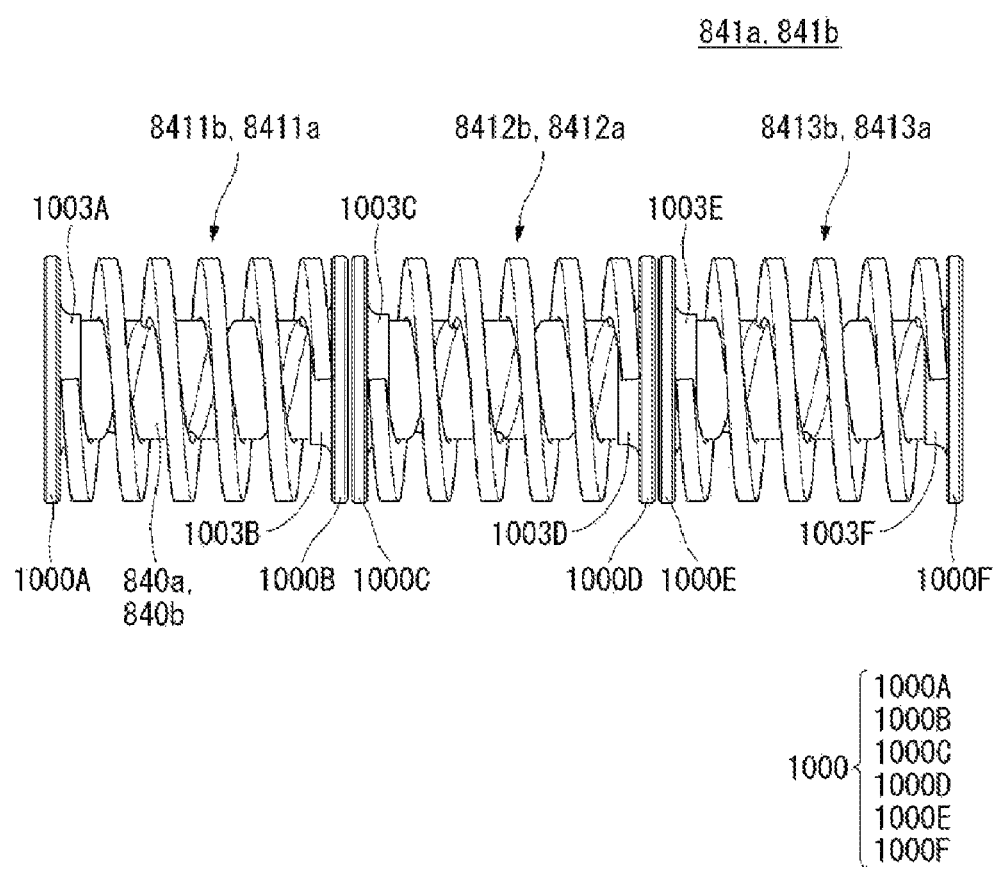

Referring to FIGS. 73 and 74, a plurality of spacers 1000 may be provided. The plurality of spacers 1000 may include a first spacer 1000A, a second spacer 10008, a third spacer 1000C, a fourth spacer 1000D, a fifth spacer 1000E, and a sixth spacer 1000F.

The first spacer 1000A may be disposed at one end of the first part springs 8411a and 8411b or inserted thereinto. Here, the supporting rib 1003A of the first spacer 1000A may be disposed facing the first part springs 8411a and 8411b or inserted thereinto. The second spacer 1000B may be disposed at the other end of the first part springs 8411a and 8411b or inserted thereinto and the third spacer 1000C may be disposed at one end of the second part springs 8412a and 8412b or inserted thereinto. Here, the supporting rib 1003B of the second spacer 1000B may be disposed facing the first part springs 8411a and 8411b or inserted thereinto and the supporting rib 1003C of the third spacer 1000C may be disposed facing the second part springs 8412a and 8412b or inserted thereinto. The third spacer 1000C can face or contact the second spacer 10008.

The fourth spacer 1000D may be disposed at the other end of the second part springs 8412a and 8412b or inserted thereinto and the fifth spacer 1000E may be disposed at one end of the third part springs 8413a and 8413b or inserted thereinto. Here, the supporting rib 1003D of the fourth spacer 1000D may be disposed facing the second part springs 8412a and 8412b or inserted thereinto and the supporting rib 1003E of the fifth spacer 1000E may be disposed facing the third part springs 8413a and 8413b or inserted thereinto. The fourth spacer 1000D can face or contact the fifth spacer 1000E. The sixth spacer 1000F may be disposed at the other end of the third part springs 8413a and 8413b or inserted thereinto. Here, the supporting rib 1003F of the sixth spacer 1000F may be disposed facing the third part springs 8413a and 8413b or inserted thereinto.

Figure 75:
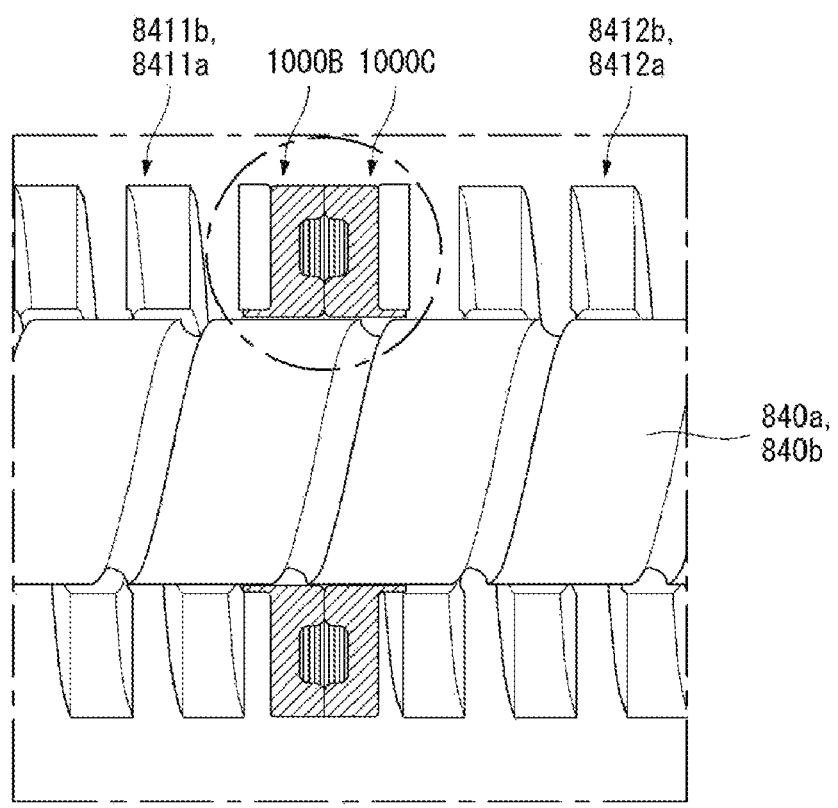
Figure 76:
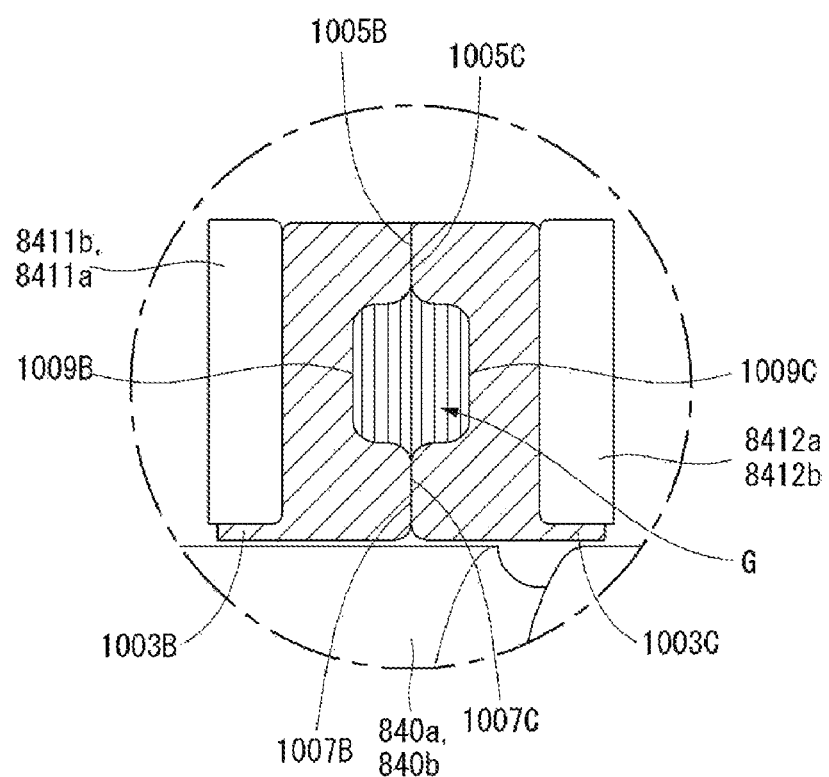

Referring to FIGS. 75 and 76, the second spacers 1000B and/or the third spacer 1000C are described as examples. However, the present disclosure is applicable to other spacers.

The supporting rib 1003B of the second spacer 1000B can support the first part springs 8411a and 8411b. The supporting rib 1003B of the second spacer 1000B can be inserted between the lead screws 840a and 840b and the first part springs 8411a and 8411b. The supporting rib 1003C of the third spacer 1000C can support the second part springs 8412a and 8412b. The supporting rib 1003C of the third spacer 1000C can be inserted between the lead screws 840a and 840b and the second part springs 8412a and 8412b.

The first frictional rib 1005b of the second spacer 1000b can face or contact the first frictional rib 1005C of the third spacer 1000C. The second frictional rib 1007b of the second spacer 1000b can face or contact the second frictional rib 1007C of the third spacer 1000C. The second spacer 1000B can frictional-rotates with respect to the third spacer 1000C. The accommodation parts 1009B and 1009C can accommodate a lubricant such as a lubricant oil or grease. Accordingly, frictional rotation of the second spacer 1000B with respect to the third spacer 1000C can smoothen.

The above-described embodiments of the present disclosure are not exclusive or distinguished from each other. Components or functions of the above-described embodiments of the present disclosure can be used in combination or combined.

Although the above-described figures show the structure of the display device in which the display is rolled up into the housing, the present disclosure is not limited thereto and is applicable to a display device structure in which a display is rolled down from a housing.

The above-described detailed description should not be construed as being limitative, but should be construed as being illustrative from all aspects. The scope of the present disclosure should be determined by reasonable analysis of the attached claims, and all changes within the equivalent range of the present invention are included in the scope of the present invention.

What is claimed is:

1. A display device comprising:
    a housing;
    a roller disposed in the housing;
    a flexible display configured to be rolled around the roller;
    an upper assembly coupled to an upper region of the flexible display;
    a lift assembly comprising a plurality of arms coupled to the upper assembly and configured to extend the flexible display from the housing, at least one arm comprising a portion pivotably connecting to a slider through a rod;
    a motor configured to drive a driving rod to move the slider along the driving rod in a first horizontal direction to lift the lift assembly to extend the flexible display in a vertical direction;
    a plurality of springs positioned along the driving rod, wherein the plurality of springs are aligned end-to-end to provide a pushing force to the slider in the first horizontal direction; and
    one or more spacers positioned between each of the plurality of springs.

2. The display device of claim 1, wherein one or more spacers are further positioned at each end of the plurality of springs.

3. The display device of claim 1, wherein each of the one or more spacers are circular and comprises a center opening accommodating the driving rod therethrough.

4. The display device of claim 3, wherein each of the one or more spacers comprises a supporting rib protruding along the center opening at a first side of the spacer.

5. The display device of claim 4, wherein an end of a corresponding spring of the plurality of springs is configured to abut the first side of the spacer and surround the supporting rib.

6. The display device of claim 4, wherein each of the one or more spacers further comprises a first frictional rib protruding from a second side of the spacer along the center opening and a second frictional rib protruding from the second side of the spacer along an outer edge of the spacer.

7. The display device of claim 6, wherein the first frictional rib comprises a first frictional surface along a top of the first frictional rib and the second frictional rib comprises a second frictional surface along a top of the second frictional rib.

8. The display device of claim 6, wherein a first spacer and a second spacer of the one or more spacers are positioned between two corresponding springs of the plurality of springs, and each second side of the first spacer and the second spacer are positioned to abut each other.

9. The display device of claim 8, wherein corresponding first frictional ribs of the first spacer and corresponding second frictional ribs of the second spacer abut each other.

10. The display device of claim 9, wherein a space is defined between the corresponding first frictional ribs and the corresponding second frictional ribs of the first and second spacers, and wherein a lubricant is disposed inside the defined space.

11. The display device of claim 3, wherein the one or more spacers are positioned along the driving rod such that they are freely rotatable around the driving rod.

12. The display device of claim 1, wherein the driving rod is a threaded lead screw and the slider is correspondingly threaded to the driving rod to be moved in response to rotation of the lead screw by operation of the motor.

13. The display device of claim 12, wherein the one or more spacers are positioned along the driving rod such that they are freely rotatable around the driving rod.

14. A display device comprising:
    a housing;
    a roller disposed in the housing;
    a flexible display configured to be rolled around the roller;
    an upper assembly coupled to an upper region of the flexible display;
    a lift assembly comprising a plurality of arms coupled to the upper assembly and configured to extend the flexible display from the housing;
    a motor configured to provide a force for lifting the lift assembly;
    a lead screw configured to be rotated by the motor;
    a slider engaged with the lead screw and configured to travel along the lead screw in response to rotation of the lead screw, wherein a rod is coupled to the slider and is configured to apply force to one of the plurality of arms in response to movement of the slider along the lead screw in a first direction;
    a plurality of springs positioned along the lead screw, wherein the plurality of springs are aligned end-to-end to provide a pushing force to the slider in the first direction; and
    one or more spacers positioned between each of the plurality of springs.

15. The display device of claim 14, wherein one or more spacers are further positioned at each end of the plurality of springs.

16. The display device of claim 14, wherein each of the one or more spacers are circular and comprises a center opening accommodating the lead screw therethrough.

17. The display device of claim 16, wherein each of the one or more spacers comprises a supporting rib protruding along the center opening at a first side of the spacer.

18. The display device of claim 17, wherein an end of a corresponding spring of the plurality of springs is configured to abut the first side of the spacer and surround the supporting rib.

19. The display device of claim 17, wherein each of the one or more spacers further comprises a first frictional rib protruding from a second side of the spacer along the center opening and a second frictional rib protruding from the second side of the spacer along an outer edge of the spacer.

20. The display device of claim 19, wherein the first frictional rib comprises a first frictional surface along a top of the first frictional rib and the second frictional rib comprises a second frictional surface along a top of the second frictional rib.

21. The display device of claim 19, wherein a first spacer and a second spacer of the one or more spacers are positioned between two corresponding springs of the plurality of springs, and each second side of the first spacer and the second spacer are positioned to abut each other.

22. The display device of claim 21, wherein corresponding first frictional ribs of the first spacer and corresponding second frictional ribs of the second spacer abut each other.

23. The display device of claim 22, wherein a space is defined between the corresponding first frictional ribs and the corresponding second frictional ribs of the first and second spacers, and wherein a lubricant is disposed inside the defined space.

24. The display device of claim 14, wherein the one or more spacers are positioned along the lead screw such that they are freely rotatable around the lead screw.

* * * * *